(12) United States Patent
Pasche et al.

(10) Patent No.: US 9,590,537 B2
(45) Date of Patent: Mar. 7, 2017

(54) METHOD OF CONTROLLING A PUMP AND MOTOR

(71) Applicant: Pentair Flow Technologies, LLC, Delavan, WI (US)

(72) Inventors: Micheal Robert Pasche, Sharon, WI (US); Gary Thomas Baase, II, Kenosha, WI (US); William James Genaw, New Berlin, WI (US)

(73) Assignee: Pentair Flow Technologies, LLC, Delavan, WI (US)

( * ) Notice: Subject to any disclaimer, the term of this patent is extended or adjusted under 35 U.S.C. 154(b) by 25 days.

(21) Appl. No.: 14/216,918

(22) Filed: Mar. 17, 2014

(65) Prior Publication Data

US 2014/0368152 A1 Dec. 18, 2014

Related U.S. Application Data

(60) Provisional application No. 61/798,161, filed on Mar. 15, 2013.

(51) Int. Cl.
| | |
|---|---|
| *H02P 23/00* | (2016.01) |
| *H02P 3/06* | (2006.01) |
| *G01R 31/02* | (2006.01) |
| *G01R 31/34* | (2006.01) |
| *F04B 49/02* | (2006.01) |

(Continued)

(52) U.S. Cl.
CPC ............... *H02P 3/06* (2013.01); *F04B 47/02* (2013.01); *F04B 49/02* (2013.01); *F04B 49/10* (2013.01); *G01R 31/025* (2013.01); *G01R 31/343* (2013.01); *H02P 27/04* (2013.01); *H02P 29/0241* (2016.02); *F04B 2203/0202* (2013.01); *H02P 27/06* (2013.01)

(58) Field of Classification Search
CPC .......... H02P 6/142; H02P 6/12; H02P 29/022; H02P 29/025; H02P 6/24; H02P 8/38
USPC ....... 318/432, 434, 629, 632, 671, 805, 807, 318/810
See application file for complete search history.

(56) References Cited

U.S. PATENT DOCUMENTS

| | | | | |
|---|---|---|---|---|
| 5,443,368 A | * | 8/1995 | Weeks .................. | F04B 37/08 415/118 |
| 5,582,017 A | * | 12/1996 | Noji ..................... | F04B 37/08 417/901 |

(Continued)

FOREIGN PATENT DOCUMENTS

CN          1821574 A      8/2006

OTHER PUBLICATIONS

U.S. Appl. No. 12/869,570 Appeal Decision dated May 24, 2016.

*Primary Examiner* — Bentsu Ro
*Assistant Examiner* — Thai Dinh
(74) *Attorney, Agent, or Firm* — Quarles & Brady LLP

(57) ABSTRACT

Embodiments of the invention provide a variable frequency drive system and a method of detecting a ground in a system having a pump driven by a motor. The drive system and method can provide one or more of the following: a sleep mode, pipe break detection, a line fill mode, an automatic start mode, dry run protection, an electromagnetic interference filter compatible with a ground fault circuit interrupter, two-wire and three-wire and three-phase motor compatibility, a simple start-up process, automatic password protection, a pump out mode, digital input/output terminals, and removable input and output power terminal blocks.

24 Claims, 72 Drawing Sheets

(51) Int. Cl.
  *F04B 47/02*  (2006.01)
  *F04B 49/10*  (2006.01)
  *H02P 27/04*  (2016.01)
  *H02P 27/06*  (2006.01)

(56) References Cited

U.S. PATENT DOCUMENTS

| | | | | |
|---|---|---|---|---|
| 5,622,223 | A * | 4/1997 | Vasquez | E21B 49/10 166/100 |
| 5,945,802 | A * | 8/1999 | Konrad | F04D 15/0066 318/490 |
| 6,318,093 | B2 * | 11/2001 | Gaudet | 417/901 |
| 8,436,559 | B2 * | 5/2013 | Kidd | F04B 17/03 318/34 |
| 8,444,394 | B2 * | 5/2013 | Koehl | F04D 15/0088 318/453 |
| 8,564,233 | B2 * | 10/2013 | Kidd | F04D 15/0066 318/432 |
| 8,878,465 | B2 * | 11/2014 | Kidd | F04B 17/03 318/34 |
| 2008/0181785 | A1 * | 7/2008 | Koehl | F04D 15/0088 417/12 |
| 2008/0181789 | A1 * | 7/2008 | Koehl | F04D 15/0088 417/44.11 |
| 2009/0104044 | A1 * | 4/2009 | Koehl | F04D 15/0088 417/53 |
| 2011/0257843 | A1 * | 10/2011 | Nishimura | B62D 5/0481 701/41 |
| 2014/0030115 | A1 * | 1/2014 | Kidd | F04B 17/03 417/53 |

\* cited by examiner

* TRIPPED MEANS THAT A FAULT HAS OCCURRED THAT SETS THE DRIVE IN "STOPPED" MODE

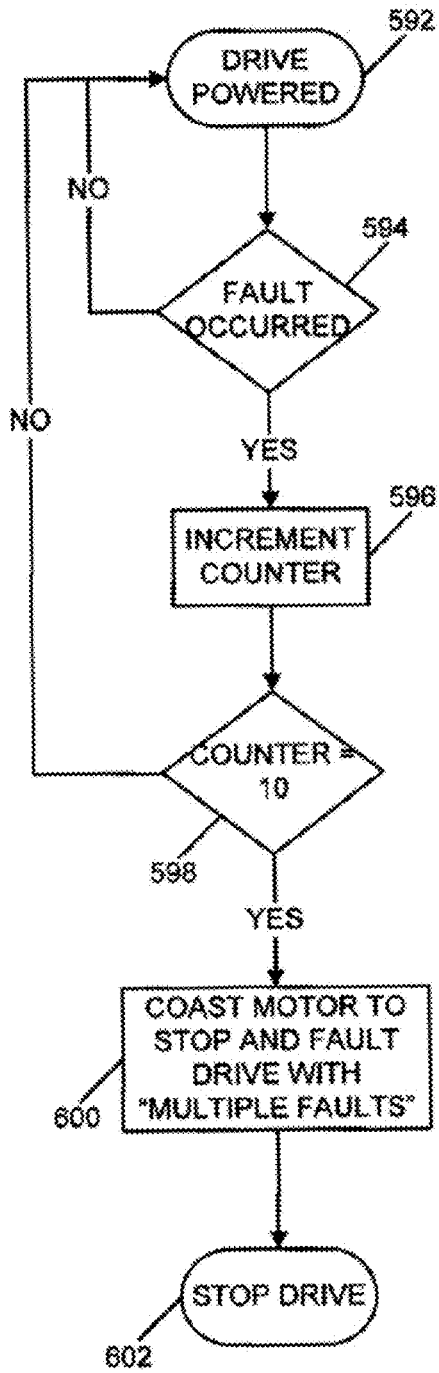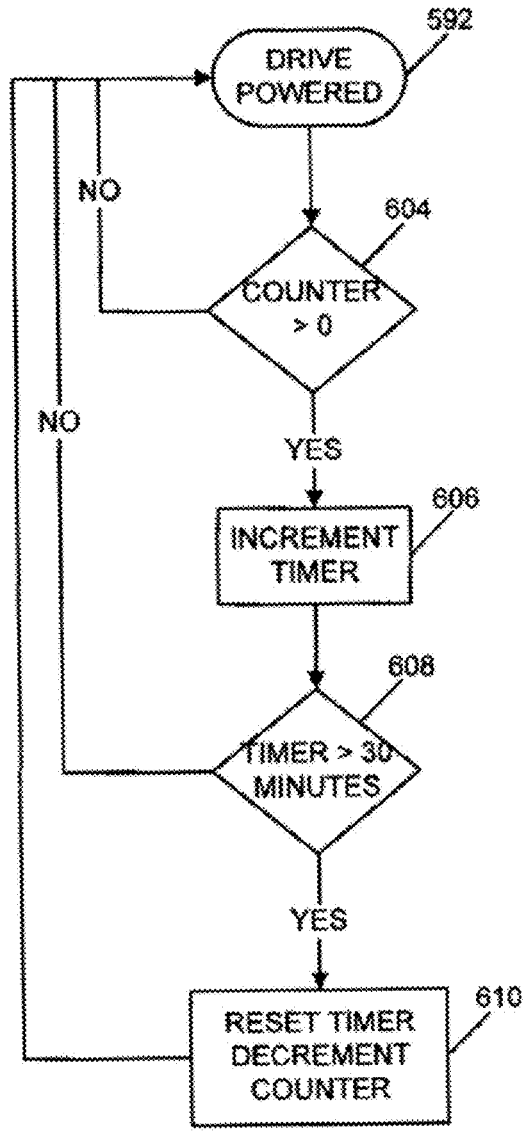
FIGURE 44A
FIGURE 44B

METHOD OF CONTROLLING A PUMP AND MOTOR

RELATED APPLICATIONS

This application claims priority to co-pending U.S. Provisional Application No. 61/798,161 filed on Mar. 15, 2013, the entire contents of which are incorporated herein by reference.

BACKGROUND

Submersible well pumps are connected to above-ground drive systems that control the operation of the pump. Some conventional pump controllers include only start capacitors and relays to turn the pump on and off based on system pressure. These pump controllers have limited capabilities with respect to pump control, safety, and customization. Variable frequency drives (VFDs) have also been used to control submersible well pumps but with limited capabilities regarding user-friendly control and customization. Conventional drives have also generally been designed for use with particular types of motors and often cannot be used to retrofit motors that are already installed in the well, especially two-wire, single-phase motors.

SUMMARY

In some embodiments, the invention provides a method of detecting a ground in a system having a pump coupled to a motor. The motor is driven by a drive located in an enclosure. The method includes testing for a voltage on the enclosure, inside the enclosure, and/or in proximity to the enclosure. The method also includes starting a fault timer if the voltage is present and incrementing the fault timer as long as the voltage is present. The method further includes determining whether the fault timer has exceeded a predetermined time period and stopping the motor when the fault timer has exceeded the predetermined time period.

Embodiments of the invention provide a water distribution system including a pump, a motor coupled to the pump, an enclosure, and a controller including a drive connected to the motor. The controller is housed in the enclosure and tests a voltage on the enclosure, inside the enclosure, and/or in proximity to the enclosure. The controller starts a fault timer if the voltage is present and increments the fault timer as long as the voltage is present. The controller determines whether the fault timer has exceeded a predetermined time period and stops the motor when the fault timer has exceeded the predetermined time period.

DESCRIPTION OF THE DRAWINGS

FIGS. 44A-44B are flow charts illustrating a multiple faults operation.

DETAILED DESCRIPTION

Figure 1:
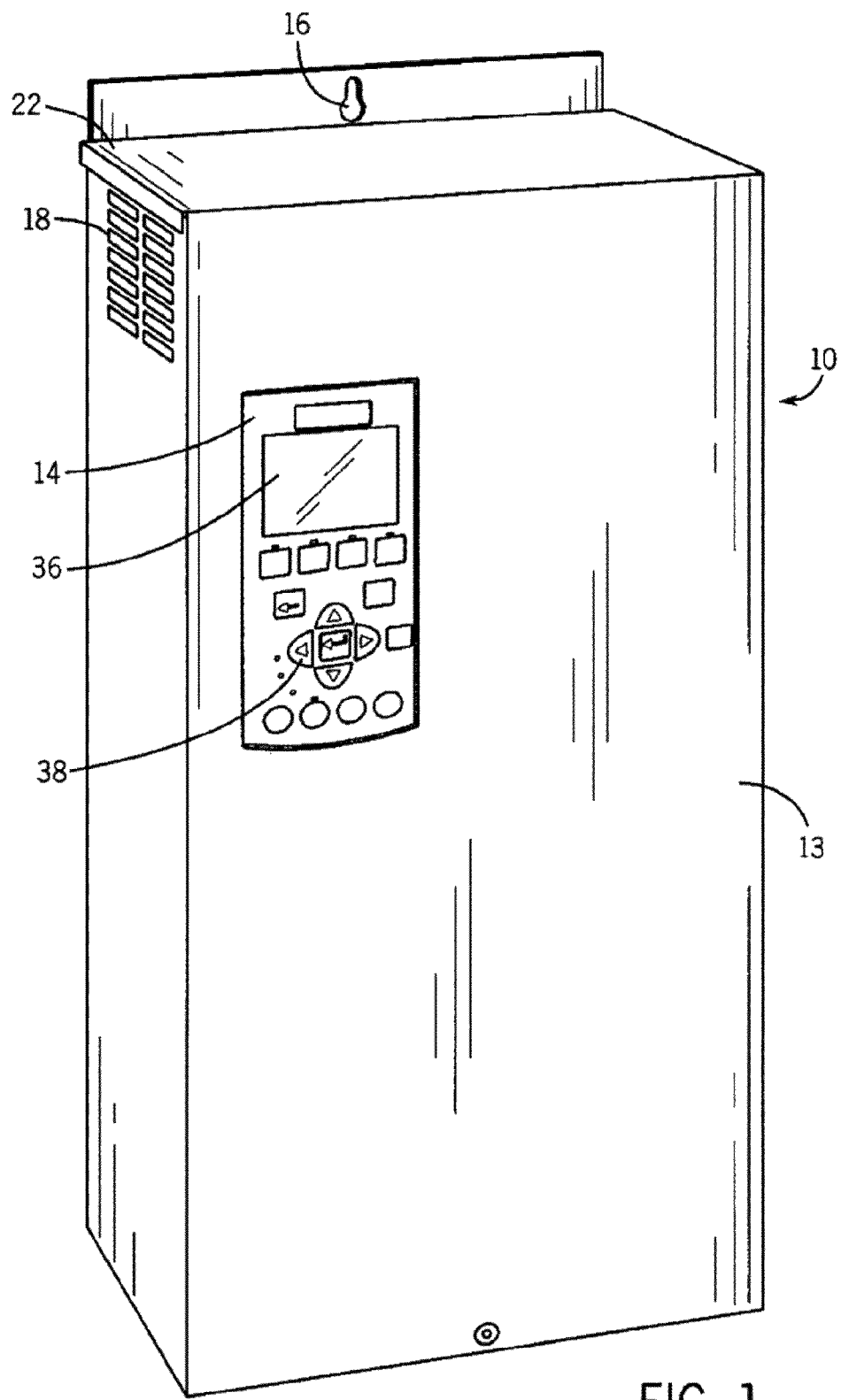
FIG. 1 is a perspective view of a variable frequency drive according to one embodiment of the invention.

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. Unless specified or limited otherwise, the terms "mounted," "connected," "supported," and "coupled" and variations thereof are used broadly and encompass both direct and indirect mountings, connections, supports, and couplings. Further, "connected" and "coupled" are not restricted to physical or mechanical connections or couplings.

The following discussion is presented to enable a person skilled in the art to make and use embodiments of the invention. Various modifications to the illustrated embodiments will be readily apparent to those skilled in the art, and the generic principles herein can be applied to other embodiments and applications without departing from embodiments of the invention. Thus, embodiments of the invention are not intended to be limited to embodiments shown, but are to be accorded the widest scope consistent with the principles and features disclosed herein. The following detailed description is to be read with reference to the figures, in which like elements in different figures have like reference numerals. The figures, which are not necessarily to scale, depict selected embodiments and are not intended to limit the scope of embodiments of the invention. Skilled artisans will recognize the examples provided herein have many useful alternatives and fall within the scope of embodiments of the invention.

Figure 5:
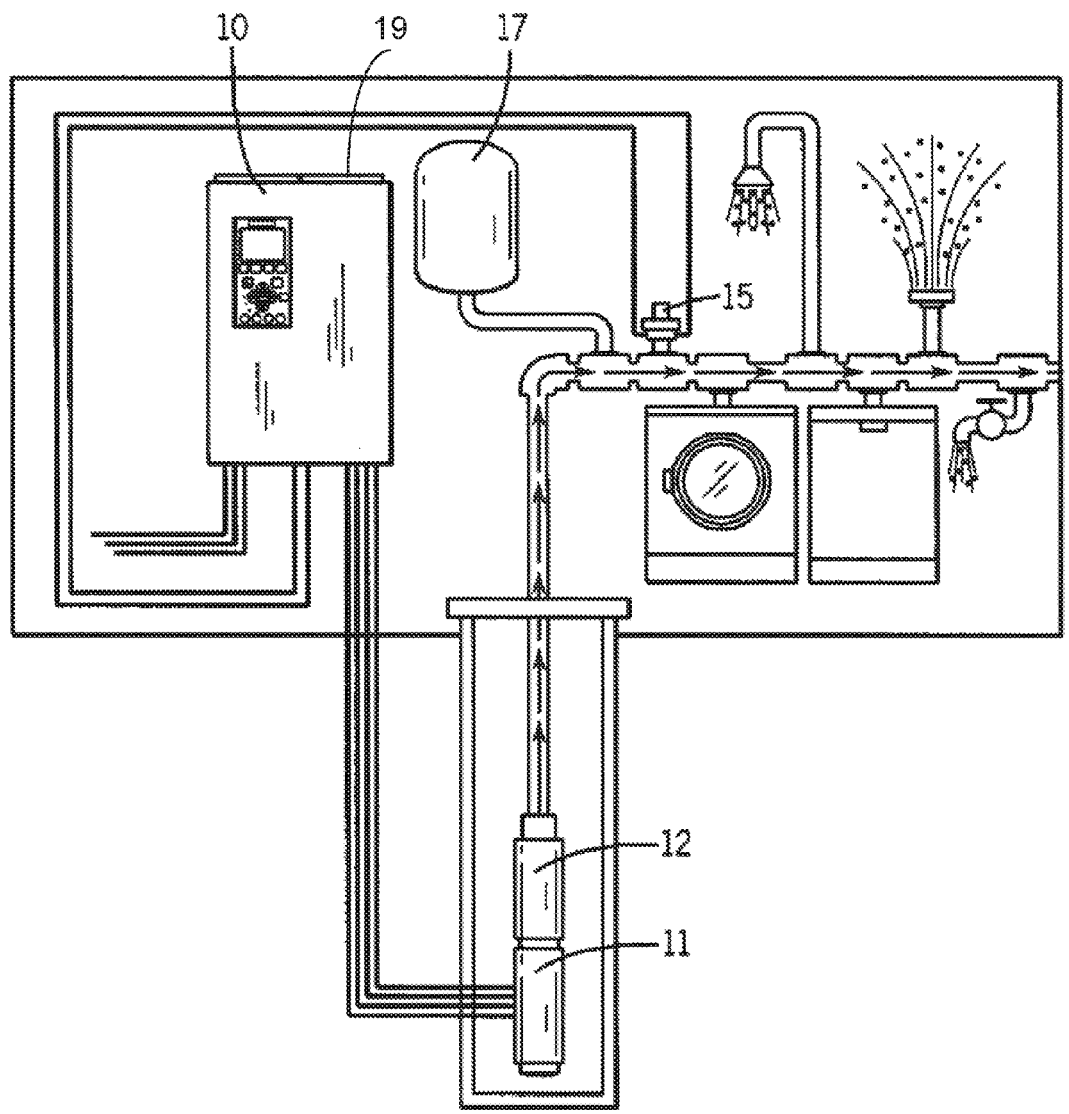
FIG. 5 is a schematic view of the variable frequency drive of FIG. 1 installed in a fluid system.

FIG. 1 illustrates a variable frequency drive (VFD, hereinafter "the drive") 10 according to one embodiment of the invention. In some embodiments, the drive 10 can be used to control the operation of an AC induction motor 11 that drives a water pump 12 (as shown in FIG. 5). The drive 10 includes a chassis 19 as shown in FIG. 5. The drive 10 can be used in a residential, commercial, or industrial pump system to maintain a substantially constant pressure. The motor 11 and pump 12 can be a submersible type or an above-ground type. The drive 10 can monitor certain operating parameters and control the operation of the motor 11 in response to the sensed conditions.

Figure 2:
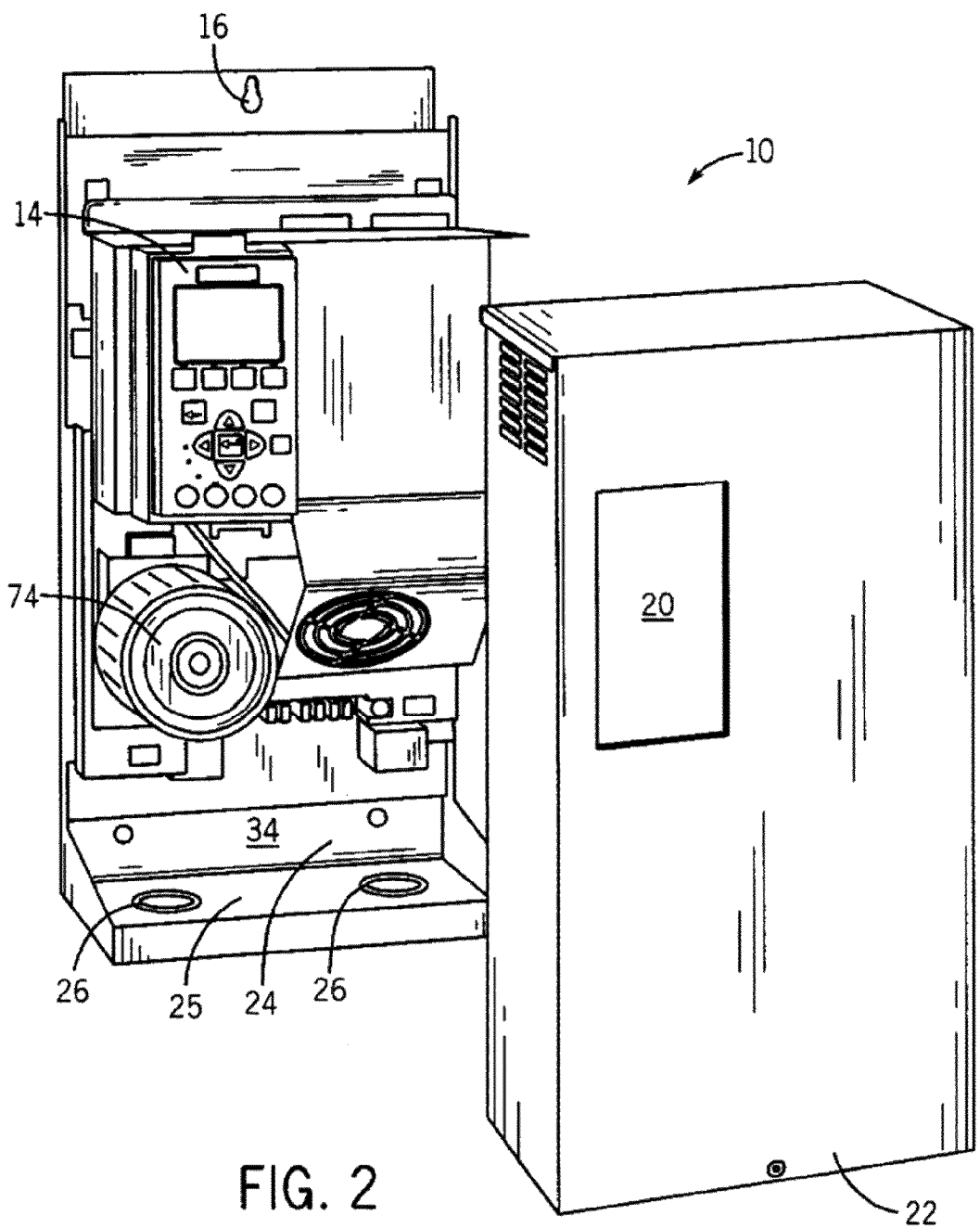
FIG. 2 is a perspective view of the variable frequency drive of FIG. 1 with a cover removed.

As shown in FIGS. 1 and 2, the drive 10 can include an enclosure 13 and a control pad 14. The enclosure 13 can be a NEMA 1 indoor enclosure or a NEMA 3R outdoor enclosure. In one embodiment, the enclosure 13 can have a width of about 9.25 inches, a height of about 17.5 inches, and a depth of about 6.0 inches. The enclosure 13 can include a keyhole mount 16 for fast and easy installation onto a wall, such as a basement wall. The enclosure 13 can include slots 18 through which air that cools the drive 10 can pass out of the enclosure 13. The control pad 14 can be positioned within the enclosure 13 for access through a rectangular aperture 20.

Figure 3:
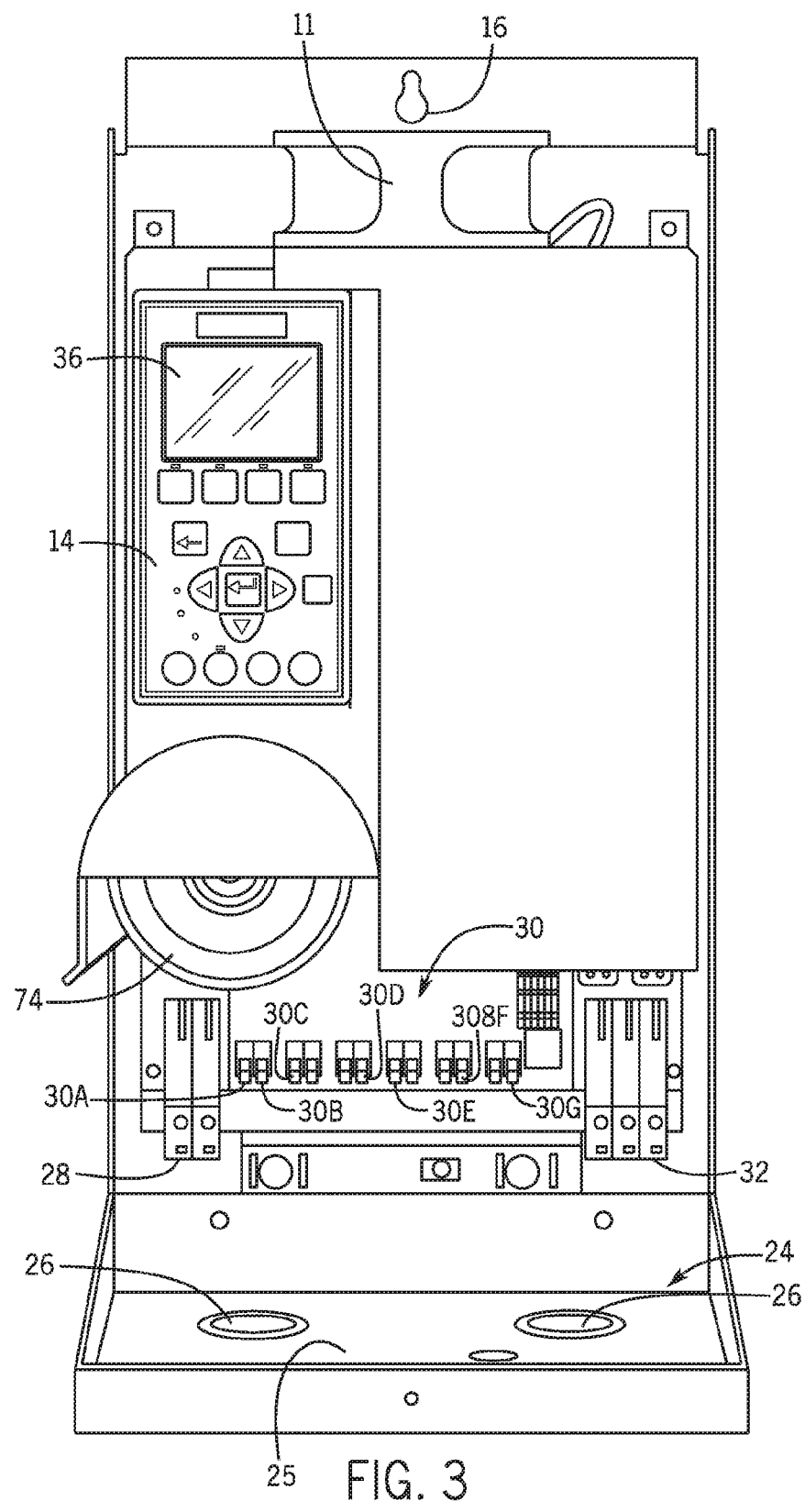
FIG. 3 is an interior view of the variable frequency drive of FIG. 1.

As shown in FIG. 2, the enclosure 13 can include a removable cover 22 with attached side panels. Removing the cover 22 allows access to a wiring area 24, which is located adjacent to a bottom panel 25 of the enclosure 13 with several conduit holes 26. As shown in FIGS. 2 and 3, the wiring area 24 is free of any electrical components or printed circuit board material that may impede any wiring. The wiring area 24 can provide access to an input power terminal block 28, input/output (I/O) spring terminals 30, and an output power terminal block 32. Each one of the conduit holes 26 can be aligned with one of the input power terminal block 28, the I/O spring terminals 30, and the output power terminal block 32. In addition, in some embodiments, the I/O spring terminals 30 can include digital output terminals 30A, digital input terminals 30B, I/O power supply terminals 30C, analog input terminals 30D, analog output terminals 30E, relay output terminals 30F and an RS-485 terminal 30G. Some of the terminals can be programmable.

The wiring area 24 can include a wiring space 34 between the bottom panel 25 and the input power terminal block 28, the I/O spring terminals 30, and the output power terminal block 32. The wiring space 34 can be between about three inches and about six inches in height in order to allow enough room for an installer to access the input power terminal block 28, the I/O spring terminals 30, and the output power terminal block 32.

The input power terminal block 28, I/O spring terminals 30, and the output power terminal block 32 can be used to control the motor 11 and to provide output information in any number of configurations and applications. Various types of inputs can be provided to the drive 10 to be processed and used to control the motor 11. The analog input terminals 30D can receive analog inputs and the digital input terminals 30B can receive digital inputs. For example, any suitable type of run/enable switch can be provided as an input to the drive 10 (e.g., via the digital input terminals 30B). The run/enable switch can be part of a lawn irrigation system, a spa pump controller, a pool pump controller, a float switch, or a clock/timer. In some embodiments, the digital input terminals 30B can accept a variety of input voltages, such as voltages ranging from about 12 volts to about 240 volts, direct current (DC) or alternating current (AC).

Figure 6:
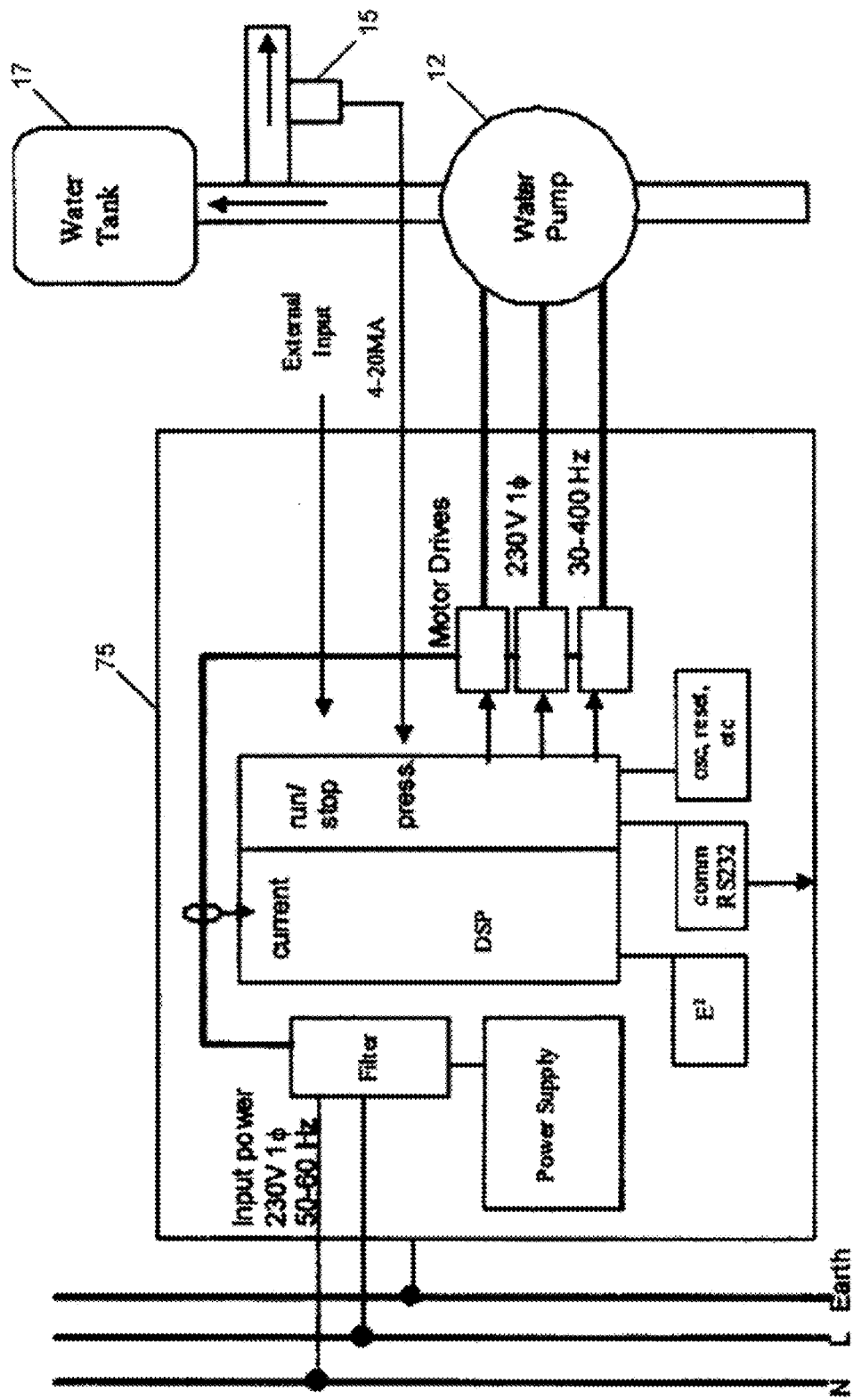
FIG. 6 is a schematic illustration of the variable frequency drive of FIG. 1.

The digital output terminals 30A can connect to digital outputs, such as relay outputs. Any suitable type of indicator device, status output, or fault alarm output can serve as a digital, or relay, output (e.g., be connected to the digital output terminals 30A). A status output can be used to control a second pump, for example, to run the second pump when the pump 12 is running. A fault alarm output can, for example, place a call using a pre-defined phone number, signal a residential alarm system, and/or shut down the pump 12 when a fault is determined. For example, when there is a pipe break fault (as described below with reference to FIG. 33), the digital output terminals 30A can energize a relay output, causing the pre-defined phone number to be automatically dialed. The input power terminal block 28, the I/O spring terminals 30, and the output power terminal block 32 can all be coupled to a drive circuit board (not shown), for connection to a controller 75 (as shown in FIG. 6) of the drive 10. Further, the input power terminal block 28 and/or the output power terminal block 32 can be removable and replaceable without replacing the drive circuit board or the entire drive 10.

Figure 4:
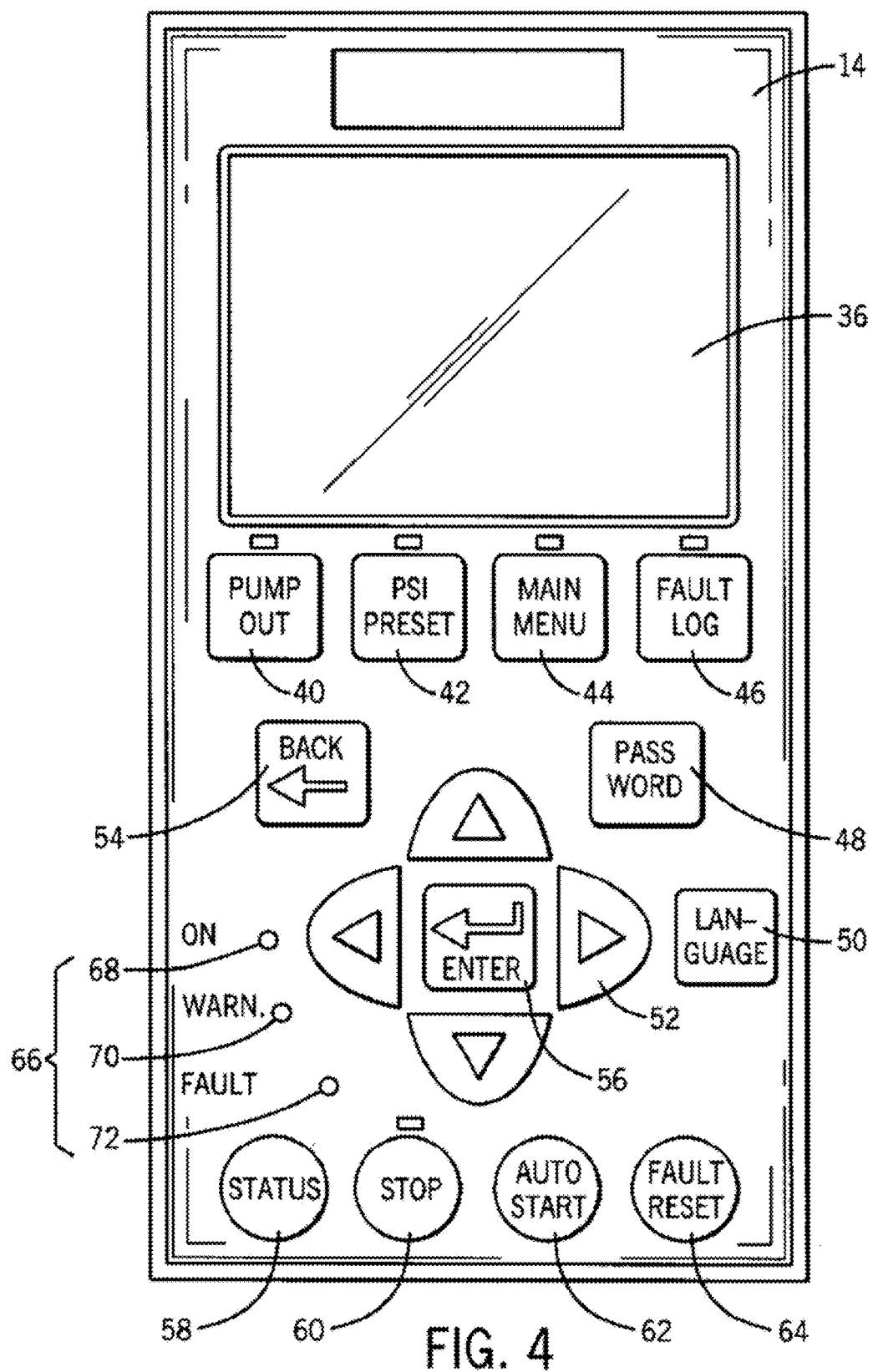
FIG. 4 is a front view of a control pad of the variable frequency drive of FIG. 1.

As shown in FIGS. 1-4, a control pad 14 of the drive 10 can include a backlit liquid crystal display 36 and several control buttons 38. As shown in FIG. 4, the control buttons 38 can include a pump-out button 40, a pressure preset button 42, a main menu button 44, and a fault log button 46. The control buttons 38 can also include a keypad lockout button 48 and a language button 50. The control pad 14 can include several directional buttons 52, a back button 54, and an enter button 56. The control pad 14 can further include a status button 58, a stop button 60, an automatic start button 62, and a fault reset button 64. Finally, the control pad 14 can include light emitting diode (LED) indicators 66, to indicate a status of the drive 10, such as an ON LED 68, a Warning LED 70, and a Fault LED 72.

As shown in FIGS. 2 and 3, the drive 10 can include an electromagnetic interference (EMI) filter 74. The EMI filter 74 can reduce electrical noise generated by the motor 11, especially noise that interferes with AM radio stations. The drive 10 can reduce electrical noise while simultaneously being compatible with a Ground Fault Circuit Interrupter (GFCI). An unintentional electric path between a source of current and a grounded surface is generally referred to as a "ground fault." Ground faults occur when current is leaking somewhere, and in effect, electricity is escaping to the ground.

The drive 10 can be compatible with a number of different types of motors 11, including, but not limited to, AC induction motors that are two-wire permanent split capacitor (PSC) single-phase motors; three-wire single-phase motors; or three-phase motors. The drive 10 can be connected to a previously-installed motor 11 in order to retrofit the controls for the motor 11. If the motor is a single-phase motor, the installer can use the control pad 14 to select either two-wire or three-wire. For a three-wire motor 11, the drive 10 can automatically generate a first waveform and a second waveform with the second waveform having a phase angle of about 90 degrees offset from the first waveform. In addition, the controller 75 (as shown in FIG. 6) can automatically set a minimum and maximum frequency allowance for the motor 11 depending on the selection.

Figure 51:
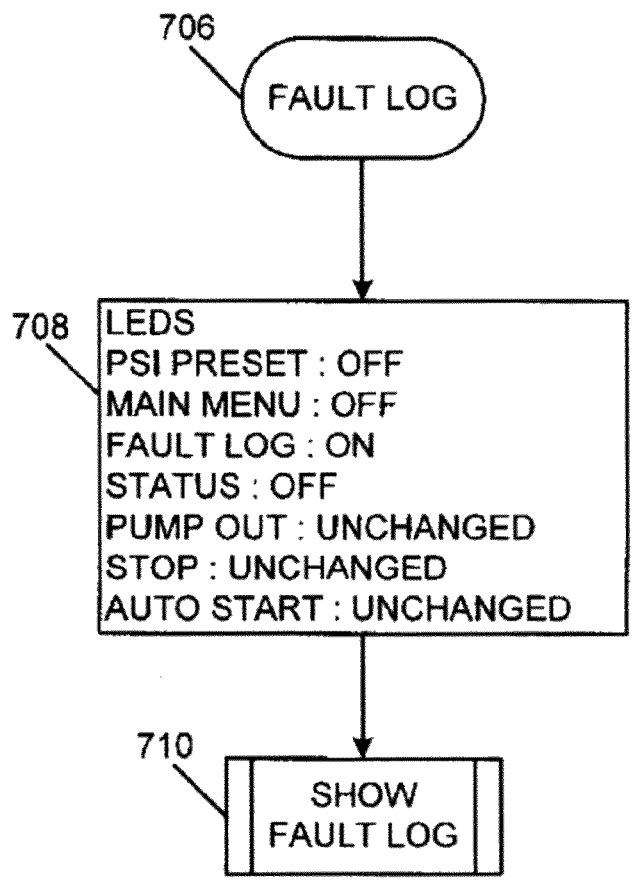
FIG. 51 is a flow chart illustrating a fault log button control operation.

The drive 10 can exhibit certain symptoms if it is improperly grounded. One symptom can be that the drive 10 can display unstable pressure readings while the drive runs the motor at full speed and the actual system pressure continues to rise. Another symptom can be several open transducer faults identified in the fault log (as shown in FIG. 51), when there is no actual open transducer. Yet another symptom can be that the drive 10 does not go to sleep when there is no water usage. Instead, it may go through a boost process, but the pressure reading drops below the setpoint during the last part of the boost process and then it can continue to run the pump or it can remain unstable and never tries to boost. One final symptom is that the drive 10 causes interference with other electronics.

In order to avoid grounding issues, correct wiring practices should be followed. For example, the drive 10 should be grounded at the power source. The motor 11 should be grounded back to the drive 10. Other equipment wires should be kept at least eight inches away from the motor wires and input wires of the drive 10. Motor wires should not be run near low voltage wires. Input and output wires should not be run together in the same conduit or near each other. Ground loops should be avoided, and conduit should be used if necessary. Following correct wiring practices helps to avoid an improperly grounded drive 10.

The drive 10 can be programmed to operate after a simple start-up process by a user using the control pad 14. The start-up process can be a five-step process for a single-phase motor 11 and a four-step process for a three-phase motor 11. The start-up process for a single-phase motor 11 can include (1) entering a service factor current value, (2) selecting either a two-wire motor or a three-wire motor, (3) entering a current time, (4) entering a current date, and (5) engaging the pump-out button 40 or the automatic start button 62. The start-up process for a three-phase motor 11 can include (1) entering a service factor current value, (2) entering a current time, (3) entering a current date, and (4) engaging the pump-out button 40 or the automatic start button 62.

The pump-out button 40 can be used to enter the drive 10 in a pump out mode to clean out sand and dirt from a newly-dug well. The pump-out button 40 can be engaged once the pump 12 is installed in the new well and once the drive 10 is connected to the motor 11. The pump-out mode can provide an open discharge of sand and dirt from the well, for example, onto a lawn. In one embodiment, the drive 10 can operate the pump 12 in the pump out mode at about 45

Hertz (Hz). The pump out mode operation is further described below with respect to FIG. 7, and a pump-out button control operation is further described below with respect to FIG. 48.

The controller 75 can include software executed by a digital signal processor (DSP, as shown in FIG. 6) or a microprocessor and can perform real-time control including soft-start, speed regulation, and motor protection. The drive 10 can be controlled to maintain substantially constant water pressure in a water system that may or may not utilize a tank. To achieve this, the controller 75 can implement a classical Proportional/Integral/Derivative (PID) method using pressure error as an input. Pressure error can be calculated by subtracting an actual water pressure from the desired water pressure (i.e., a pressure set point). An updated speed control command can then be generated by multiplying the pressure error by a proportional gain, multiplying the integral of the pressure error by an integral gain, multiplying the derivative of the pressure error by a derivative gain, and summing the results. Thus, the controller 75 can increase or decrease the speed of the motor 11 to maintain a constant pressure set point. The PID mode is further described below with respect to FIG. 11.

The controller 75 can determine the actual water pressure value from an electronic pressure transducer 15 (e.g., in communication with the controller 75 via the analog input terminals 30D). In some embodiments, as shown in FIG. 5, the pressure transducer 15 can be located near a pressure tank 17 fluidly coupled to the pump 12.

If motor 11 is off (i.e., not being driven), water pressure can still be monitored, but no actions are taken until the pressure falls below a certain value (e.g., a low band pressure value). If the water pressure falls below the low band pressure, the controller 75 can restart the motor 11. In some embodiments, the low band pressure can be set, or defaulted, to 1-10 pounds per square inch (PSI) lower than the pressure set point. Once the motor 11 is restarted, normal operation with PID control (i.e., PID mode) can commence. In one embodiment, one of two conditions can trigger the controller 75 to turn the motor 11 off. A first condition can be if a sleep mode (described with respect to FIG. 12) is triggered. A second condition can be if the pressure exceeds a certain safety value (i.e., about 20 PSI above the pressure set point). Other conditions that can stop the drive 10 are various faults (described further below), the user pressing the stop button 60, and lack of a digital input for an optional run enable mode.

For normal operation, with the motor 11 being driven, the controller 75 can regulate pump speed in a continuous fashion using PID control as long as the pressure remains below the safety pressure value, such as about 20 PSI above the pressure set point. The drive 10 can stop the motor 11 whenever the actual pressure exceeds the safety pressure value. During normal operation, as long as water usage does not exceed the motor/pump capabilities, the pressure can remain constant at approximately the pressure set point. Large instantaneous changes in flow requirements can result in variations from the desired pressure band. For example, if flow is stopped, causing the pressure to quickly increase, the motor 11 can be stopped (i.e., set to 0 Hz). This can be considered an alternate sleep mode operation and is further described below with respect to FIG. 13.

Figure 7:
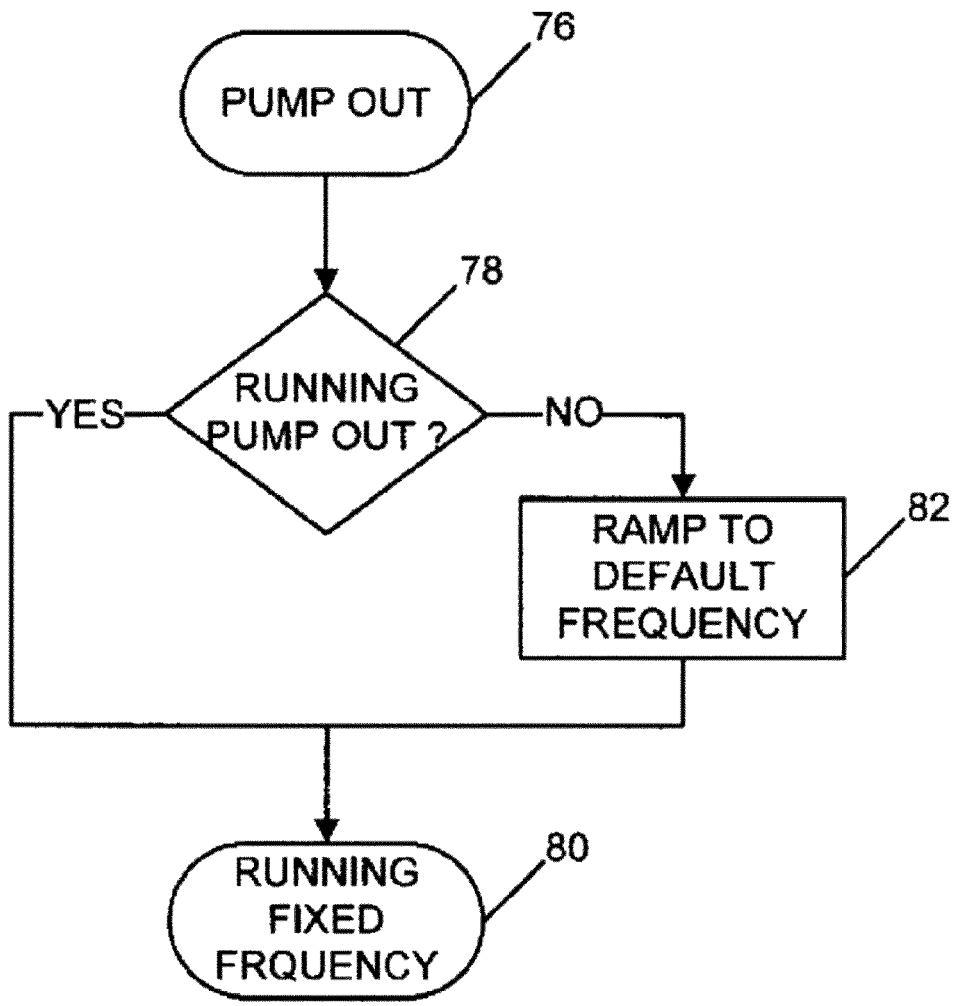
FIG. 7 is a flow chart illustrating a pump out operation.

FIGS. 7-15 are flow charts describing pump control according to some embodiments of the invention. The flow chart of FIG. 7 illustrates when the controller 75 receives a signal to run the pump in the pump out mode 76 (e.g., when the pump-out button 40 is pressed). The controller 75 first determines, at step 78, if the pump is already running in pump out mode. If so, the pump is being run at a correct, fixed frequency for pump out mode (step 80). If not, the controller 75, at step 82, ramps up the input frequency of power to the motor 11 to the correct frequency, then proceeds to step 80.

Figure 8:
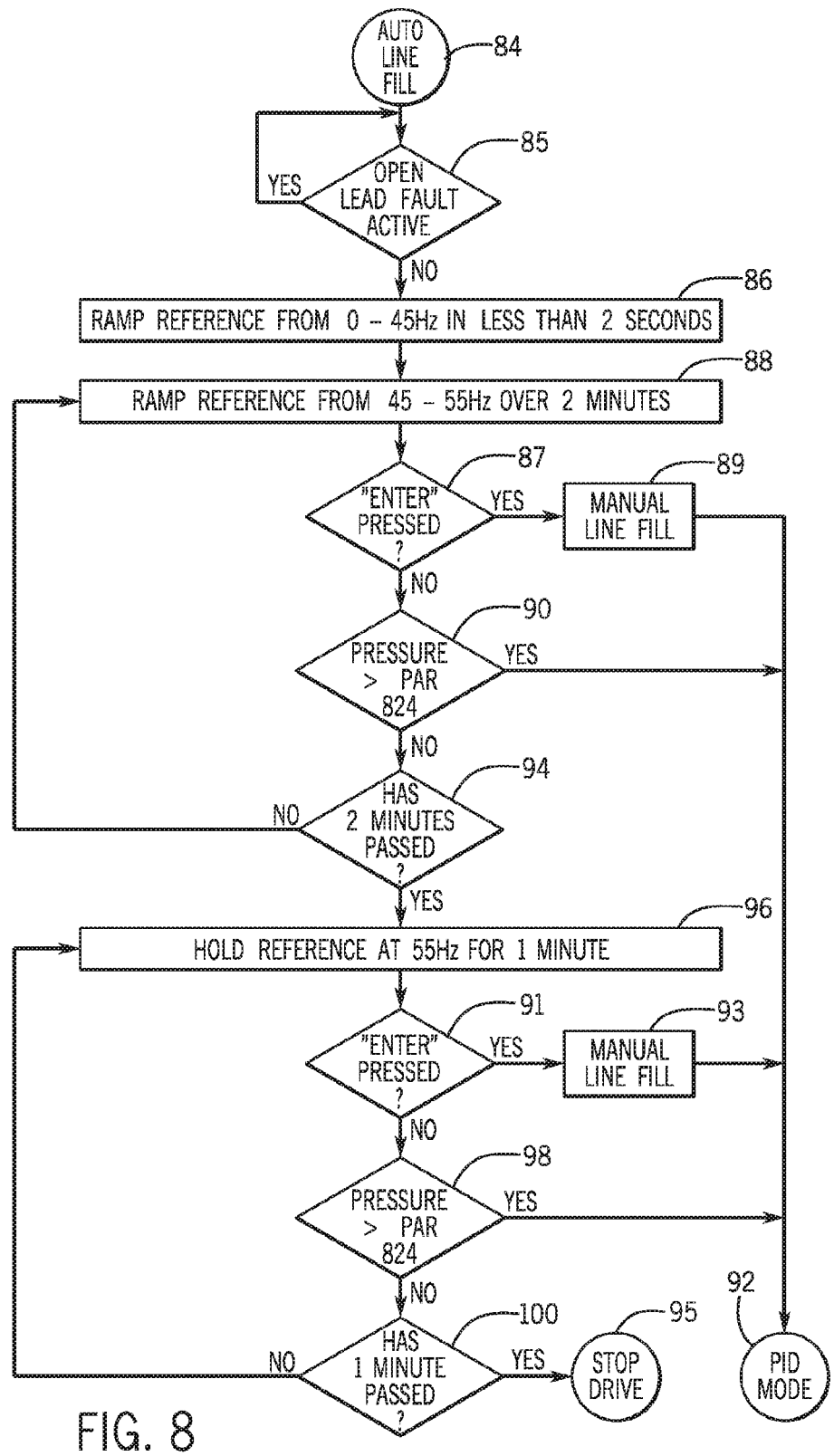
FIG. 8 is a flow chart illustrating an automatic line fill operation.

FIG. 8 illustrates an automatic line fill operation 84, according to some embodiments. This operation can automatically run at drive start-up (e.g., when the drive 10 is powered up, after a power interruption, when the motor 11 is restarted, or when the automatic start button 62 is pressed). Thus, the motor may be off (i.e., at 0 Hz) at the beginning of this operation. The controller 75 can determine if there is an open lead fault active (step 85). If no open lead fault is active, the controller 75 first can ramp up the frequency driving the motor from 0 Hz to about 45 Hz in less than a first time period, such as about two seconds (step 86). In a second time period, such as about two minutes, or about five minutes in some embodiments, the controller 75 can start to ramp up the frequency from, for example, about 45 Hz to about 55 Hz (step 88). During the second time period, the controller 75 determines if the enter button 56 has been pressed (step 87. If the enter button 56 has been pressed, the controller 75 can execute a manual line fill operation (step 89) and the controller 75 enters PID mode (step 92). If the enter button 56 has not been pressed, the controller 75 determines the pressure via input from the pressure transducer 15 (step 90). If the sensed pressure has reached a minimum pressure, or pressure set point (e.g., about 10 PSI), indicating the line has been filled, the fill operation is completed and the controller 75 enters PID mode (step 92). However, if the sensed pressure is less than 10 PSI at step 90, the controller 75 determines if the second time period (e.g., about two minutes or about five minutes) has passed (step 94). If the second period has not passed, the controller 75 reverts back to step 88 and continues to ramp the motor frequency. If the second time period has passed, the controller 75 will hold the frequency at about 55 Hz for about one minute (step 96). The controller 75 determines if the enter button 56 has been pressed (step 91. If the enter button 56 has been pressed, the controller 75 can execute a manual line fill operation (step 93) and the controller 75 enters PID mode (step 92). If the enter button 56 has not been pressed, the controller 75 then determines if the sensed pressure is about 10 PSI (step 98). If the sensed pressure is about 10 PSI, indicating the line has been filled, the fill operation is completed and the controller 75 enters PID mode (step 92). However, if the sensed pressure is still less than 10 PSI at step 90, the controller 75 determines if one minute has passed (step 100). If one minute has not passed, the controller 75 reverts back to step 96. If one minute has passed, a dry run fault is recognized and the drive 10 is stopped (step 95).

In one alternative embodiment, step 88 can include setting the frequency to about 45 Hz for the second time period, and if the sensed pressure is less than 10 PSI after the second time period, repeating step 88 with the frequency set to about 50 Hz for another second time period. If the sensed pressure is still less than 10 PSI after the second time period while at 50 Hz, step 88 can be repeated with the frequency set to about 55 Hz for yet another second time period. If the sensed pressure is still less than 10 PSI after the second time period while at 55 Hz, the controller 75 can continue to step 96.

Figure 9:
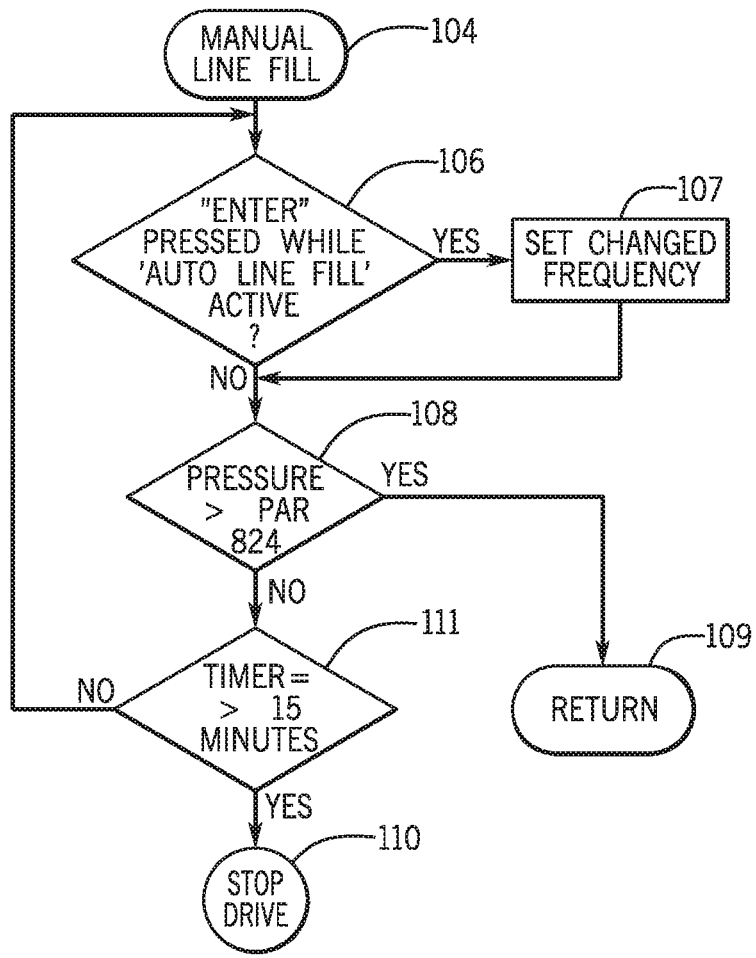
FIG. 9 is a flow chart illustrating a manual line fill operation.

FIG. 9 illustrates a manual line fill operation 104, according to some embodiments. The motor 11 is run at a manually-controlled frequency (e.g., entered by a user). The controller 75 determines if the enter button 56 is pressed while auto line fill is active, at step 106. If not, the motor 11 keeps running at the set frequency until the sensed pressure reaches about 10 PSI (step 108). If the enter button 56 is pressed while auto line fill is active, the frequency can be manually changed, at step 107. Once the sensed pressure has reached about 10 PSI, the controller 75 enters "RETURN" 109, where the system can be in a standby mode. PID mode (step 110). In some embodiments, if the sensed pressure has not reached about 10 PSI within a predetermined time period (e.g., fifteen minutes) at step 111, the controller 75 reverts back to step 106. If the predetermined time period has lapsed, the drive 10 is stopped, at step 110.

The manual fill line operation can be considered always enabled because it can be executed at any time during the auto line fill operation. For example, by using the up and down directional buttons 52 on the control pad 14, the user can interrupt the automatic line fill operation and adjust the frequency output to the motor 11, thus changing the motor speed. Once in manual line fill mode, the user can continue to change the speed as needed at any time. The motor 10 can continue at the new set frequency until the sensed pressure reaches about 10 PSI, and then it will proceed to PID mode, as described above. The manual fill line operation can be beneficial for both vertical or horizontal pipe fill applications. In addition, both the automatic fill line operation and the manual fill line operation can prevent common motor issues seen in conventional systems, such as motor overloading and the occurrence of water hammering.

Figure 10:
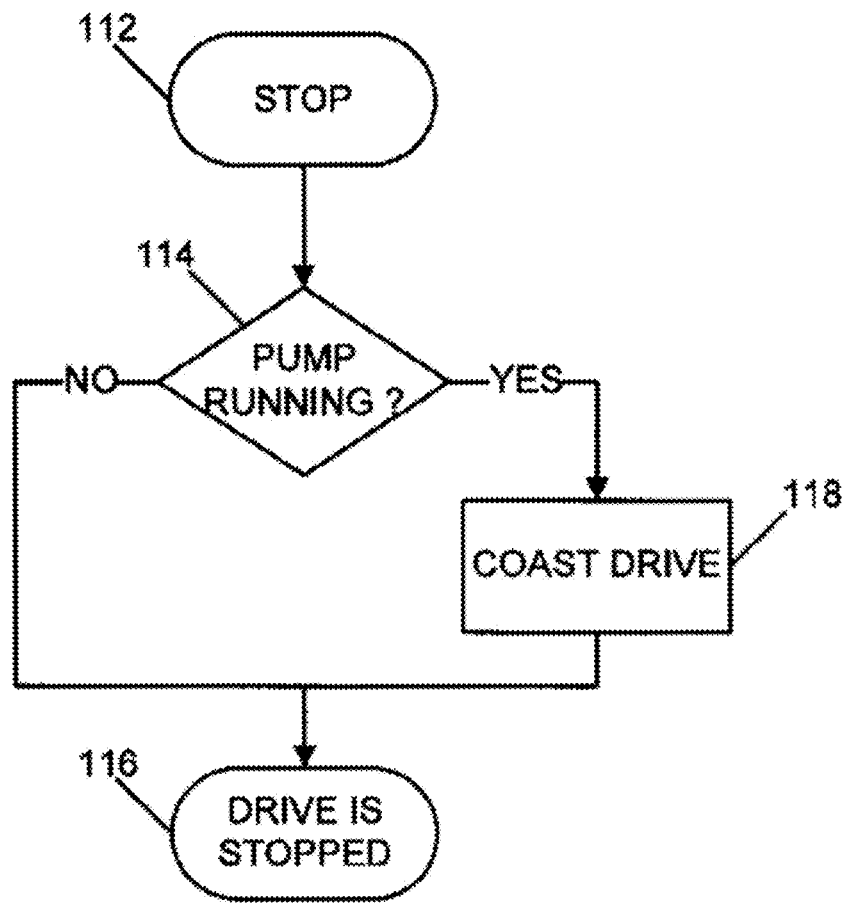
FIG. 10 is a flow chart illustrating a stop operation.

FIG. 10 illustrates a stop operation 112, according to some embodiments. The controller 75 determines if the motor is running (step 114). If the motor is not running (e.g., if the drive 10 is in sleep mode or a run enable command is not triggered), the drive 10 is stopped (step 116). If the motor is running, the motor is allowed to coast to a stop (i.e., 0 Hz) at step 118, then proceeds to step 116.

Figure 11:
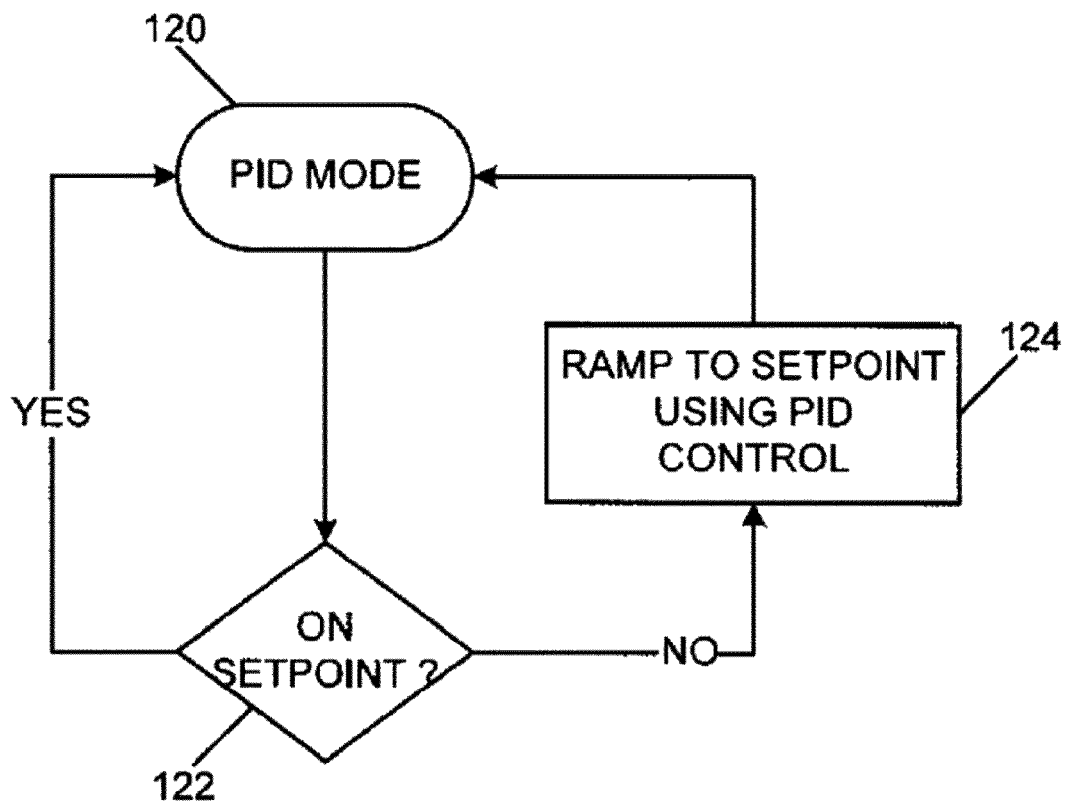
FIG. 11 is a flow chart illustrating a proportional/integral/derivative (PID) mode control operation.

FIG. 11 illustrates a PID mode operation 120, according to some embodiments. The controller 75 continuously determines if the pressure is at a programmed set point (step 122). If the pressure is not at the programmed set point, PID feedback control is used to ramp the frequency until the pressure reaches the set point (step 124).

Figure 12:
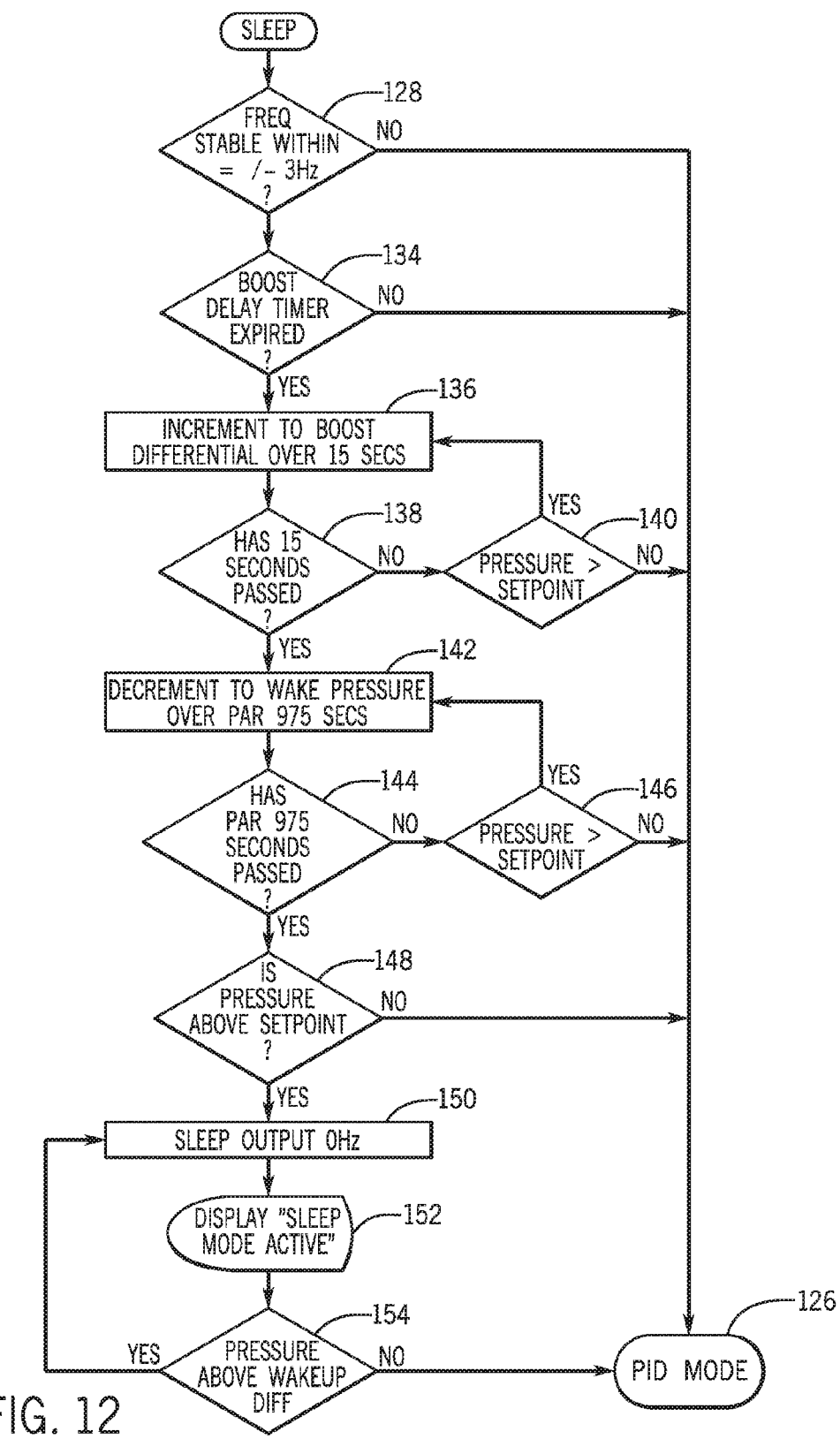
FIG. 12 is a flow chart illustrating a sleep mode operation.

FIG. 12 illustrates the controller 75, running in PID mode (at step 126), checking if the pump should enter a sleep mode. First, at step 128, the controller 75 determines if the frequency of the motor 11 is stable within about +/−3 Hz (e.g., at a steady-state frequency). If not, the controller 75 reverts to step 126. If the frequency of the motor 11 is stable, if, at step 134 the boost delay timer is not expired, the controller 75 reverts back to step 126. However, if, at step 134 the boost delay timer has expired, the controller 75 proceeds to step 136 and the pressure is boosted (e.g., about 3 PSI above the pressure set point) for a short period of time (e.g., about 15 seconds or about 30 seconds).

Until the short period of time has passed (step 138), the controller 75 determines if the pressure stays between the pressure set point (e.g., about 10 PSI) and the boosted pressure (step 140). If, in that short period of time, the pressure falls outside (i.e., below) the range between the pressure set point and the boosted pressure, the controller 75 reverts back to step 126. If, however, the pressure stays between the pressure set point and the boosted pressure, the controller 75 then decrements the pressure over another short period of time (step 142). Until the short period of time has passed (step 144), the controller 75 determines if the pressure stays between the pressure set point (e.g., the steady-state pressure) and the boosted pressure (step 146). If, in that short period of time, the pressure falls outside the range between the pressure set point and the boosted pressure, indicating that there is flow occurring, the controller 75 reverts back to step 126. If, however, the pressure stays between the pressure set point and the boosted pressure, indicating no flow, the controller 75 then determines if the pressure is above the pressure set point (step 148). If not, the controller 75 reverts back to step 126. If the pressure is above the pressure set point, the pump enters the sleep mode causing the motor frequency to coast down to 0 Hz (step 150) and a "sleep mode active" message to be displayed on the liquid crystal display 36 (step 152). While in sleep mode, at step 154, the controller 75 continuously determines if the pressure stays above a wakeup differential pressure (e.g., about 5 PSI below the pressure set point). If the pressure drops below the wakeup differential pressure, the controller 75 reverts back to step 126.

In some embodiments, the controller 75 will only proceed from step 126 to step 128 if the pressure has been stable for at least a minimum time period (e.g., one or two minutes). Also, when the controller 75 cycles from step 128 to step 134 and back to step 126, the controller 75 can wait a time period (e.g., one or two minutes) before again proceeding to step 128. In some embodiments, the controller 75 can determine if the motor speed is stable at step 128. In addition, the controller 75 can perform some steps of FIGS. 11 and 12 simultaneously.

By using the sleep mode operation, a separate device does not need to be purchased for the drive 10 (e.g., a flow meter). Further, the sleep mode operation can self-adjust for changes in pump performance or changes in the pumping system. For example, well pump systems often have changes in the depth of the water in the well both due to drawdown as well as due to time of year or drought conditions. The sleep mode operation can be executed independent of such changes. In addition, the sleep mode operation does not require speed conditions specific to the pump being used.

Figure 13:
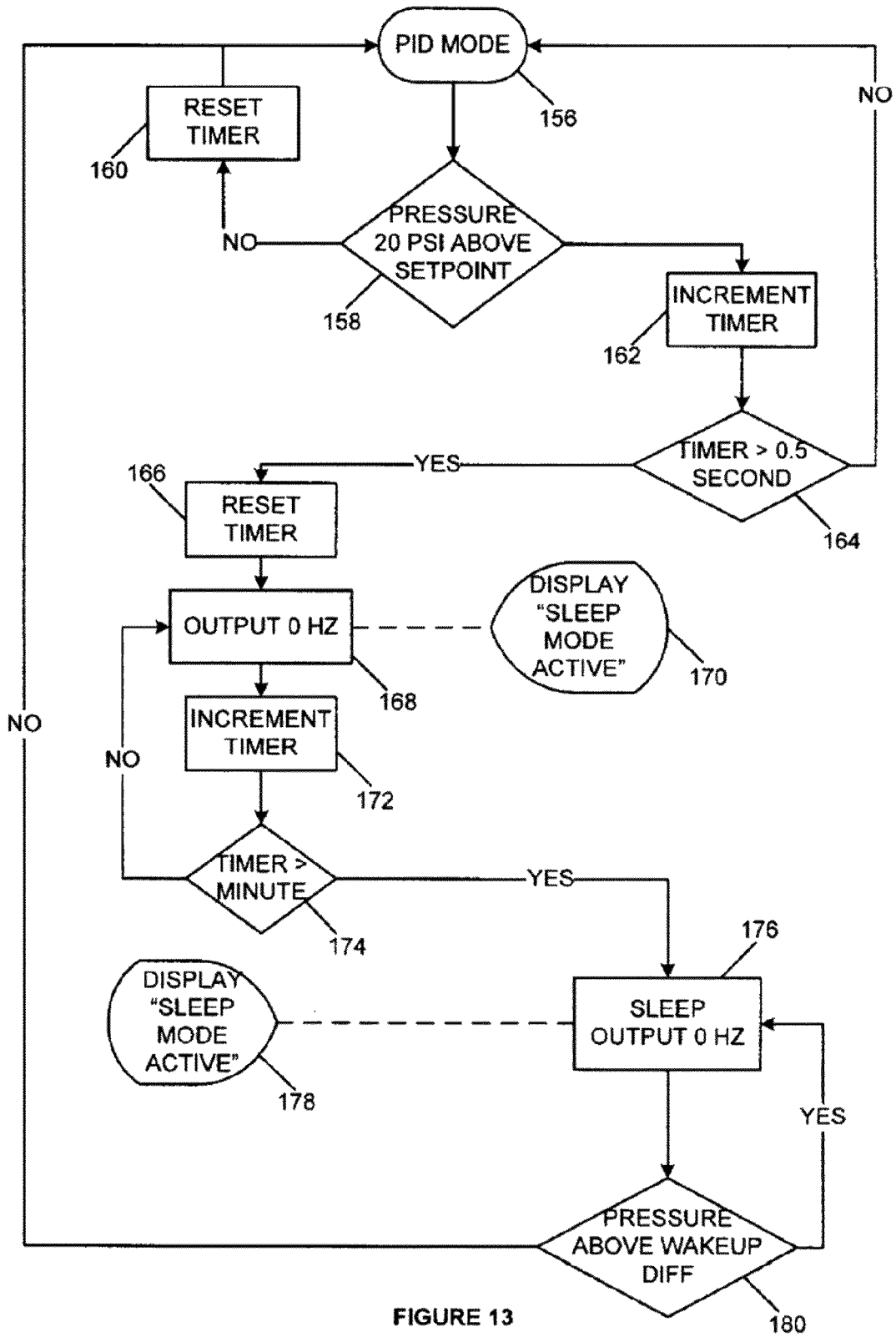
FIG. 13 is a flow chart illustrating an alternate sleep mode operation.

FIG. 13 illustrates the controller 75, running in PID mode, checking if the pump should enter an alternate sleep mode 156. First, at step 158, the controller 75 determines if pressure is at a preset value above the pressure set point (e.g., 20 PSI above the pressure set point). If not (step 160), a timer is reset and the controller 75 reverts to step 156. If the pressure is 20 PSI above the pressure set point, the timer is incremented at step 162. If, at step 164 the timer is less than a value, such as 0.5 seconds, the controller 75 reverts back to step 156. However, if, at step 164 the timer has exceeded 0.5 seconds, the controller 75 proceeds to step 166 and the timer is reset. The controller 75 then sets the motor frequency to 0 Hz (step 168) and displays a "sleep mode active" message 170 on the liquid crystal display 36. The controller 75 then again increments the timer (step 172) until the time reaches another value, such as 1 minute (step 174), and then proceeds to step 176. At step 176, the controller 75 keeps the motor frequency at 0 Hz and displays a "sleep mode active" message 178 on the liquid crystal display 36 as long as the pressure is above a wakeup differential pressure (step 180). If the pressure drops below the wakeup differential pressure (e.g., water is being used), the controller 75 reverts back to step 156.

Figure 14:
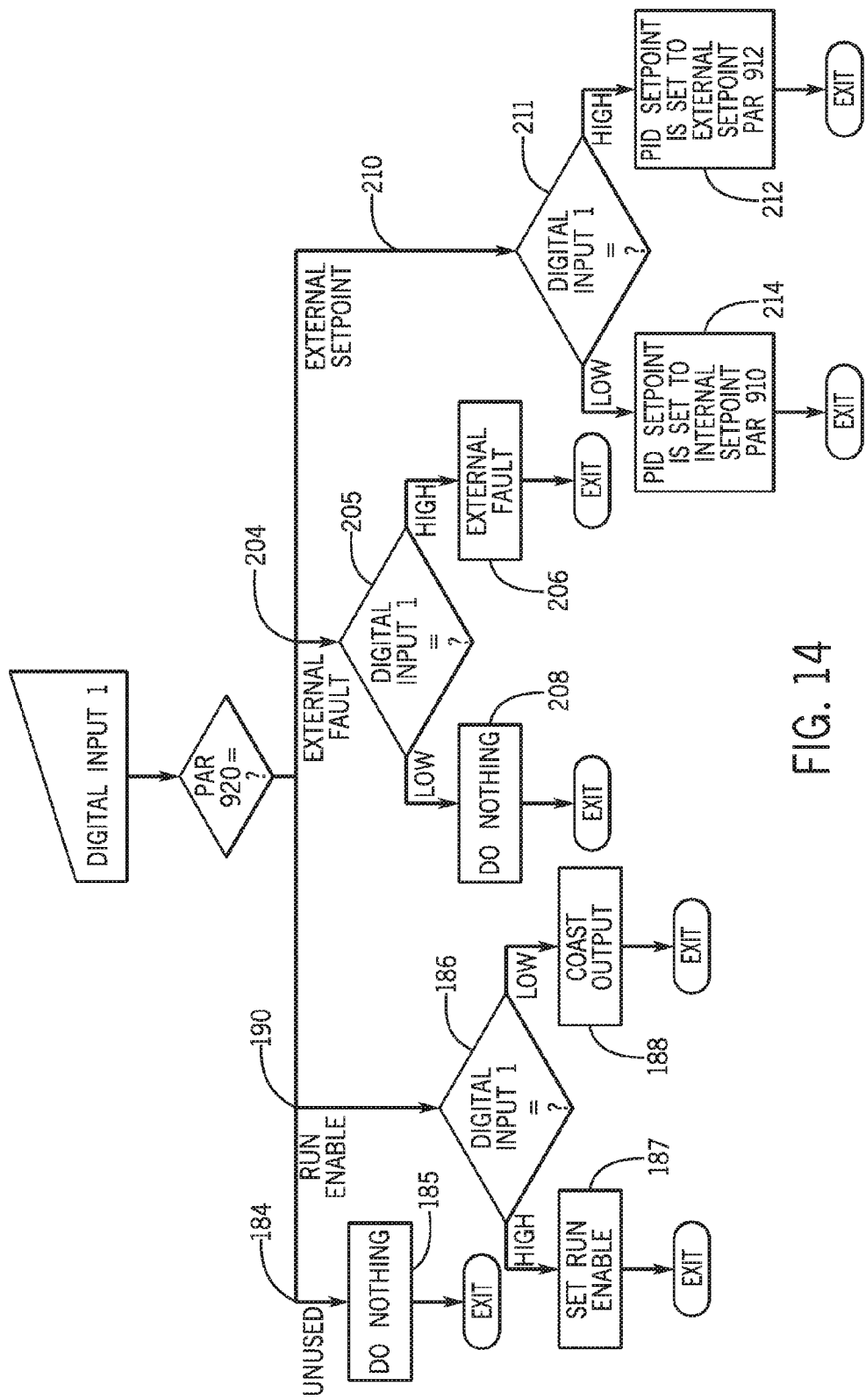
FIG. 14 is a flow chart illustrating a digital input control operation.

FIG. 14 illustrates an example of controller operation using a digital input. In some embodiments, more than one digital input may be available to the user. The controller 75 first recognizes a digital input (step 182). If an external input parameter is unused (step 184), the controller 75 takes no action (step 185) whether the input is high or low (steps 186 and 188, respectively). If the external input parameter is set to a run enabled mode (step 190), the controller 75 determines if the input is high or low at step 186. If the input is high (e.g., indicating allowing the drive 10 to be run), the controller 75 sets Run enable (step 187). If the external input parameter is set to a run enabled mode (step 190) and the input is low (e.g., indicating to stop the drive 10), the controller 75 can set a coast output (step 188). If the external input parameter is set to an external fault mode (step 204), the controller 75 determines if the input is high or low at step 205. If the input is high (e.g., indicating an external fault), the controller 75 can perform an external fault operation (step 206), as described with reference to FIG. 47. If the external input parameter is set to an external fault mode (step 204) and the input is low (e.g., indicating there is no external fault), the controller 75 takes no action (step 208). If the external input parameter is set to an external set point mode (step 210), the controller 75 determines if the input is high or low at step 211. If the input is high, the controller 75 sets the PID set point to "external" (step 212), for example, so that the digital input controls the pressure set point for PID pressure control. If the external input parameter is set to an external set point mode (step 210) and the input is low, the controller 75 sets the PID set point to an internal setpoint parameter (step 214), for example, so that the digital input has no control over the pressure set point for PID pressure control.

Figure 15:
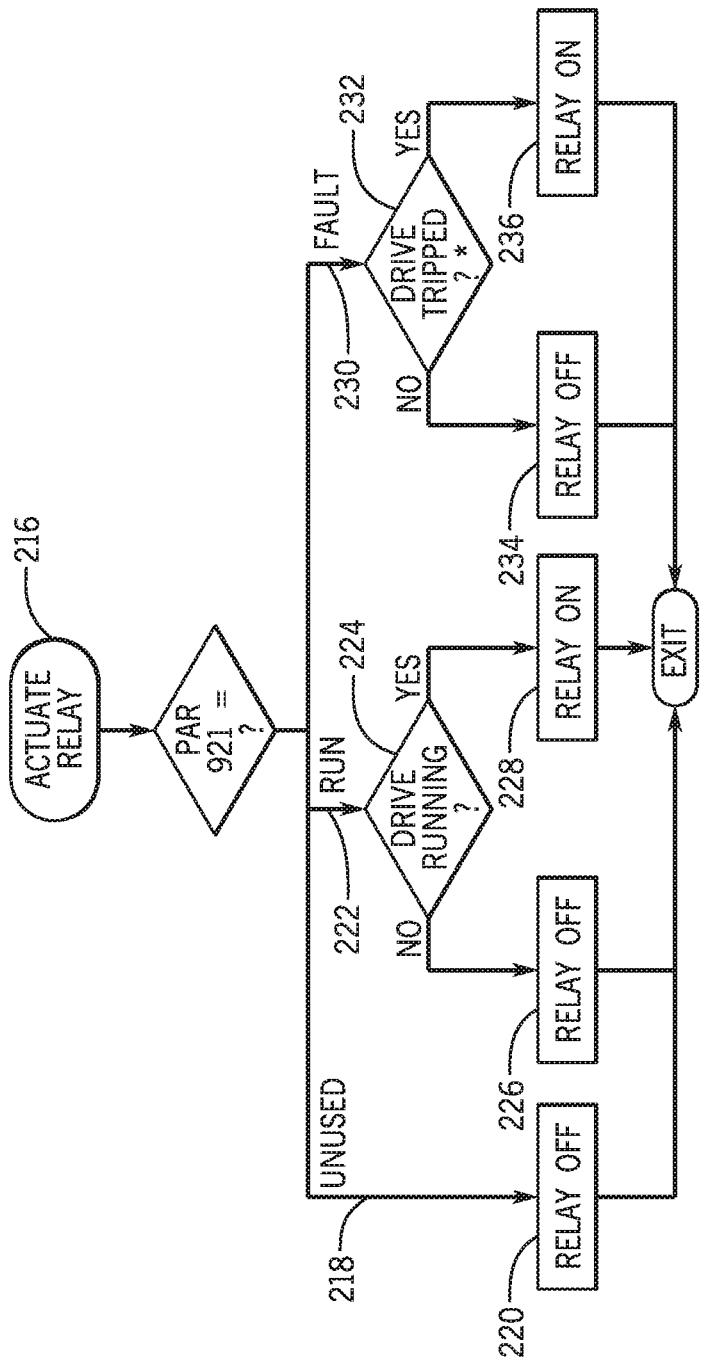
FIG. 15 is a flow chart illustrating a relay output control operation.

FIG. 15 illustrates controller operation of a relay output. To actuate the relay (step 216), the controller 75 determines if a relay output parameter is unused (step 218). If so, the controller 75 turns the relay off, e.g. open (step 220). If not, the controller 75 determines if the relay output parameter is set to a run mode (step 222). If the relay output parameter is set to a run mode (at step 222), the controller 75 determines if the drive 10 is running (step 224). The controller 75 will then turn the relay off if the drive 10 is not running (step 226) or turn the relay on, e.g., closed, if the drive 10 is running (step 228). If the relay output parameter is not set to a run mode (at step 222), the controller 75 determines if the relay output parameter is set to a fault mode (step 230). If so, the controller 75 determines, at step 232, if the drive 10 is tripped (e.g., a fault has occurred and the drive 10 has been stopped). The controller 75 will then turn the relay off if the drive 10 has not been tripped (step 234) or turn the relay on if the drive 10 has been tripped (step 236). For example, if an alarm is the relay output, the alarm can be activated if the drive 10 has been tripped to indicate the fault condition to the user.

Figure 16:
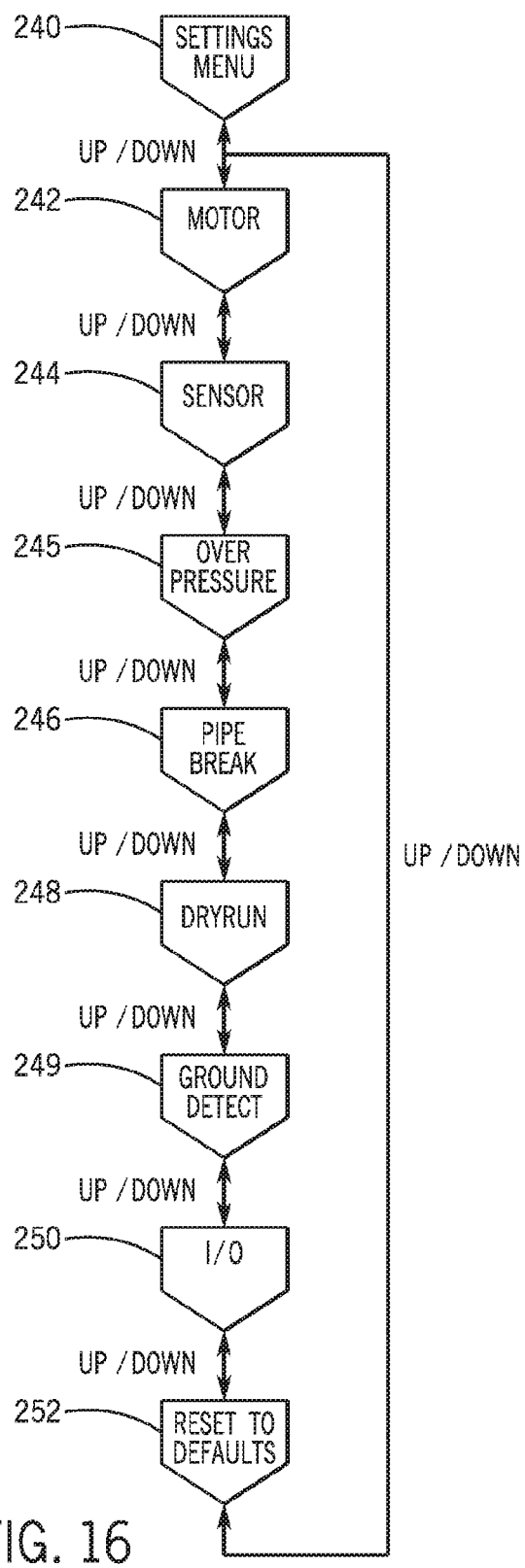
FIG. 16 is a flow chart illustrating a main menu.

FIGS. 16-29 and FIGS. 64-65 are flow charts describing menu operations according to some embodiments of the invention. FIG. 16 illustrates a main menu 238 of the controller 75. The main menu 238 can include the following parameters: settings menu 240, motor 242, sensor 244, over pressure 245, pipe break 246, dry run 248, ground detect 249, I/O (input/output) 250, and reset to defaults 252. The user can view the main menu 238 on the liquid crystal display 36 using the main menu button 44 on the control pad 14. The user can then toggle up and down through the parameters of the main menu 238 using the directional buttons 52. The user can select a parameter using the enter button 56.

Figure 17:
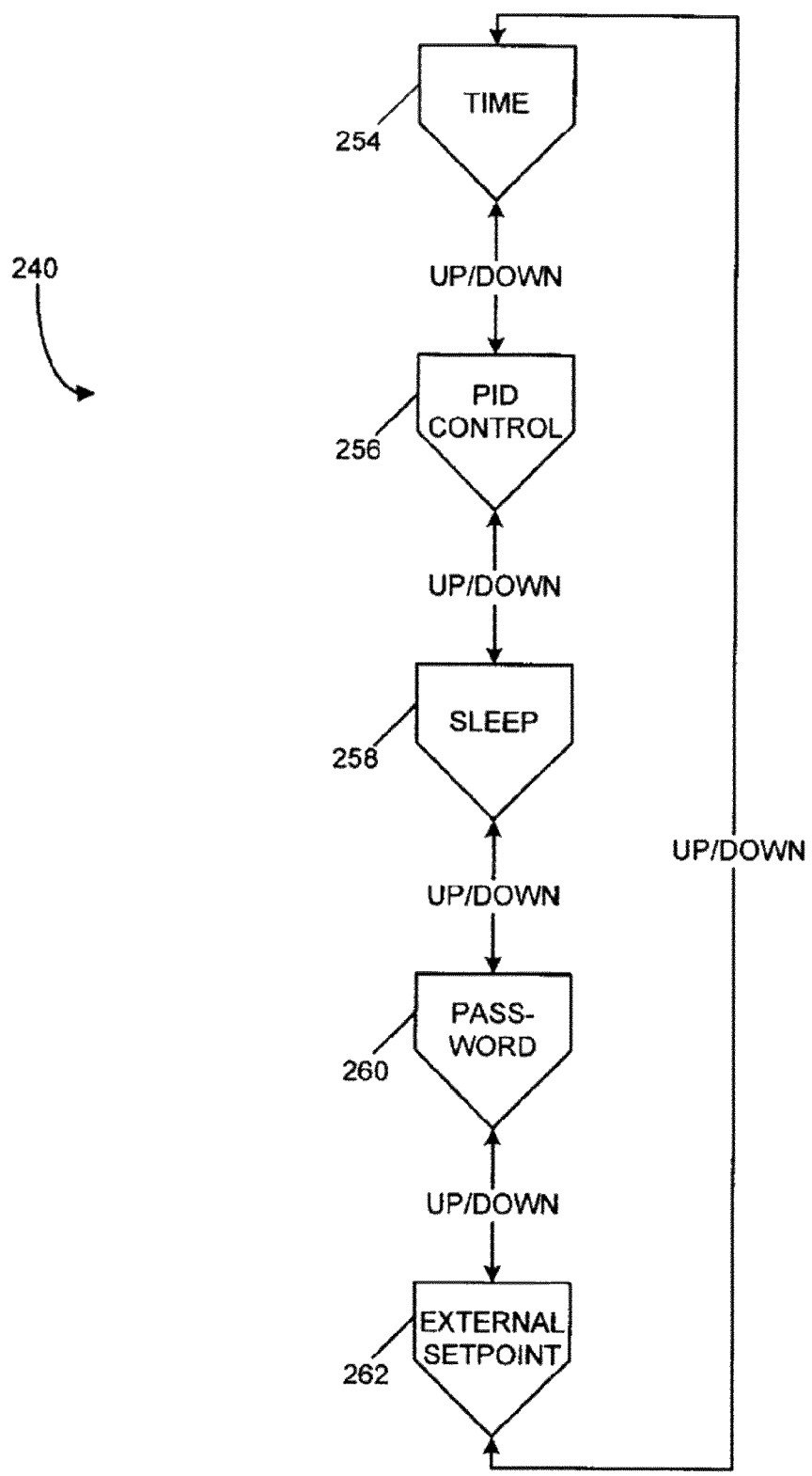
FIG. 17 is a flow chart illustrating a settings menu.

From the main menu 238, the user can select the settings menu 240. The user can toggle up and down through the settings menu 240 to view the following parameters, as shown in FIG. 17: time 254, PID control 256, sleep 258, password 260, and external set point 262.

Figure 18:
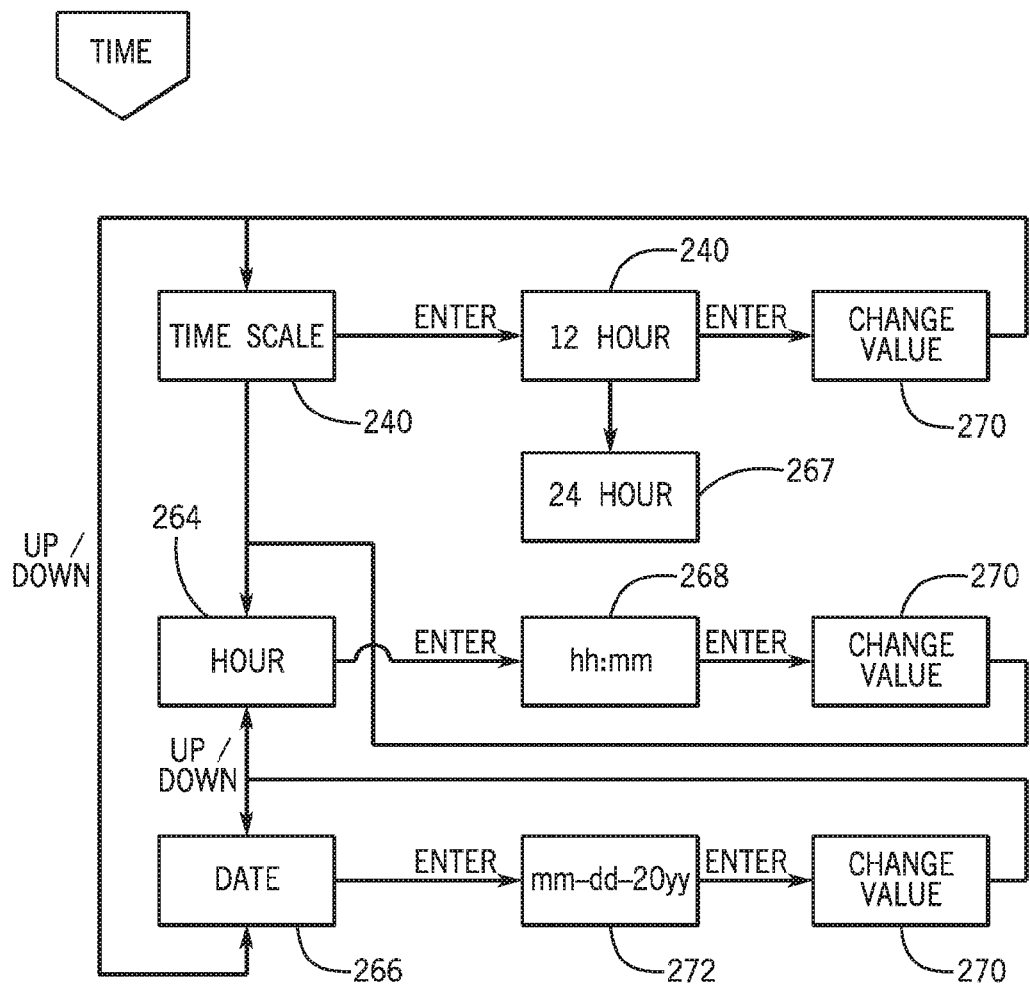
FIG. 18 is a flow chart illustrating a time parameter menu.

FIG. 18 illustrates the user's options after selecting the time parameter 254 from the settings menu 240. The user can select a time scale parameter 263 to choose between a twelve hour 265 or twenty-four hour 267 display parameter. The time scale parameter 263 is changed by the user's input 270. The user can toggle up and down between setting a current hour 264 or a date 266. If the user selects the hour parameter 264, the user can enter a current time 268, and a time value for the controller 75 will be changed according to the user's input 270. If the user selects the date parameter 266, the user can enter a current date 272 and a date value for the controller 75 will be changed according to the user's input 270.

Figure 19:
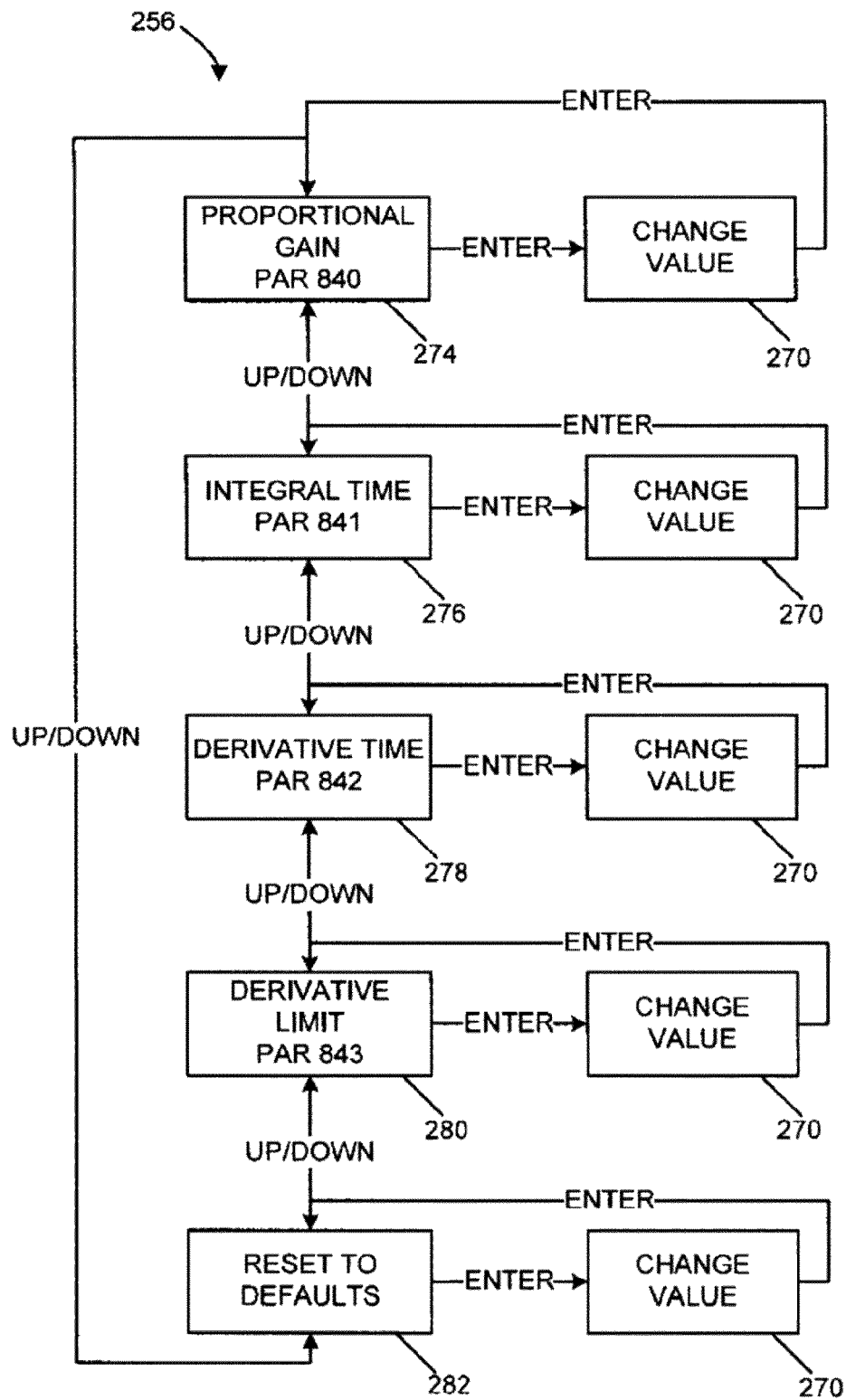
FIG. 19 is a flow chart illustrating a PID control parameter menu.

FIG. 19 illustrates the user's options after selecting the PID control parameter 256 from the settings menu 240. The following parameters can be chosen after selecting PID control 256: proportional gain 274, integral time 276, derivative time 278, derivative limit 280, and restore to defaults 282. The user can select any of the parameters 274-282 to modify one or more preferences associated with the parameters, and appropriate values for the controller 75 will be changed 270.

Figure 20:
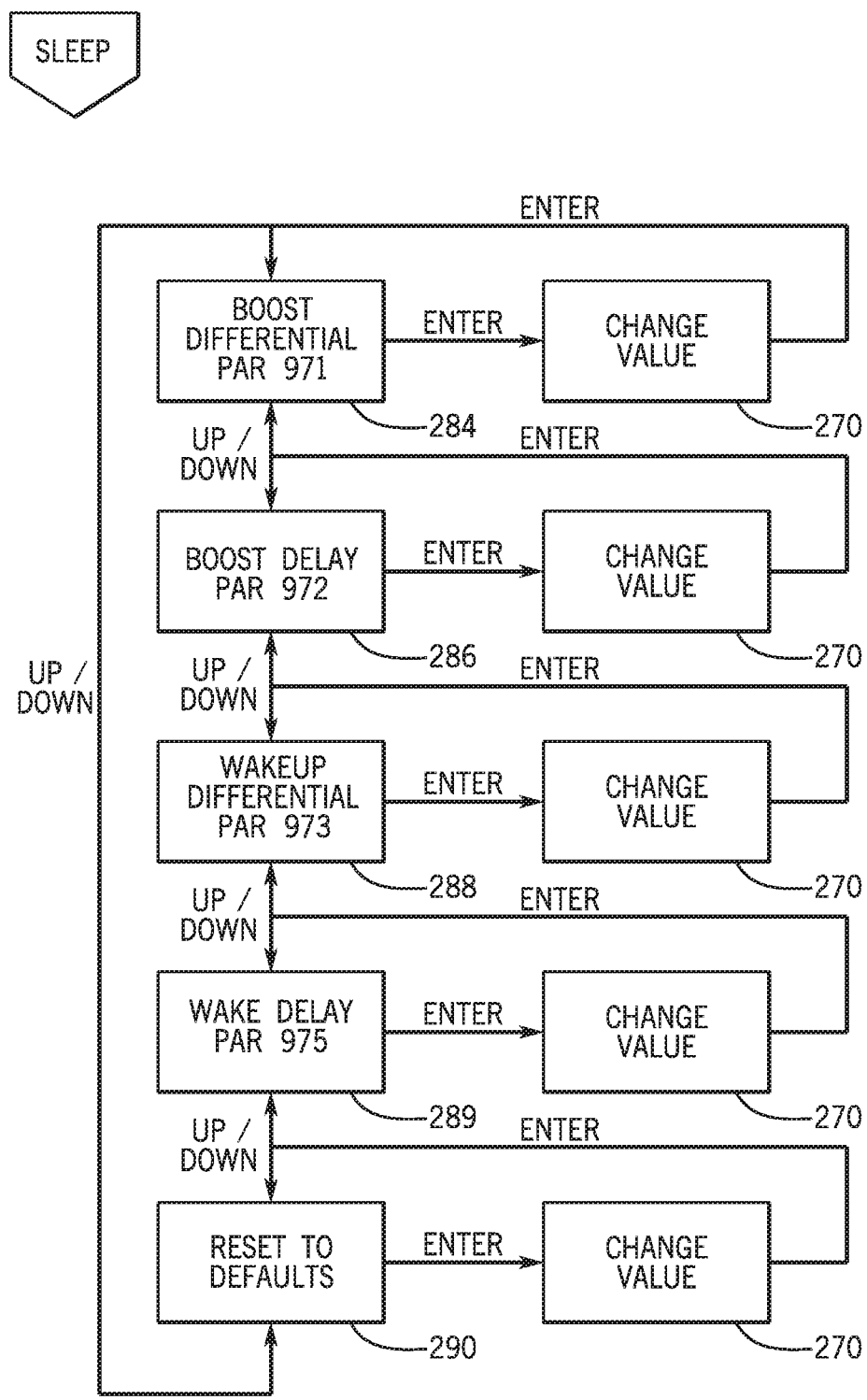
FIG. 20 is a flow chart illustrating a sleep parameter menu.

FIG. 20 illustrates the user's options after selecting the sleep parameter 258 from the settings menu 240. The following parameters can be chosen after selecting sleep 258: boost differential 284, boost delay 286, wakeup differential 288, wake delay 289 and restore to defaults 290. The user can select any of the parameters 284-290 to modify one or more preferences associated with the parameters, and appropriate values for the controller 75 will be changed 270. The parameters can be set to modify or adjust the sleep mode operation described with reference to FIG. 12.

Figure 21:
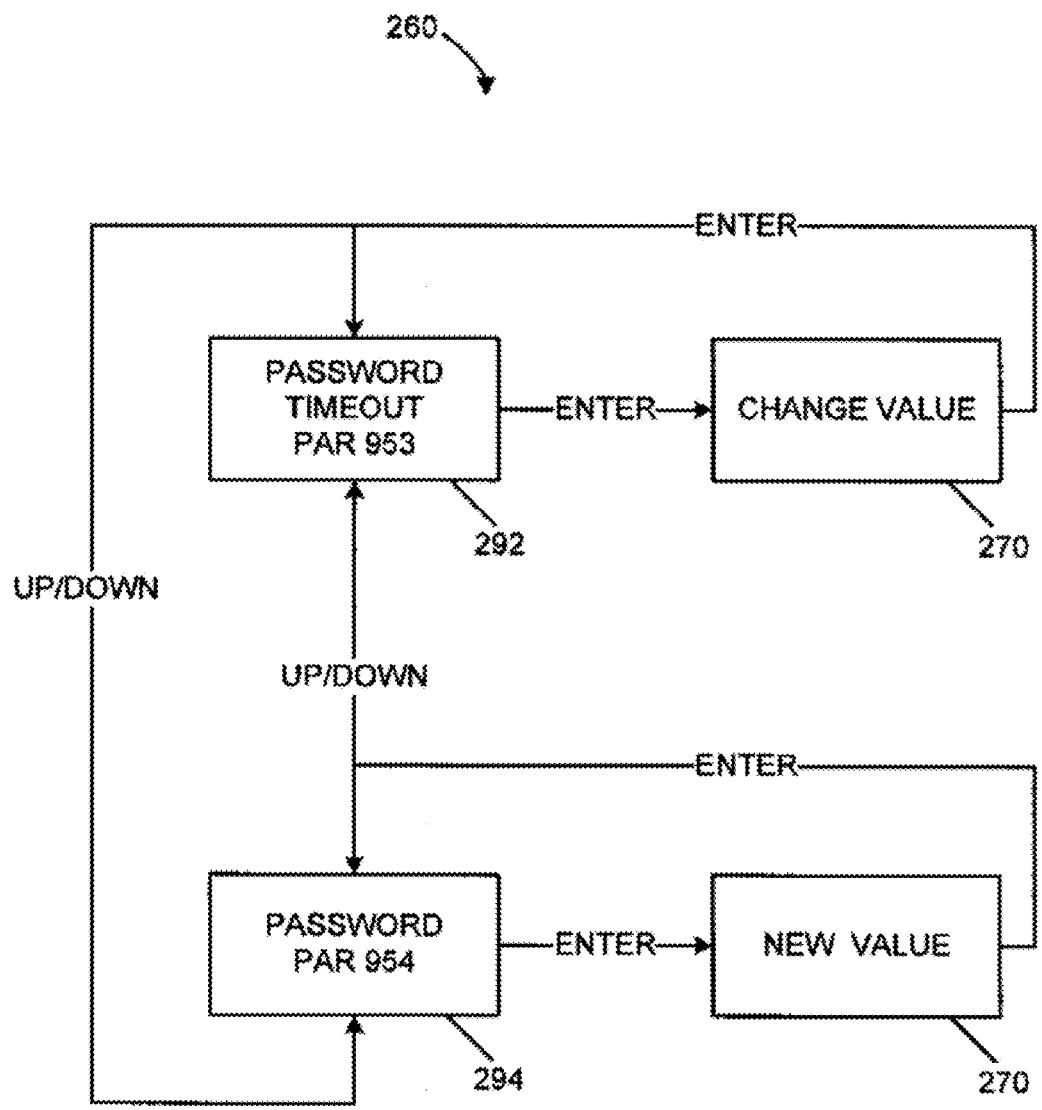
FIG. 21 is a flow chart illustrating a password parameter menu.

FIG. 21 illustrates the user's options after selecting the password parameter 260 from the settings menu 240. The following parameters can be chosen after selecting password 260: password timeout 292 and password 294. The user can select any of the parameters 292-294 to modify one or more preferences associated with the parameters, and appropriate values for the controller 75 will be changed 270. The password timeout parameter 292 can include a timeout period value. If the control pad 14 is not accessed within the set timeout period, the controller 75 can automatically lock the control pad 14 (i.e., enter a password protection mode). To unlock the keys, or leave the password protection mode, the user must enter the password that is set under the password parameter 294. This is further described below with reference to FIG. 56.

Figure 22:
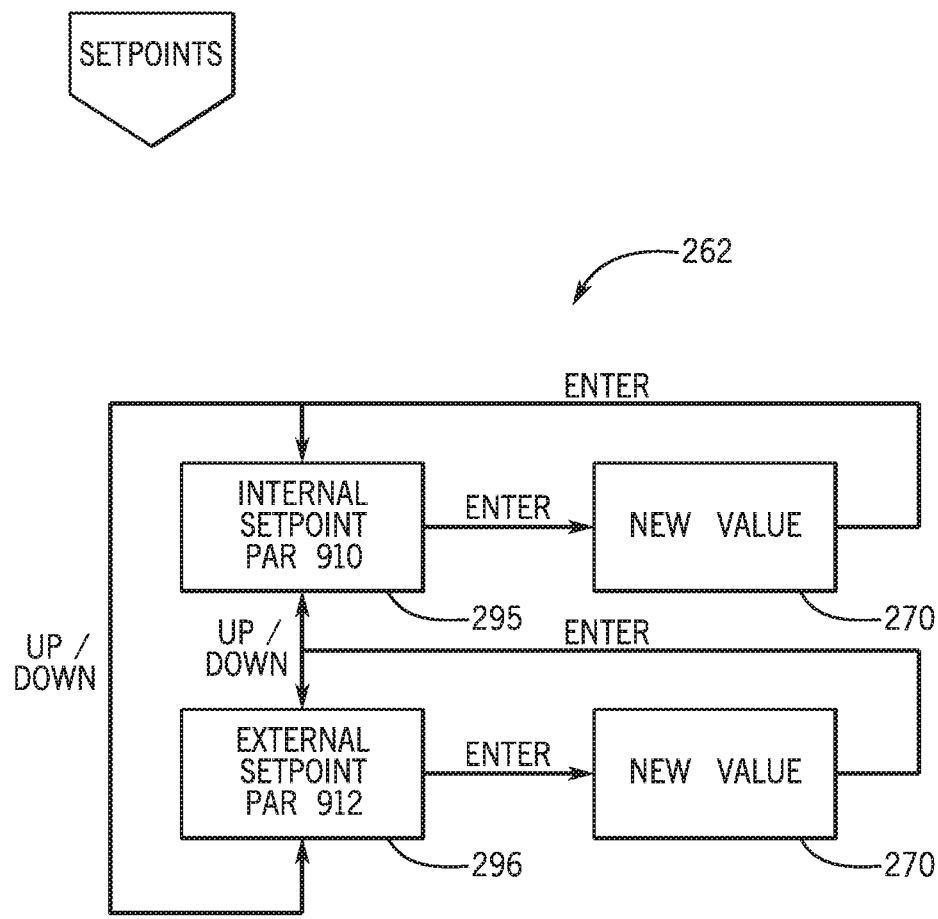
FIG. 22 is a flow chart illustrating an external set point parameter menu.

FIG. 22 illustrates the user's options after selecting the internal and external set point parameter 262 from the settings menu 240. The user can select the internal set point parameter 295 and the external set point parameter 296 to modify one or more preferences associated with the parameters 295 and 296, and appropriate values for the controller 75 will be changed 270.

Figure 23:
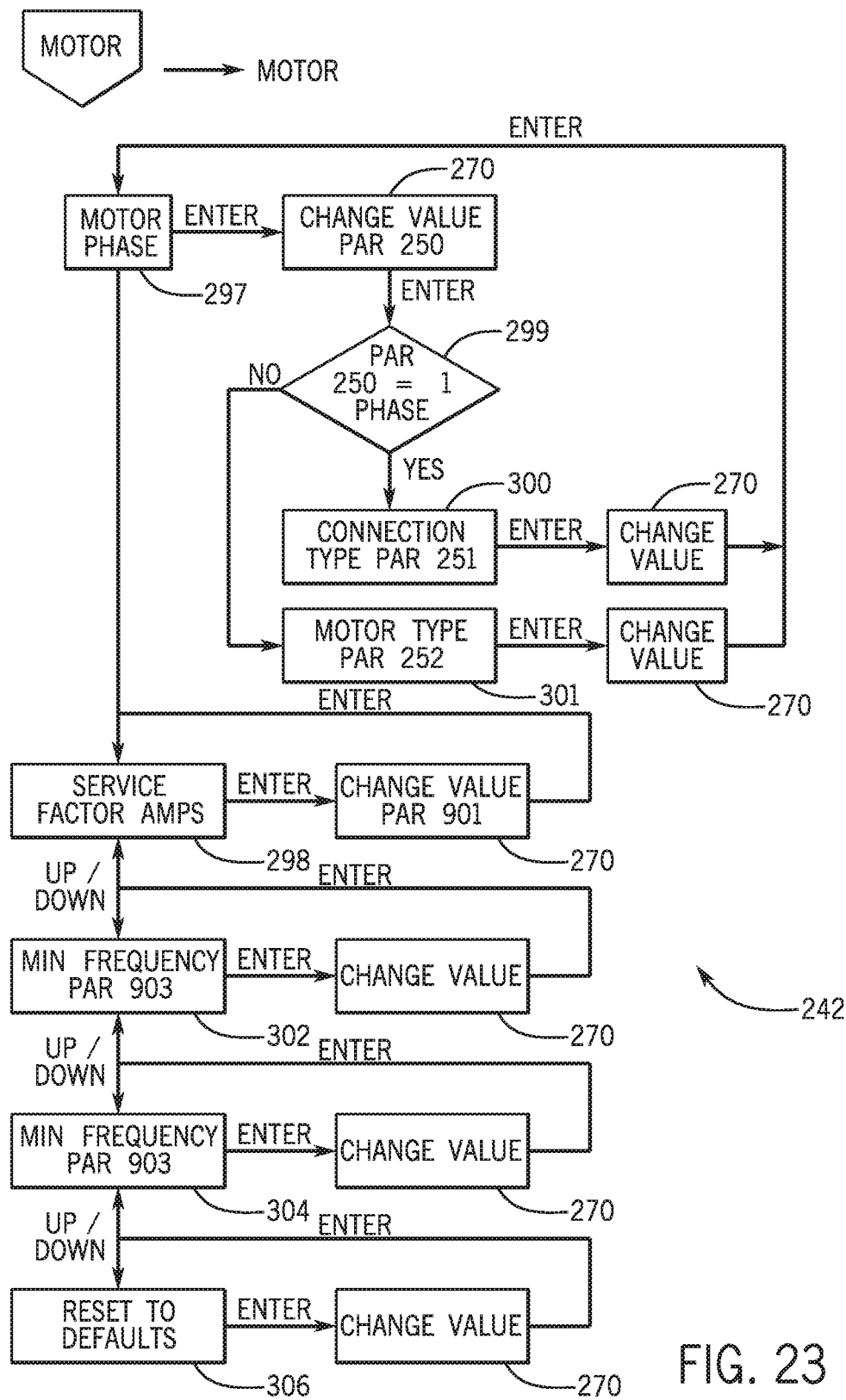
FIG. 23 is a flow chart illustrating a motor parameter menu.

FIG. 23 illustrates the user's options after selecting the motor parameter 242 from the main menu 238. The following parameters can be chosen after selecting motor 242: motor phase 297, service factor amps 298, connection type 300, minimum frequency 302, maximum frequency 304, and restore to defaults 306. When motor phase 297 is selected, the connection type parameter 300 may only be available if the drive 10 is being used to run a single-phase motor 299. If the drive 10 is being used to run a three-phase motor, the connection type parameter 300 may not be provided. In an alternative embodiment, a motor type parameter 301 can be chosen. The user can select any of the parameters 297-306 to modify one or more preferences associated with the parameters, and appropriate values for the controller 75 will be changed 270.

Figure 24:
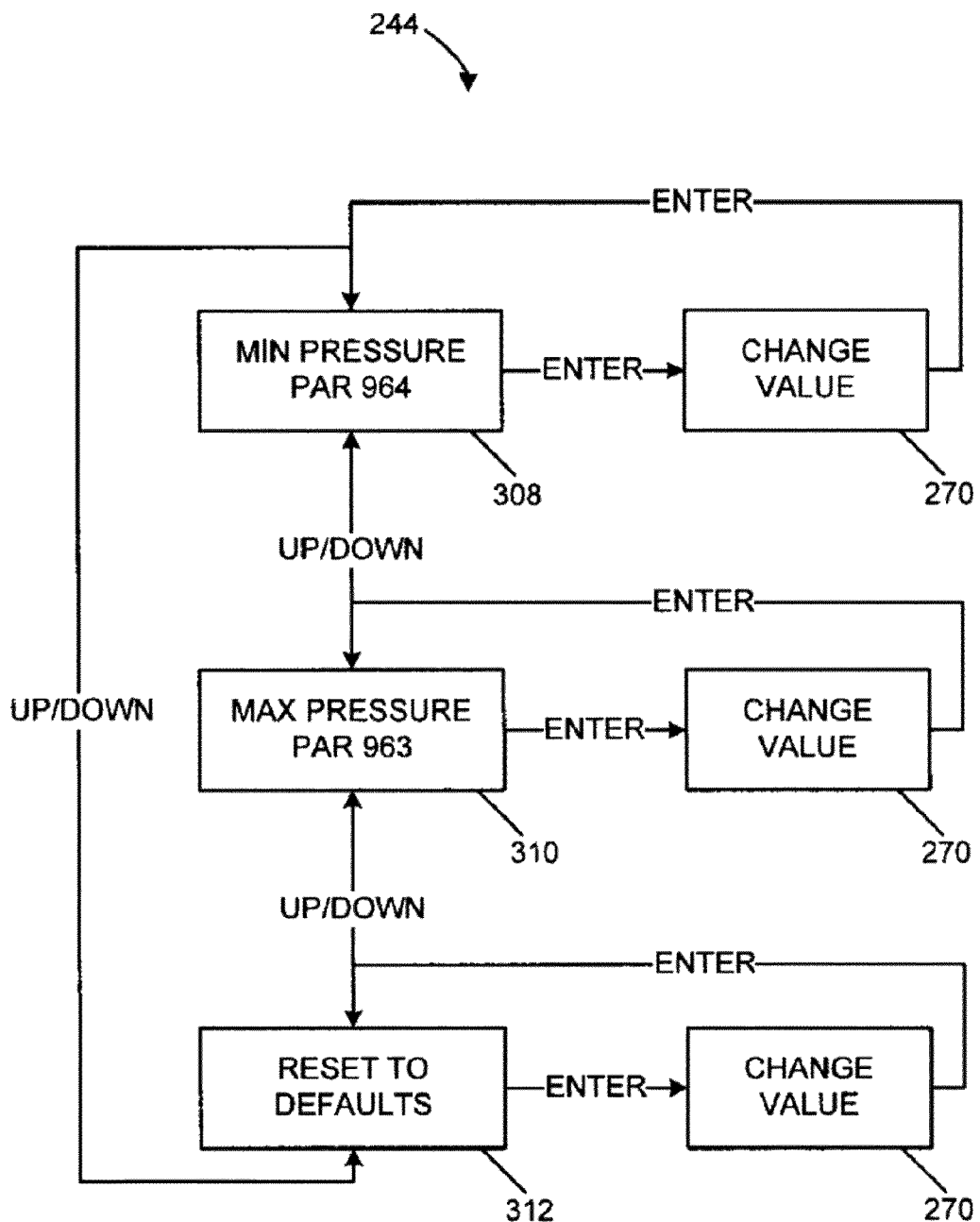
FIG. 24 is a flow chart illustrating a sensor parameter menu.

FIG. 24 illustrates the user's options after selecting the sensor parameter 244 from the main menu 238. The following parameters can be chosen after selecting sensor 244: minimum pressure 308, maximum pressure 310, and restore to defaults 312. The user can select any of the parameters 308-312 to modify one or more preferences associated with the parameters, and appropriate values for the controller 75 will be changed 270.

Figure 25:
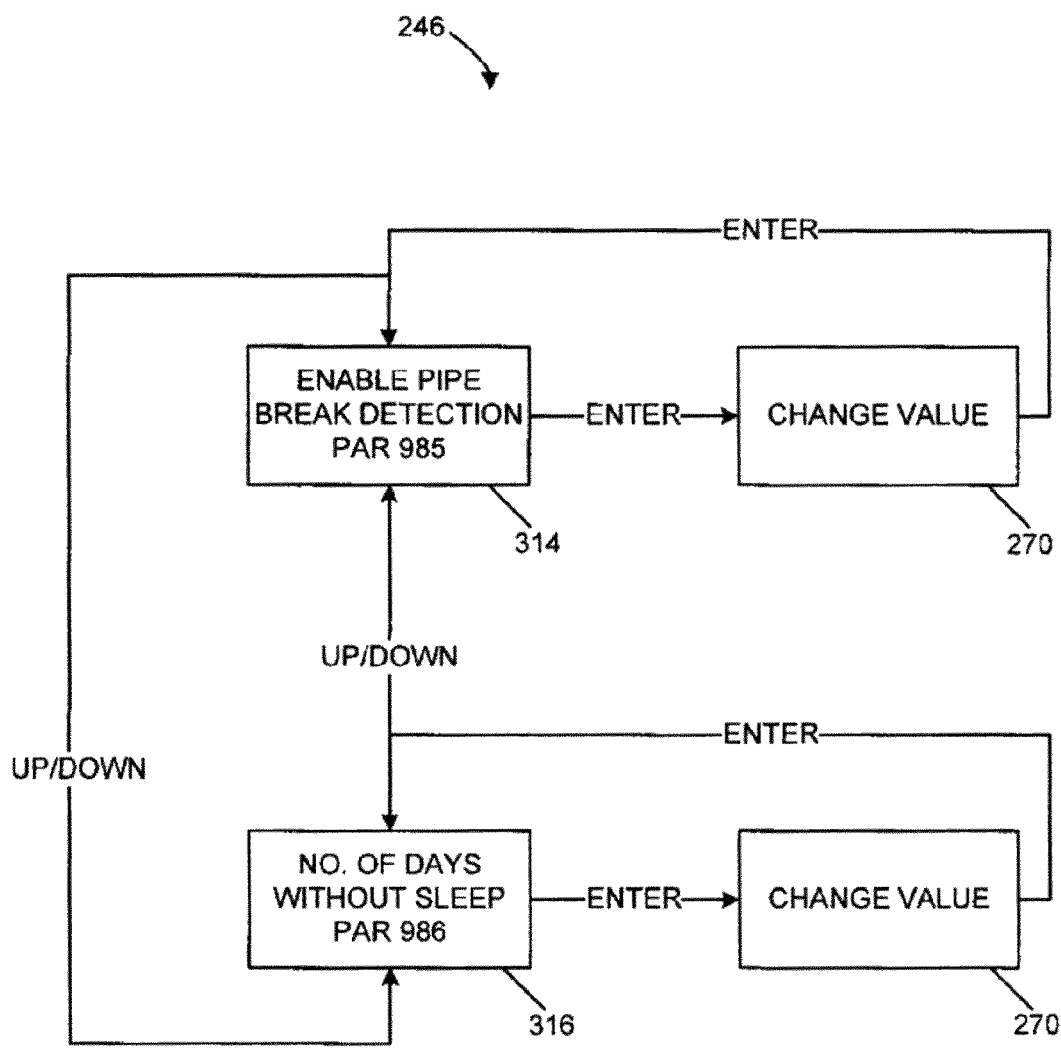
FIG. 25 is a flow chart illustrating a pipe break parameter menu.

FIG. 25 illustrates the user's options after selecting the pipe break parameter 246 from the main menu 238. The following parameters can be chosen after selecting pipe break 246: enable pipe break detection 314 and number of days or hours without sleep 316. The user can select either of the parameters 314-316 to modify one or more preferences associated with the parameters, and appropriate values for the controller 75 will be changed 270. In some embodiments, the number of days or hours without sleep parameter 316 can include values in the range of about four hours to about fourteen days. The enable pipe break detection parameter 314 can allow the user to enable or disable pipe break detection.

Figure 26:
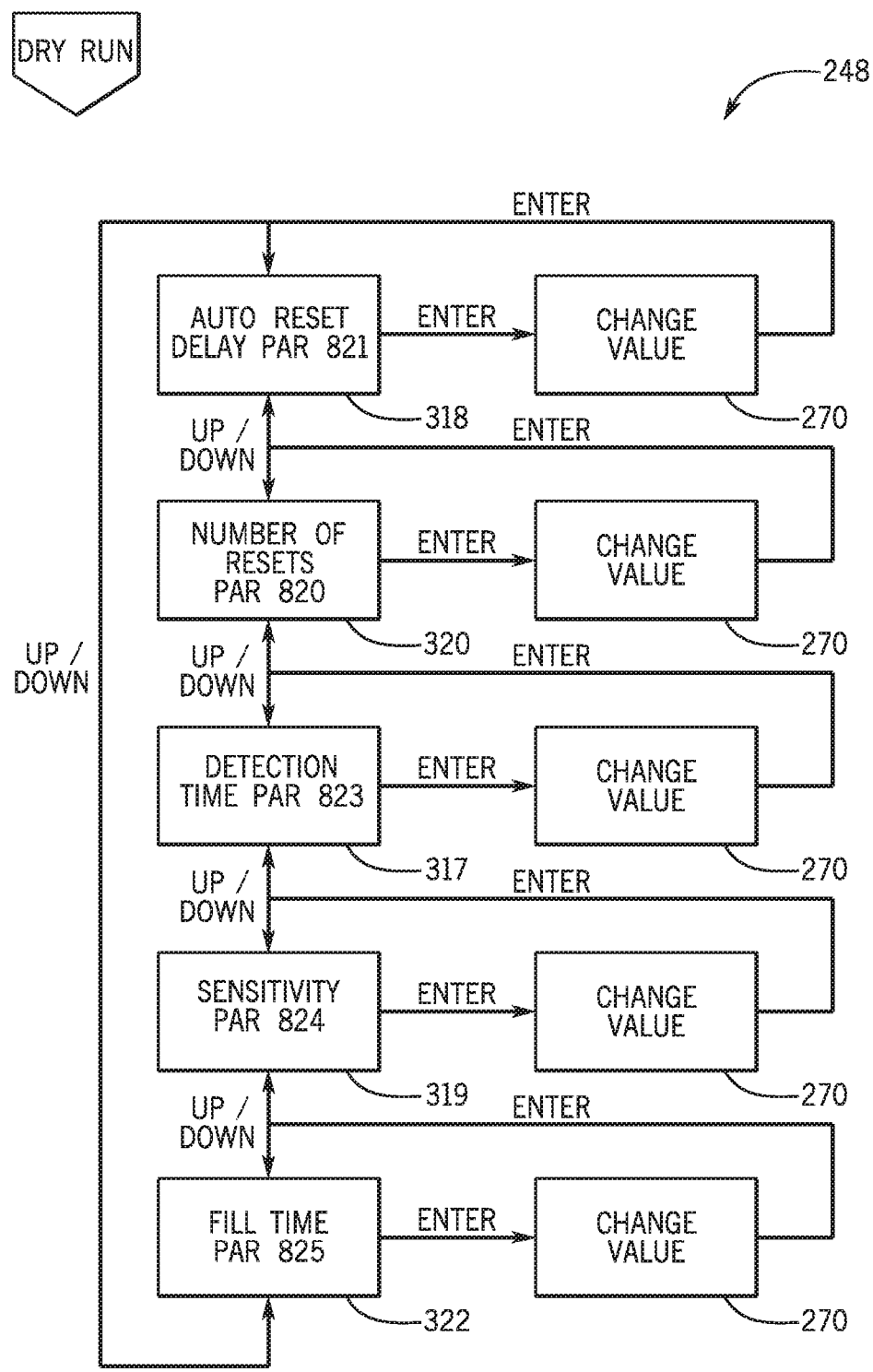
FIG. 26 is a flow chart illustrating a dry run parameter menu.

FIG. 26 illustrates the user's options after selecting the dry run parameter 248 from the main menu 238. The following parameters can be chosen after selecting dry run 248: auto reset delay 318, number of resets 320, detection time 317, sensitivity 319 and fill time 322. The user can select either of the parameters 317-322 to modify one or more preferences associated with the parameters, and appropriate values for the controller 75 will be changed 270.

Figure 27:
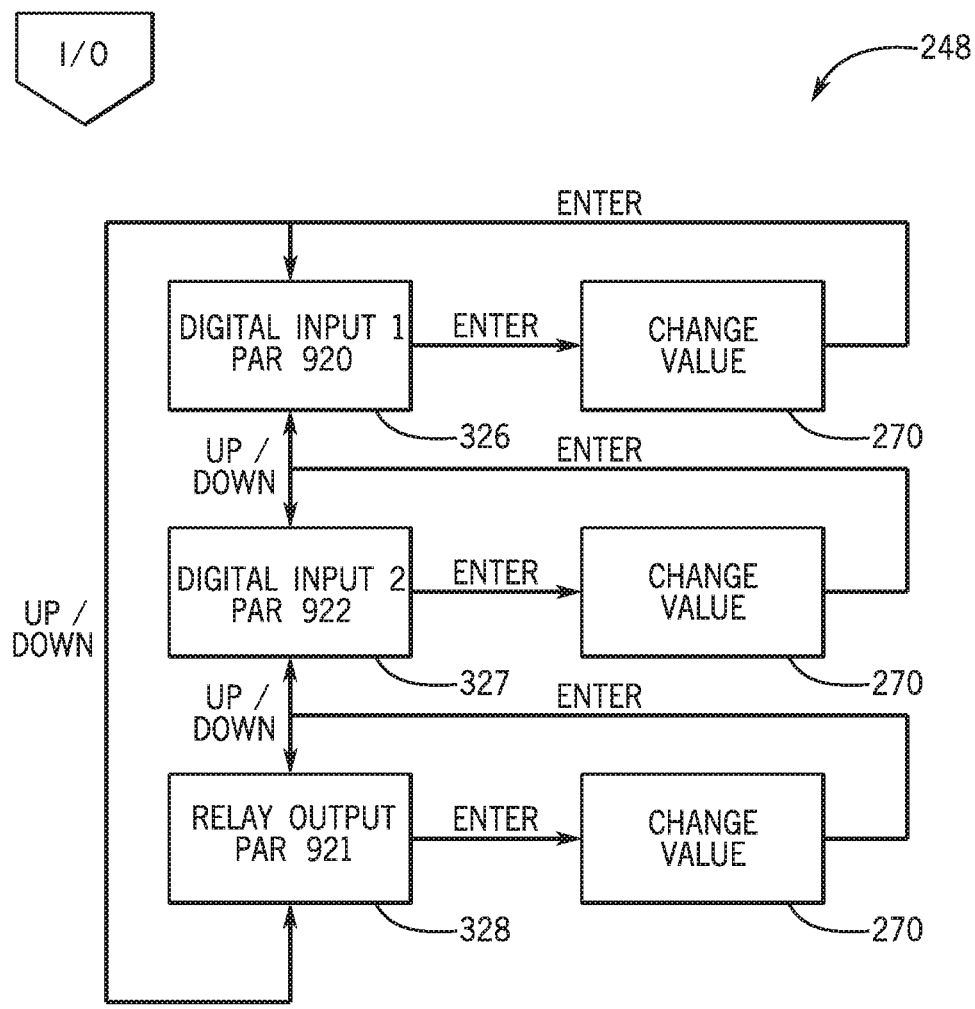
FIG. 27 is a flow chart illustrating an input/output parameter menu.

FIG. 27 illustrates the user's options after selecting the I/O parameter 250 from the main menu 238. The following parameters can be chosen after selecting I/O 250: digital input one 326, digital input two 327 and relay output 328. The user can select either of the parameters 326-328 to modify one or more preferences associated with the parameters, and appropriate values for the controller 75 will be changed 270.

Figure 28:
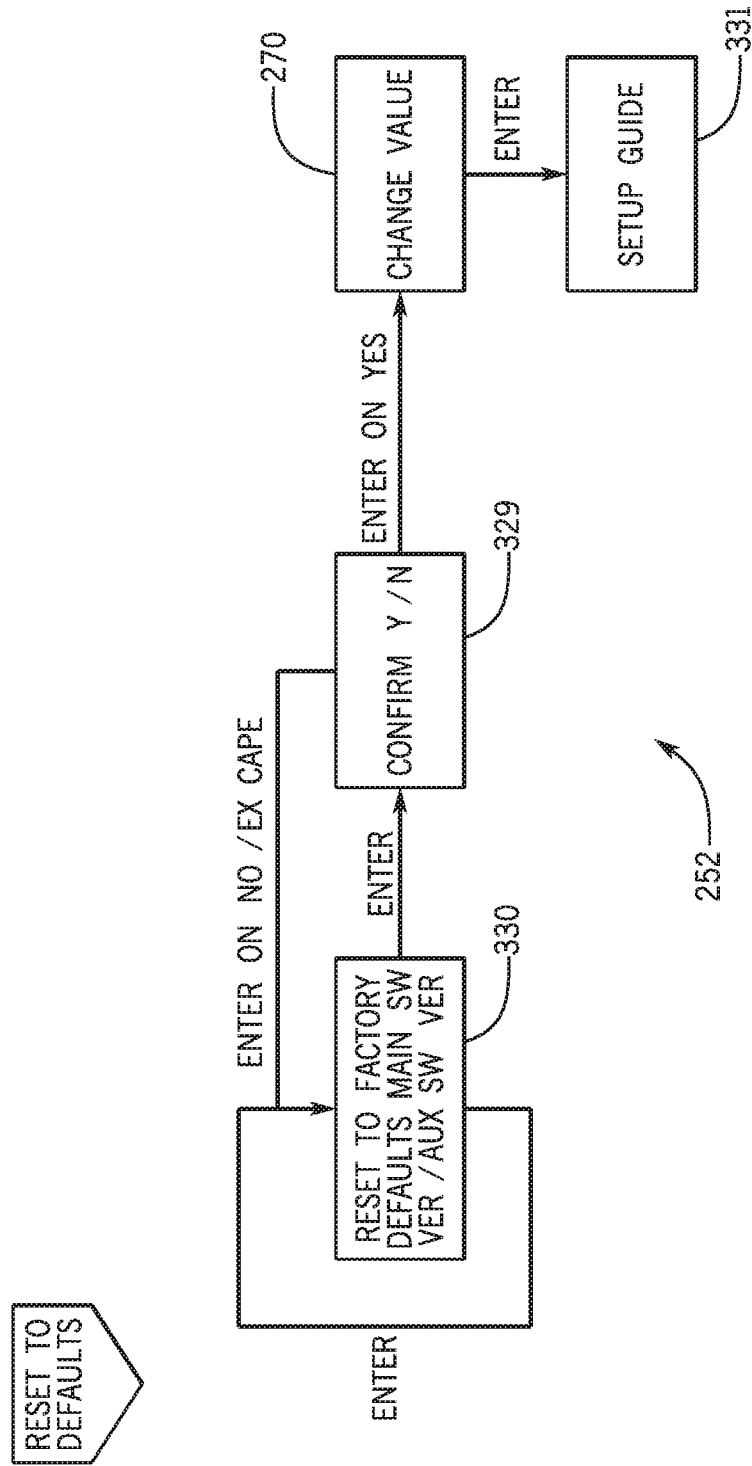
FIG. 28 is a flow chart illustrating a reset parameter menu.

FIG. 28 illustrates the user's options after selecting the reset to defaults parameter 252 from the main menu 238. The user can select the parameter 330 to change all values to factory default values. At 329, the user can be queried to confirm their selection, and the values changed at 270. A setup guide operation 331 can then be executed by the controller 75.

Figure 29:
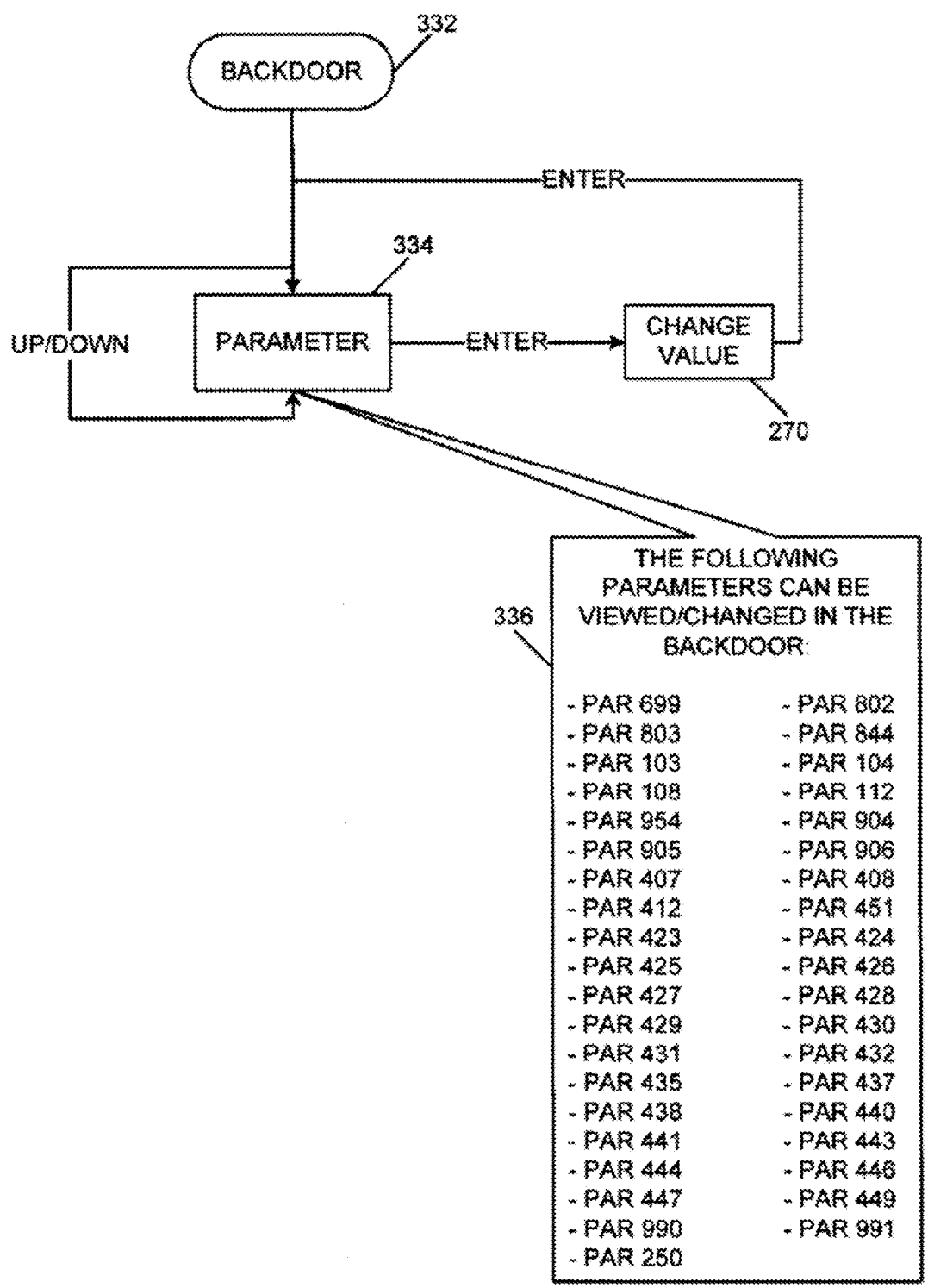
FIG. 29 is a flow chart illustrating a backdoor parameter menu.

FIG. 29 illustrates a backdoor parameter 332, according to some embodiments. With the backdoor parameter 332, the user can choose a parameter 334 not normally accessible through other menus. The user can select the parameter 334 to modify one or more preferences associated with the parameter, and appropriate values for the controller 75 will be changed 270. The parameter 334 that the user selects can be from a list of parameters 336. The list of parameters 336 can include one or more of the parameters disclosed above as well as other parameters.

Figure 30:
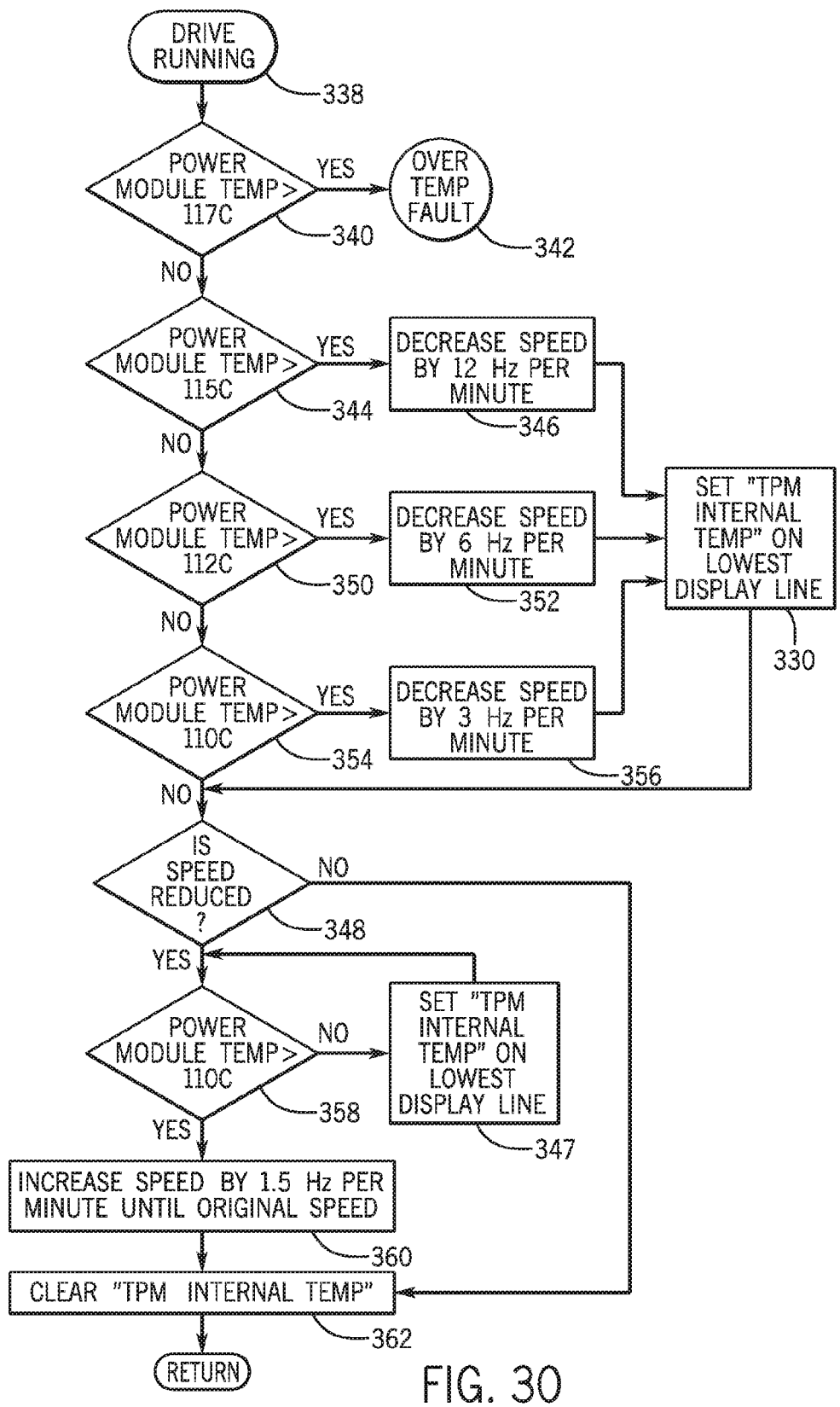
FIG. 30 is a flow chart illustrating an overheat prevention operation.

FIGS. 30-47 are flow charts describing drive warnings and faults according to some embodiments of the invention. FIG. 30 illustrates an overheat prevention operation of the controller 75. When the drive 10 is running (step 338), the controller 75 first determines, at step 340, if a power module temperature is greater than a first temperature (e.g., 117 degrees Celsius). If so, an overheat fault operation is executed (step 342). If not, the controller 75 then determines, at step 344, if the power module temperature is greater than a second temperature (e.g., about 115 degrees Celsius). If so, the controller 75, at step 346, decreases the speed of the motor by a first value (e.g., about 12 Hz per minute), and at step 347, sets a warning message "TPM Internal Temp" for display, and then continues to step 348. If not, the controller 75 then determines, at step 350, if the power module temperature is greater than a third temperature (e.g., about 112 degrees Celsius). If so, the controller 75, at step 352, decreases the speed of the motor by a second value (e.g., about 6 Hz per minute), and at step 347, sets a warning message "TPM Internal Temp" for display, and then continues to step 348. If not, the controller 75 then determines, at step 354, if the power module temperature is greater than a fourth temperature (e.g., about 110 degrees Celsius). If so, the controller 75, at step 356, decreases the speed of the motor by a third value (e.g., about 3 Hz per minute), and at step 347, sets a warning message "TPM Internal Temp" for display, and then continues to step 348. If not, the controller 75 proceeds to step 348. At step 348, the controller 75 determines if the speed has been reduced (i.e., if the controller 75 performed steps 346, 352, or 356). If so, the controller 75, at step 358, determines if the power module temperature is less than a fifth value (e.g., about 100 degrees Celsius). If the power module temperature is less than the fifth value, then the controller 75 increases the speed of the motor by a fourth value (e.g., about 1.5 Hz per minute) until the motor's original speed is reached (step 360) and the warning message "TPM Internal Temp" is cleared (step 362). If the power module temperature is greater than the fifth value, the controller 75, at step 347, sets a warning message "TPM Internal Temp" for display, and then reverts back to step 358. In some embodiments, the power module being monitored can be the drive 10 itself or various components of the drive 10 (e.g., a heat sink of the controller 75, the motor 11, or the pump 12).

Figure 31:
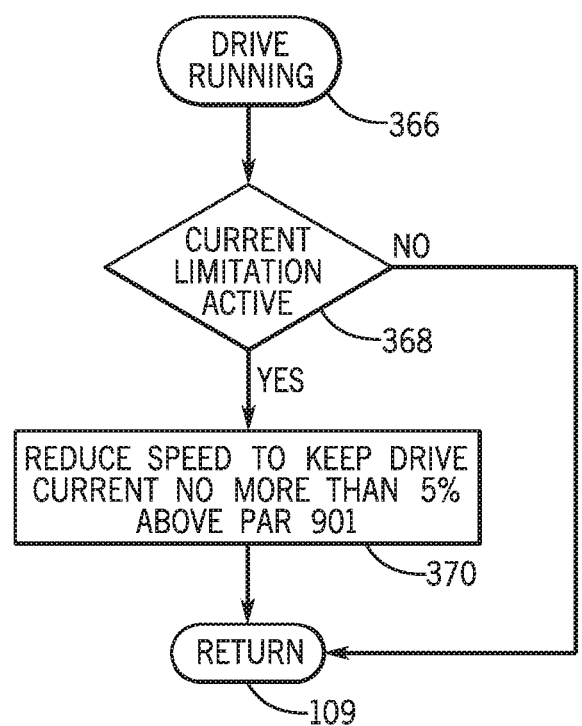
FIG. 31 is a flow chart illustrating an overcurrent prevention operation.

FIG. 31 illustrates an overcurrent prevention operation of the controller 75. When the drive 10 is running (step 366), the controller 75 determines, at step 368, if the drive current limitation is active to limit the current (e.g., because it is above the reference service factor amps parameter 298 in FIG. 23). If so, the controller 75 reduces the speed to keep the drive current to no more than a predetermined value (e.g., about 5 percent) above parameter 901 (step 370). The controller 75 then enters "RETURN" 109.

Figure 32:
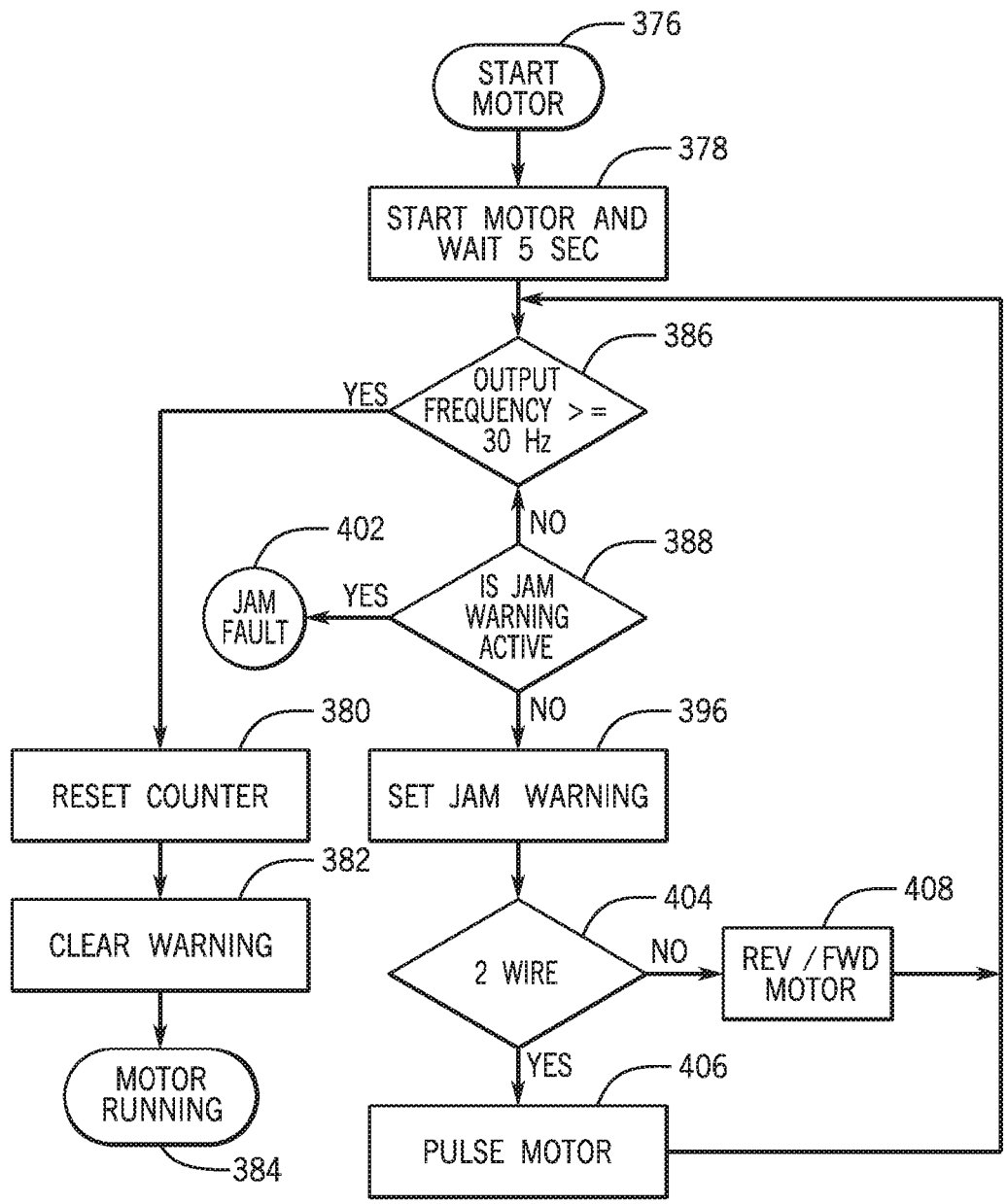
FIG. 32 is a flow chart illustrating a jam prevention operation.

FIG. 32 illustrates a jam prevention operation of the controller 75. When the motor is triggered to start (step 376), the controller 75, at step 378, starts the motor and waits a predetermined amount of time (e.g., about 5 seconds). The controller 75 proceeds to step 386 to check if the output frequency is greater than or near a predetermined frequency (e.g., about 30 Hz). If the controller 75 detects that the output frequency is greater than or near the predetermined frequency at step 386, a counter is reset (step 380), any warning messages are cleared (step 382), and the motor is operating (step 384). If the controller 75 detects that the output frequency is not greater than or near the predetermined frequency at step 386, the controller 75 then determines if the jam warning is active (step 388). If the jam warning is active, the controller 75 executes a jam fault operation (step 402). If the jam warning is not active, the controller 75 sets a jam warning (step 396) and determines if it is controlling a two-wire motor (step 404). If yes, the controller 75 pulses the motor (e.g., about three times) at step 406, then proceeds back to step 386. If the motor is not a two-wire (e.g., if the motor is a three-wire motor), the controller 75 executes one or more forward-reverse cycles (step 408), then proceeds back to step 386.

Figure 33:
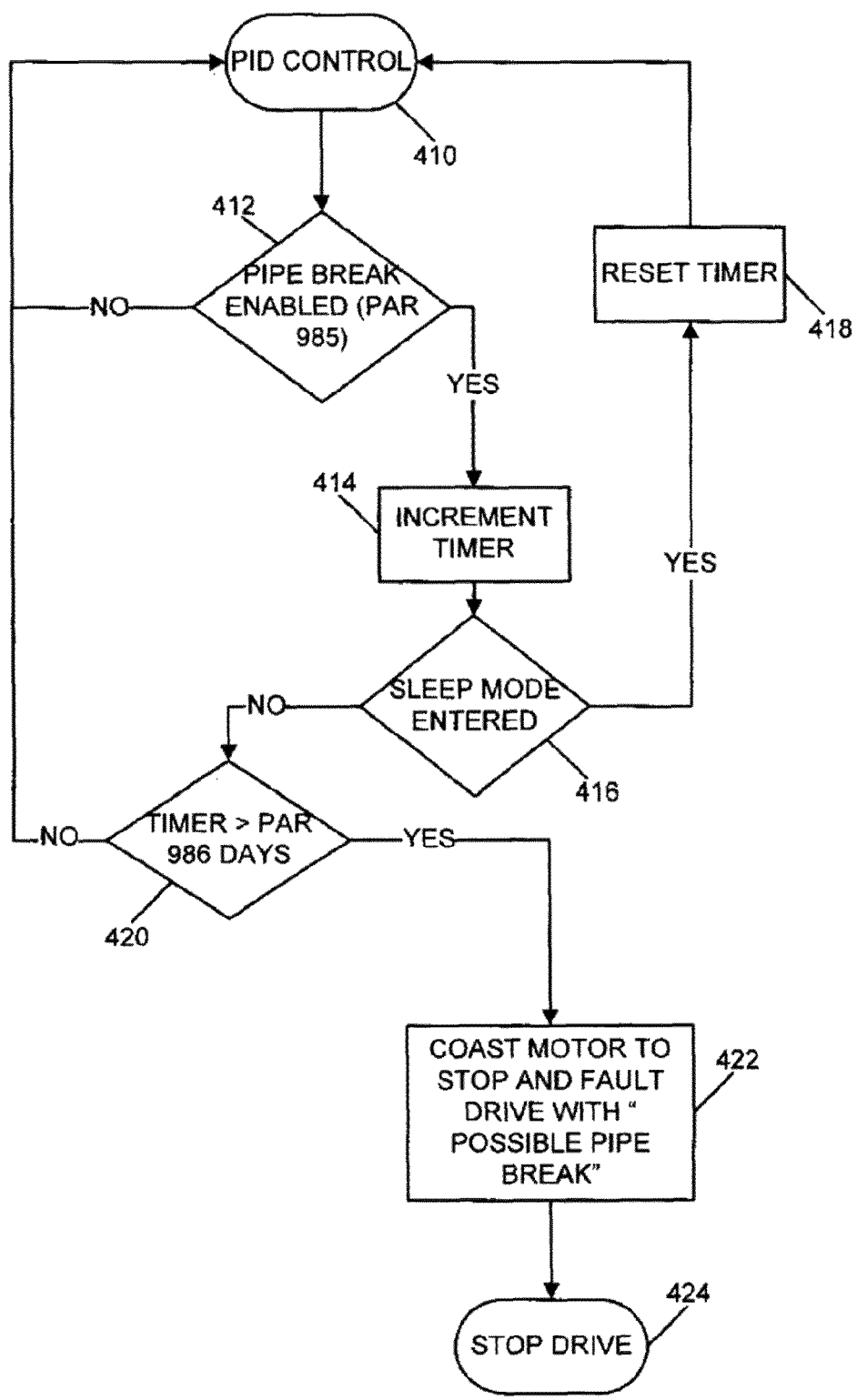
FIG. 33 is a flow chart illustrating a pipe break prevention operation.

FIG. 33 illustrates a line or pipe break fault operation of the controller 75. During PID control (step 410), the controller 75 determines if a pipe break parameter (e.g., pipe break detection parameter 314 from FIG. 25) is enabled (step 412). The controller 75 continues back to step 410 until the parameter is enabled. If the controller 75 determines that the parameter is enabled at step 412, a timer is incremented (step 414), and the controller 75 determines if the pump is in sleep mode (step 416). If the pump is in sleep mode, the timer is reset (step 418) and the controller 75 reverts back to step 410. If the pump is not in sleep mode, the controller 75, at step 420, determines if the timer has been incremented above a certain number of days (e.g., as set by the number of days without sleep parameter 316). If the timer has not exceeded the set number of days, then the controller 75 proceeds back to step 410. If the timer has exceeded the set number of days, the motor is coasted to a stop and a "possible pipe break" fault message is displayed (step 422), causing the drive 10 to be stopped (step 424).

Figure 34:
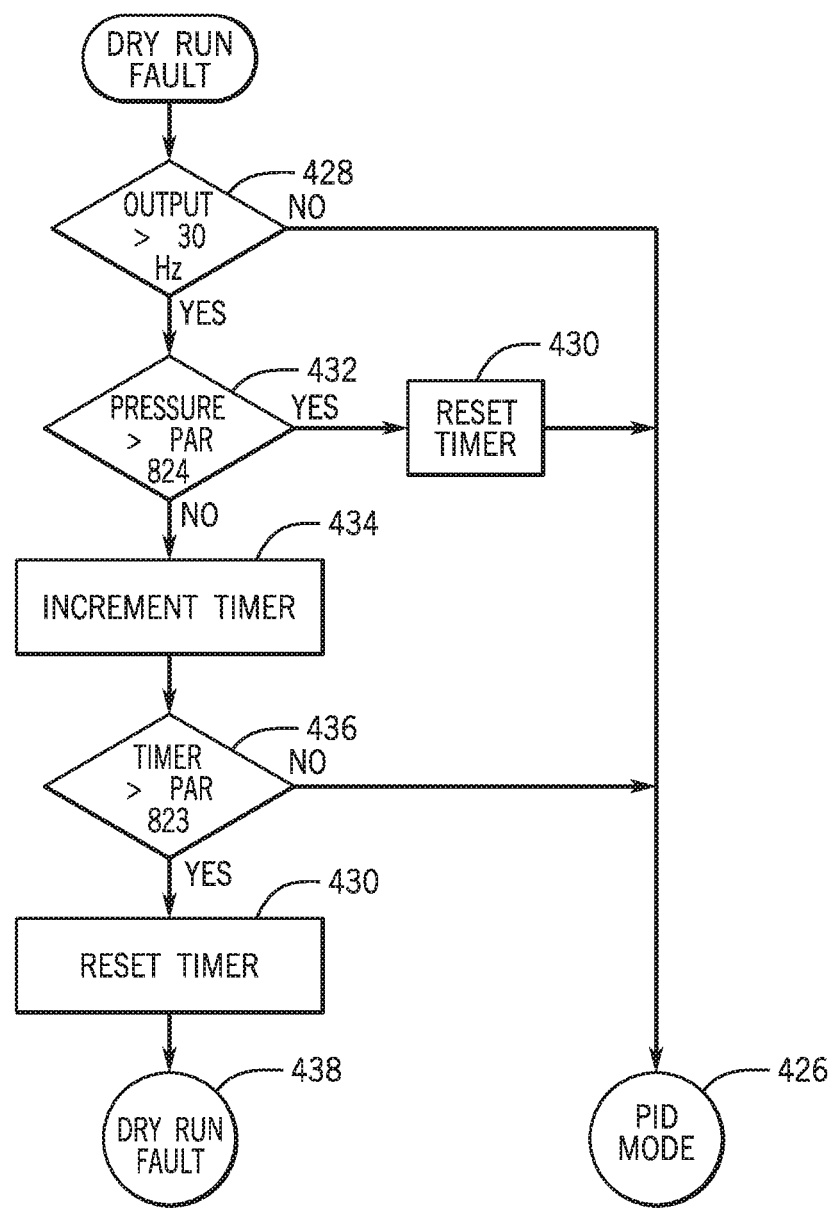
FIG. 34 is a flow chart illustrating a dry run detection operation.

FIG. 34 illustrates a dry run detection operation of the controller 75. During PID control (step 426), the controller 75 determines, at step 428, if the frequency output to the motor is greater than a frequency preset value (e.g., about 30 Hz). If not, the controller 75 reverts back to step 426. If so, the controller 75 then determines, at step 432, if the pressure is greater than a pressure preset value (e.g., about 10 PSI). If so, the timer is reset (step 430) and the controller 75 reverts back to step 426. If the pressure is under 10 PSI, the timer is incremented (step 434) and the controller 75 determines if the timer has reached a timer preset value (e.g., about 15 seconds) at step 436. If not, the controller 75 reverts back to step 426. However, if the timer has reached 15 seconds, the controller 75 resets the timer (step 430) and then executes a dry run fault operation (step 438). The preset value in step 428 can be checked to ensure the motor 11 is operating at a normal operating frequency (e.g., above 30 Hz).

Figure 35:
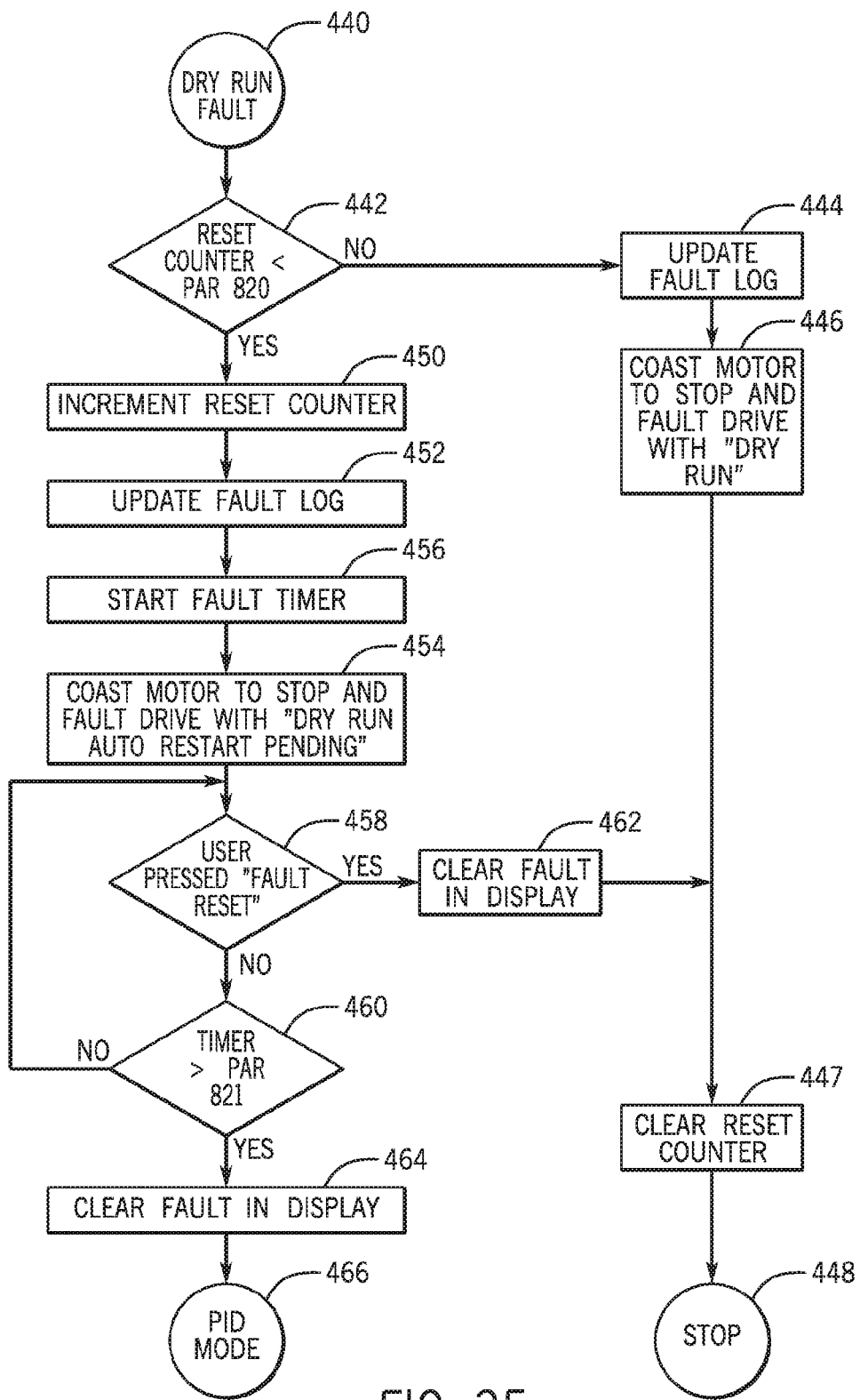
FIG. 35 is a flow chart illustrating a dry run fault operation.

FIG. 35 illustrates a dry run fault operation of the controller 75. The controller 75 can proceed to step 440 if step 438 of FIG. 34 was reached. From step 440, the controller 75 can check if a reset counter value is less than a set value (e.g., the value set under the number of resets parameter 320 of FIG. 26) at step 442. If the reset counter is not less than the set value, the controller 75 can update a fault log (step 444), coast the motor to a stop and display a "Dry Run" fault message (step 446), clear reset counter (step 447), and stop the drive 10 (step 448). If, at step 442, the reset counter is less than the set value, the reset counter is incremented (step 450) and the fault log is updated (step 452). The controller 75 can then start a fault timer (step 456), then coast the motor to a stop and display a "Dry Run—Auto Restart Pending" fault message (step 454), and check if the user has pressed the fault reset button 64 (step 458). If the fault reset button 64 has not been pressed, the controller 75 can determine if a timer has exceeded a time value (step 460). The time value can be the auto reset delay parameter 318 (shown in FIG. 26) set by the user. If the user presses the fault reset button 64, the controller 75 will proceed from step 458 to step 462 and clear the fault message displayed, clear reset counter (step 447), and then stop the drive 10 (step 448). If the timer exceeds the time value, the controller 75 will proceed from step 460 to step 464 and clear the fault message displayed, then restart the drive 10 in PID mode (step 466). If the timer has not exceeded the time value, the controller 75 will revert back to step 458.

Figure 36:
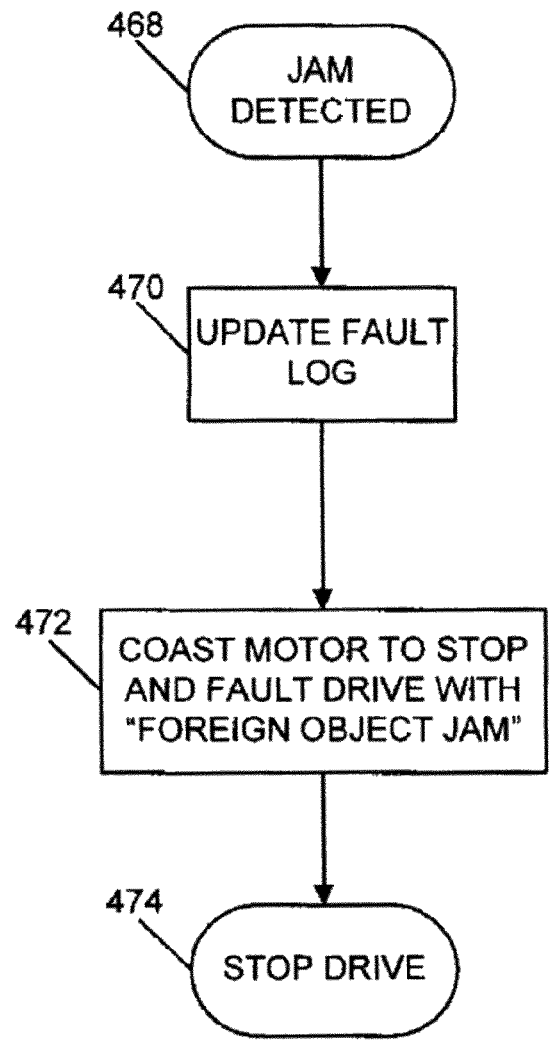
FIG. 36 is a flow chart illustrating a jam fault operation.

FIG. 36 illustrates a jam fault operation of the controller 75. When a jam has been detected (step 468), the fault log is updated (step 470). After step 470, the motor is coasted to a stop and a "Foreign Object Jam" fault message is displayed (step 472), then the drive 10 is stopped (step 474).

Figure 37:
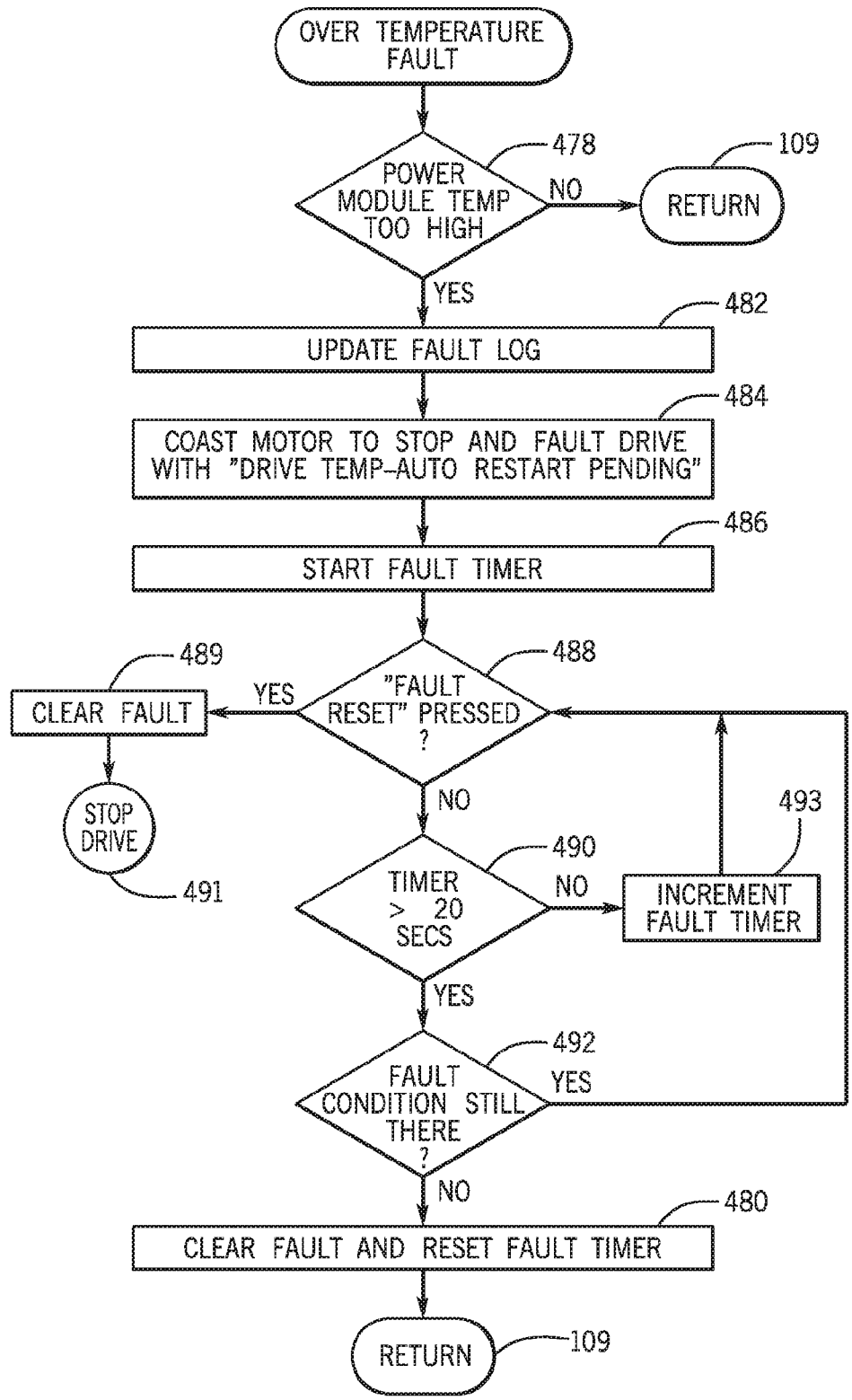
FIG. 37 is a flow chart illustrating an overtemperature fault operation.

FIG. 37 illustrates an overtemperature fault operation of the controller 75. When the drive 10 is powered, the controller 75 determines if the power module temperature is too high (step 478), for example, using the overheat prevention operation in FIG. 30. If the power module temperature is not too high, the controller 75 then enters "RETURN" 109. If the power module temperature is too high, the fault log is updated (step 482), the motor is coasted to a stop and a "Drive Temp—Auto Restart Pending" fault message is displayed (step 484), and a fault timer is started (step 486). The controller 75 then determines if the user has pressed the fault reset button 64 (step 488). If the user has pressed the fault reset button 64, the controller 75 proceeds from step 488 to step 489 to clear the fault, and then stop the drive 10, at 491. If the user has not pressed the fault reset button 64, the controller 75 determines if the fault timer has exceeded a predetermined value (e.g., about 20 seconds) at step 490. If the fault timer has not exceeded the predetermined value, the fault timer is incremented at step 493 and the process reverts back to step 488. If the fault timer has exceeded the predetermined value, the controller 75 checks if the fault condition is still present (step 492). If the fault condition is still present, the controller 75 reverts back to step 488. If the fault condition is not present, the controller 75 clears the fault and resets the fault timer (step 480) and the controller 75 then enters "RETURN" 109.

Figure 38:
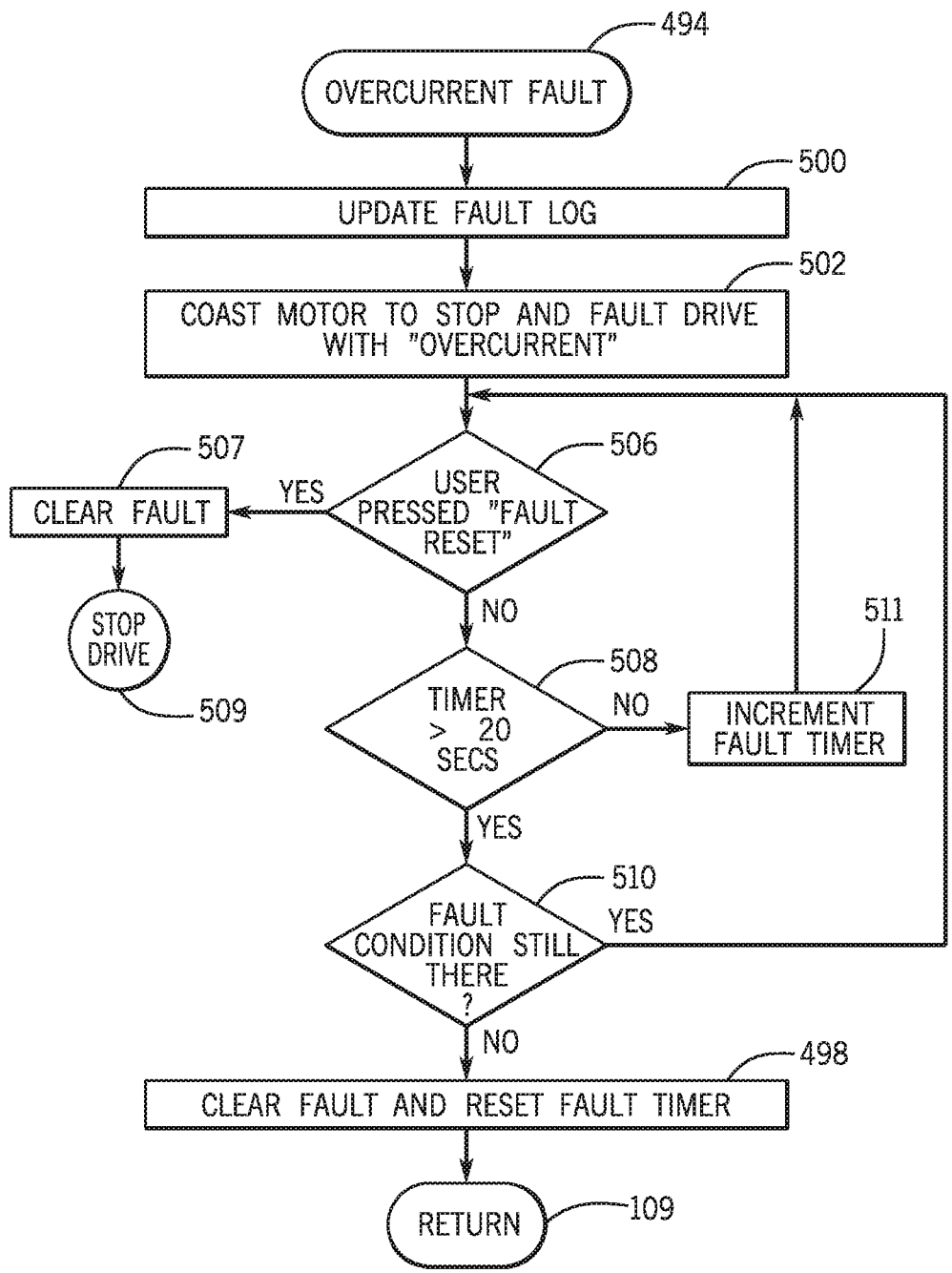
FIG. 38 is a flow chart illustrating an overcurrent fault operation.

The motor 11 and pump 12 combination can satisfy typical performance requirements as specified by the pump manufacturer while maintaining current under service factor amps as specified for the motor 11. Performance can match that of a typical capacitor start/capacitor run control box for each motor HP offering. If the motor 11 performs outside of such specifications, the controller 75 can generate a fault and stop the motor 11. For example, FIG. 38 illustrates an overcurrent fault operation of the controller 75. When an overcurrent fault occurs (step 494), the fault log is updated (step 500), the motor is coasted to a stop, and a "Over Current" fault message is displayed (step 502). The controller 75 then determines if the user has pressed the fault reset button 64 (step 506). If the user has pressed the fault reset button 64, the controller 75 proceeds from step 506 to step 507 to clear the fault, and then stop the drive 10, at 509. If the user has not pressed the fault reset button 64, the controller 75 determines if the fault timer has exceeded a predetermined value (e.g., about 20 seconds) at step 508. If the fault timer has not exceeded the predetermined value, the fault timer is incremented at step 511 and the process reverts back to step 506. If the fault timer has exceeded the predetermined value, the controller 75 checks if the fault condition is still present (step 510). If the fault condition is still present, the controller 75 reverts back to step 506. If the fault condition is not present, the controller 75 clears the fault and resets the fault timer (step 498) and the controller 75 then enters "RETURN" 109.

Figure 39:
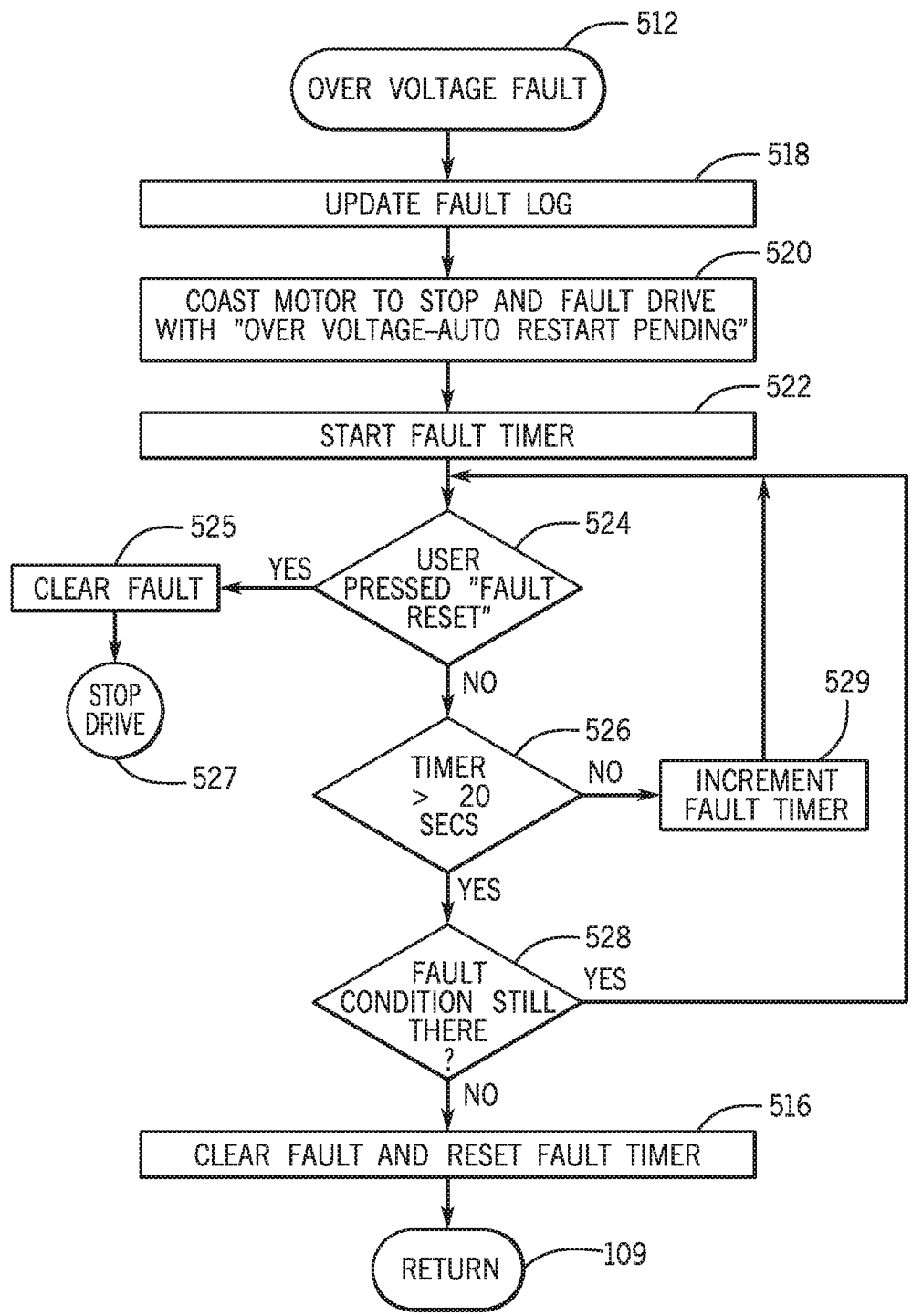
FIG. 39 is a flow chart illustrating an overvoltage fault operation.

FIG. 39 illustrates an overvoltage fault operation of the controller 75. When an overvoltage fault occurs (step 512), the fault log is updated (step 518), the motor is coasted to a stop and an "Over Voltage—Auto Restart Pending" fault message is displayed (step 520), and a fault timer is started (step 522). The controller 75 then determines if the user has pressed the fault reset button 64 (step 524). If the user has pressed the fault reset button 64, the controller 75 proceeds from step 524 to step 525 to clear the fault, and then stop the drive 10, at 527. If the user has not pressed the fault reset button 64, the controller 75 determines if the fault timer has exceeded a predetermined value (e.g., about 20 seconds) at step 526. If the fault timer has not exceeded the predetermined value, the fault timer is incremented at step 529 and the process reverts back to step 524. If the fault timer has exceeded the predetermined value, the controller 75 checks if the fault condition is still present (step 528). If the fault condition is still present, the controller 75 reverts back to step 524. If the fault condition is not present, the controller 75 clears the fault and resets the fault timer (step 516) and the controller 75 then enters "RETURN" 109.

Figure 40:
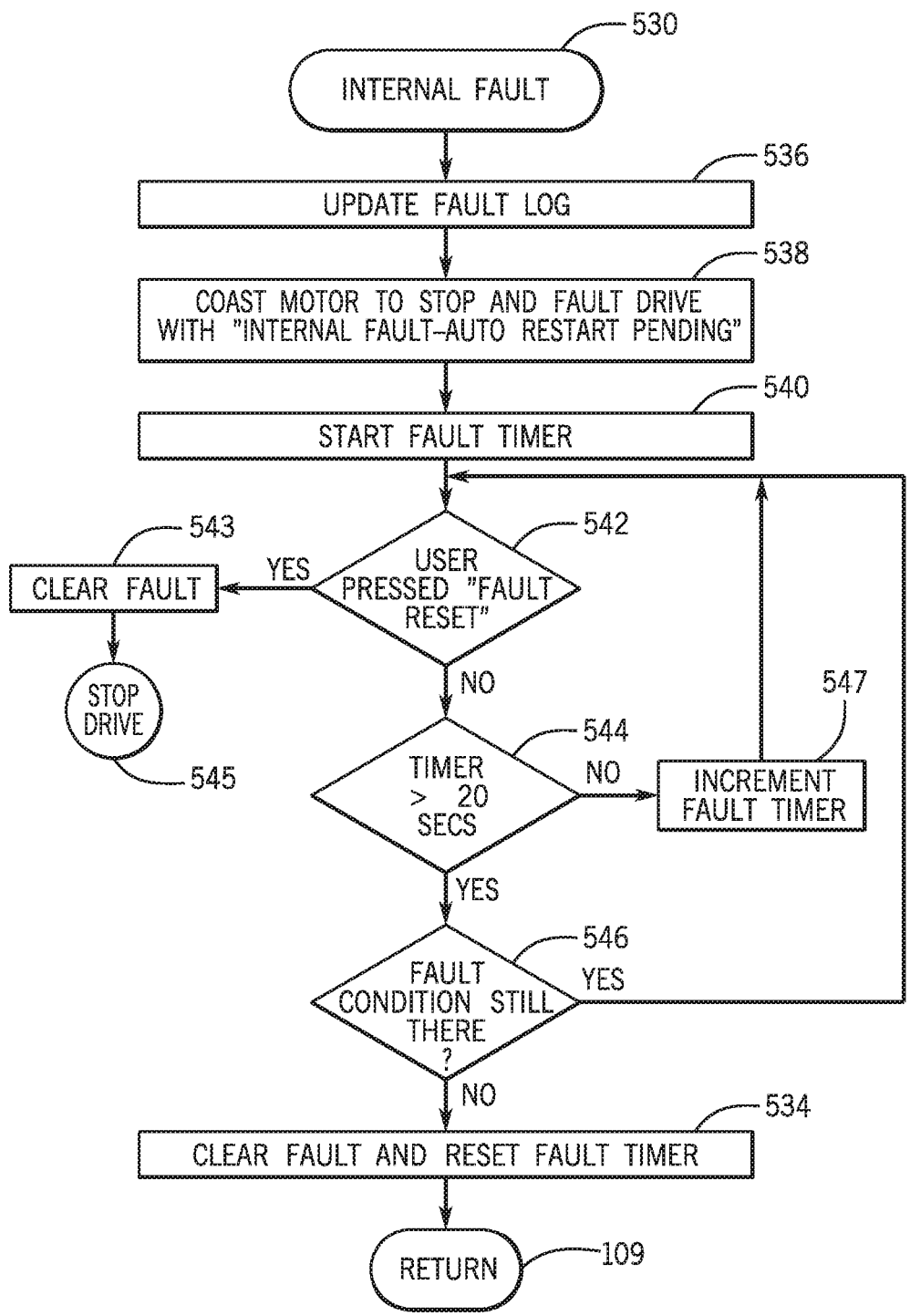
FIG. 40 is a flow chart illustrating an internal fault operation.

FIG. 40 illustrates an internal fault operation of the controller 75. When an internal fault occurs (step 530), the fault log is updated (step 536), the motor is coasted to a stop and an "Internal Fault—Auto Restart Pending" fault message is displayed (step 538), and a fault timer is started (step 540). The controller 75 then determines if the user has pressed the fault reset button 64 (step 542). If the user has pressed the fault reset button 64, the controller 75 proceeds from step 542 to step 543 to clear the fault, and then stop the drive 10, at 545. If the user has not pressed the fault reset button 64, the controller 75 determines if the fault timer has exceeded a predetermined value (e.g., about 20 seconds) at step 544. If the fault timer has not exceeded the predetermined value, the fault timer is incremented at step 547 and the process reverts back to step 542. If the fault timer has exceeded the predetermined value, the controller 75 checks if the fault condition is still present (step 546). If the fault condition is still present, the controller 75 reverts back to step 542. If the fault condition is not present, the controller 75 clears the fault and resets the fault timer (step 534) and the controller 75 then enters "RETURN" 109.

Figure 41:
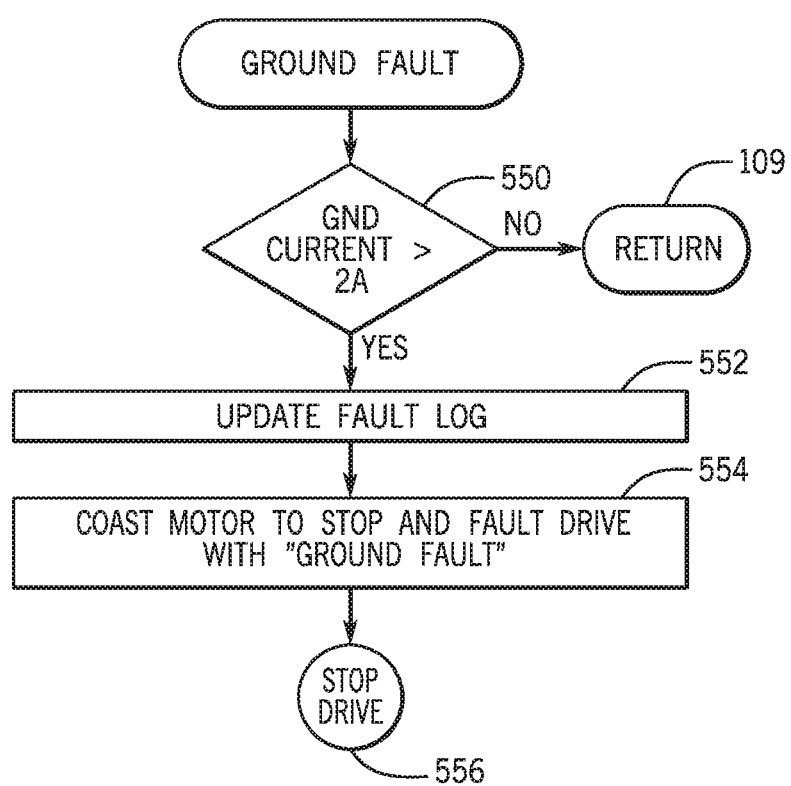
FIG. 41 is a flow chart illustrating a ground fault operation.

FIG. 41 illustrates a ground fault operation of the controller 75. The controller 75 determines if a ground current is greater than a predetermined value (e.g., 2 amps) by measuring if there is current flow between an earth, or ground, lead and any motor lead (step 550). If not, the controller 75 then enters "RETURN" 109. If so, the fault log is updated (step 552), the motor is coasted to a stop and a "Ground Fault" fault message is displayed (step 554), and the drive 10 is stopped (step 556).

Figure 42:
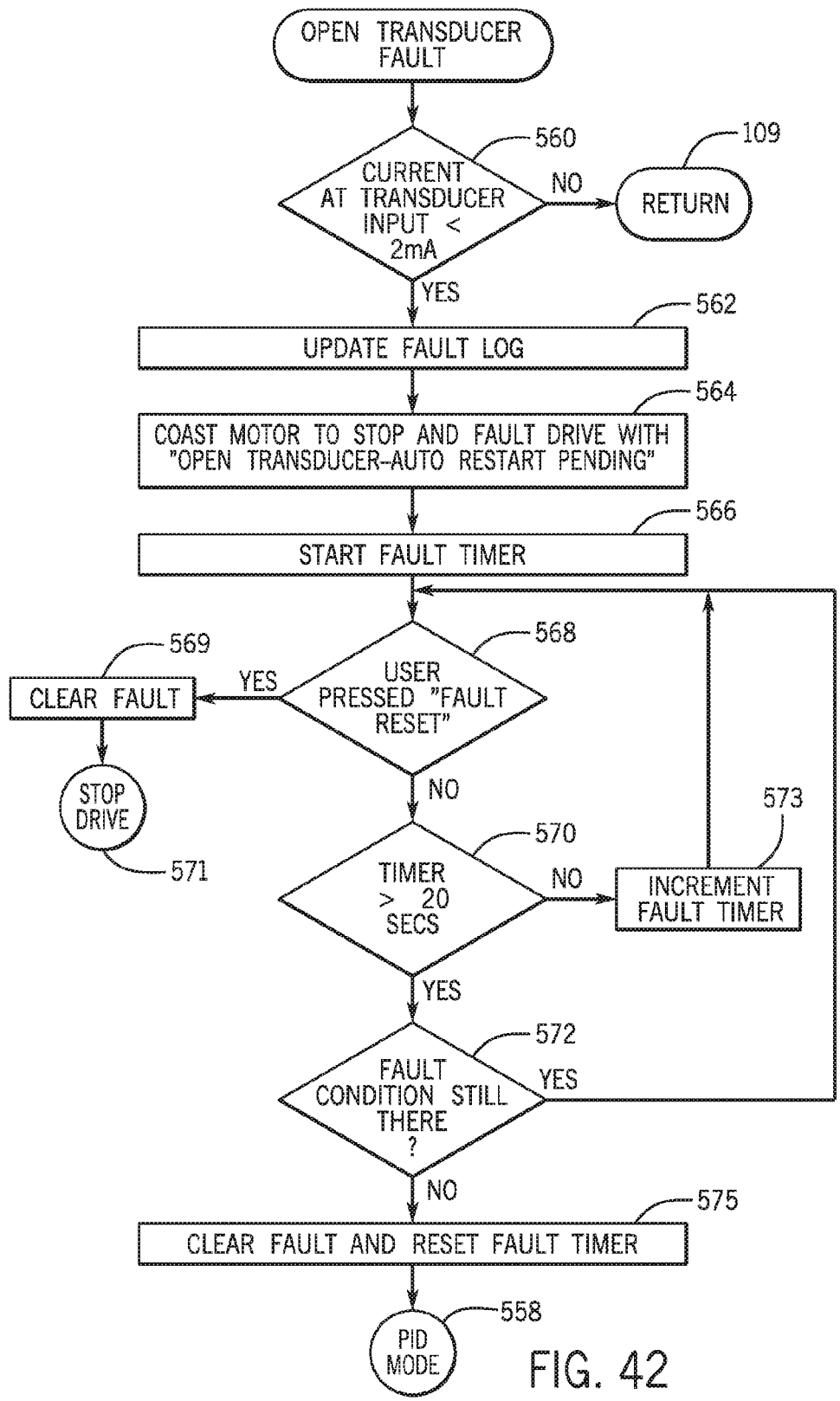
FIG. 42 is a flow chart illustrating an open transducer fault operation.

FIG. 42 illustrates an open transducer fault operation of the controller 75. In some embodiments, the open transducer fault operation is only active if auto start 62 has been pressed. The controller 75 determines if a current measured at the transducer input is less than a value, such as 2 milliamps (step 560). If the current is not less than the value, the controller 75 then enters "RETURN" 109. If the current is less than the value, the fault log is updated (step 562), the motor is coasted to a stop and an "Open Transducer—Auto Restart Pending" fault message is displayed (step 564), and a fault timer is started (step 566). The controller 75 then determines if the user has pressed the fault reset button 64 (step 568). If the user has pressed the fault reset button 64, the controller 75 proceeds from step 568 to step 569 to clear the fault, and then stop the drive 10, at 571. If the user has not pressed the fault reset button 64, the controller 75 determines if the fault timer has exceeded a predetermined value (e.g., about 20 seconds) at step 570. If the fault timer has not exceeded the predetermined value, the fault timer is incremented at step 573 and the process reverts back to step 568. If the fault timer has exceeded the predetermined value, the controller 75 checks if the fault condition is still present (step 572). If the fault condition is still present, the controller 75 reverts back to step 568. If the fault condition is not present, the controller 75 clears the fault and resets the fault timer (step 575) and the controller 75 then restarts the drive 10 in PID mode (step 558).

Figure 43:
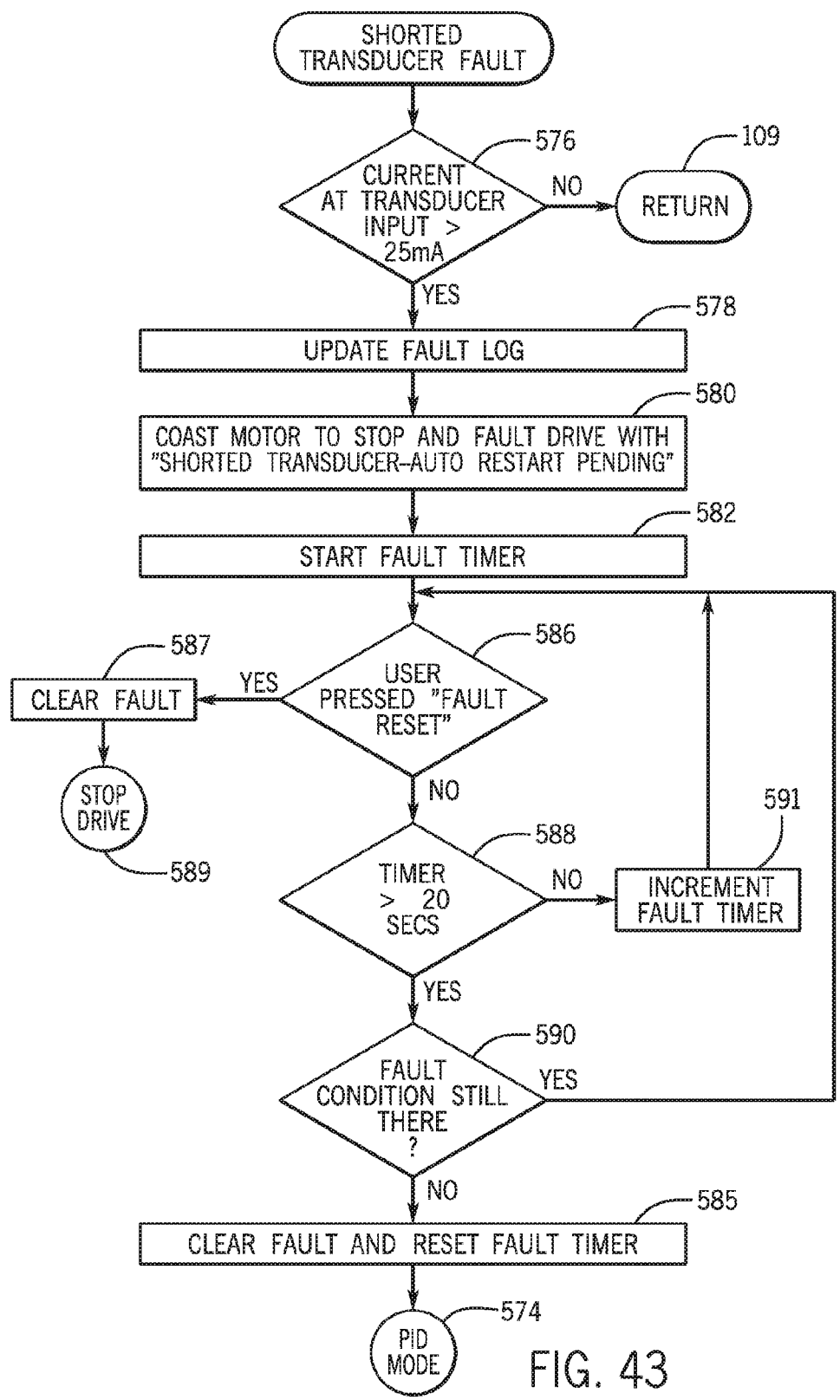
FIG. 43 is a flow chart illustrating a shorted transducer fault operation.

FIG. 43 illustrates a shorted transducer fault operation of the controller 75. In some embodiments, the shorted transducer fault operation is only active if auto start 62 has been pressed. The controller 75 determines if a current measured at the transducer input is greater than a value, such as 25 milliamps (step 576). If the current is not greater than the value, the controller 75 then enters "RETURN" 109. If the current is greater than the value, the fault log is updated (step 578), the motor is coasted to a stop and a "Shorted Transducer—Auto Restart Pending" fault message is displayed (step 580), and a fault timer is started (step 582). The controller 75 then determines if the user has pressed the fault reset button 64 (step 586). If the user has pressed the fault reset button 64, the controller 75 proceeds from step 586 to step 587 to clear the fault, and then stop the drive 10, at 589. If the user has not pressed the fault reset button 64, the controller 75 determines if the fault timer has exceeded a predetermined value (e.g., about 20 seconds) at step 588. If the fault timer has not exceeded the predetermined value, the fault timer is incremented at step 591 and the process reverts back to step 586. If the fault timer has exceeded the predetermined value, the controller 75 checks if the fault condition is still present (step 590). If the fault condition is still present, the controller 75 reverts back to step 586. If the fault condition is not present, the controller 75 clears the fault and resets the fault timer (step 585) and the controller 75 then restarts the drive 10 in PID mode (step 574).

FIGS. 44A-44B illustrate a multiple faults operation of the controller 75. Referring to FIG. 44A, when the drive 10 is powered (step 592), the controller 75 continuously determines if a fault has occurred (step 594). If a fault has a occurred, a counter is incremented (step 596) and the controller 75 determines if the counter has reached a value, such as ten (step 598). If the counter has reached the value, the motor is coasted to a stop and a "Multiple Faults" fault message is displayed (step 600), and the drive 10 is stopped (step 602). The steps of FIG. 44B serve to provide a time frame for which the counter can reach the value. When the drive 10 is powered (step 592), the controller 75 continuously determines if the counter (i.e., the counter in step 596 of FIG. 44A) has been incremented (step 604). If so, a timer is incremented (step 606). The controller 75 continues to increment the timer as long as the counter is above zero until the timer reaches a value, such as thirty minutes (step 608). Once the timer has reached the value, the counter is decremented and the timer is reset (step 610).

Figure 45:
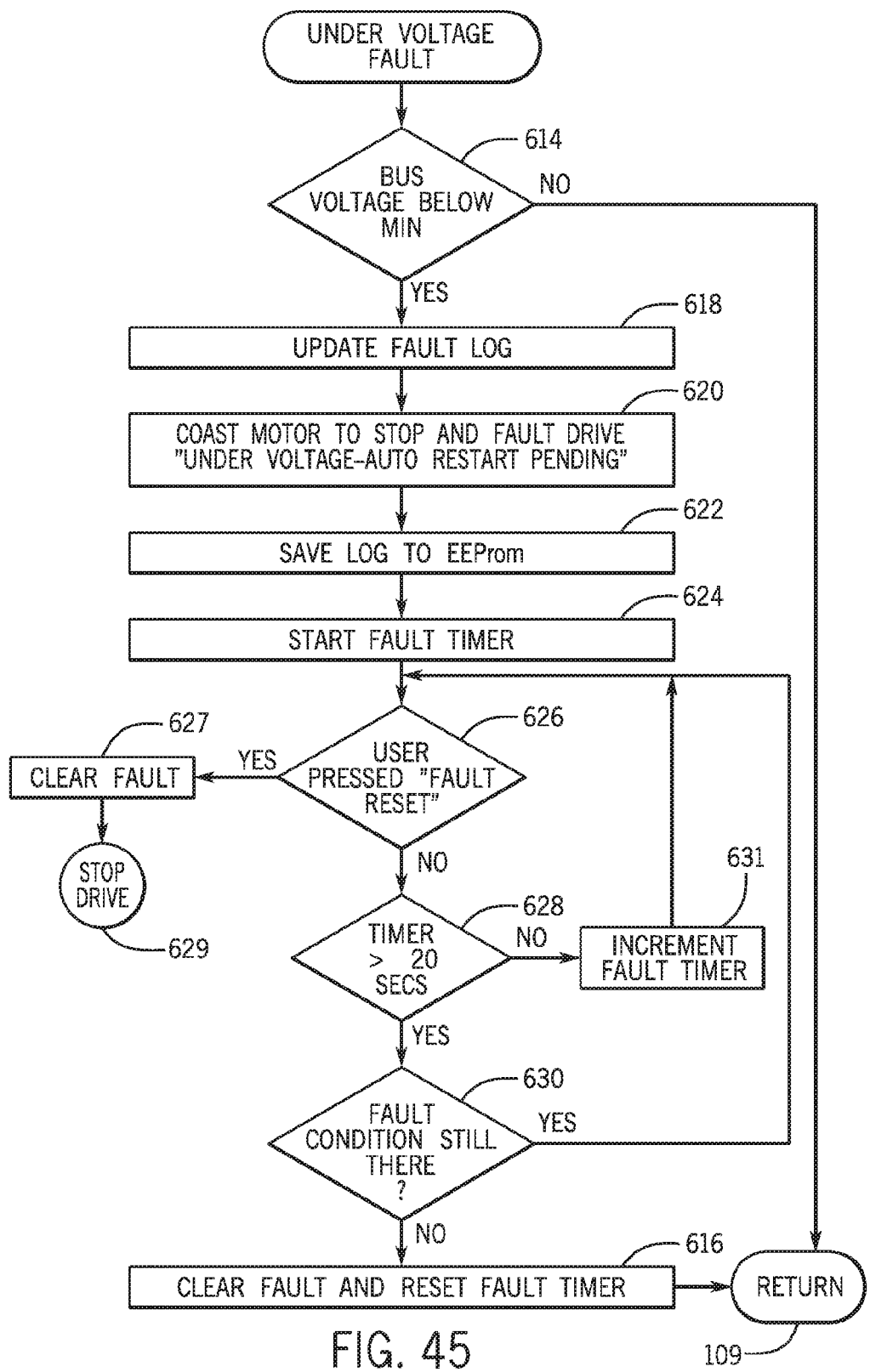
FIG. 45 is a flow chart illustrating an undervoltage fault operation.

FIG. 45 illustrates an undervoltage fault operation of the controller 75. The controller 75 determines if the bus voltage is below a minimum value (step 614). If the bus voltage is not below the minimum value, the controller 75 then enters "RETURN" 109. If the bus voltage is below the minimum value, the fault log is updated (step 618), the motor is coasted to a stop and an "Under Voltage—Auto Restart Pending" fault message is displayed (step 620), the fault log is saved in memory, such as the device's electrically erasable programmable read-only memory, or EEPROM (step 622) and a fault timer is started (step 624). The controller 75 then determines if the user has pressed the fault reset button 64 (step 626). If the user has pressed the fault reset button 64, the controller 75 proceeds from step 626 to step 627 to clear the fault, and then stop the drive 10, at 629. If the user has not pressed the fault reset button 64, the controller 75 determines if the fault timer has exceeded a predetermined value (e.g., about 20 seconds) at step 628. If the fault timer has not exceeded the predetermined value, the fault timer is incremented at step 631 and the process reverts back to step 626. If the fault timer has exceeded the predetermined value, the controller 75 checks if the fault condition is still present (step 630). If the fault condition is still present, the controller 75 reverts back to step 626. If the fault condition is not present, the controller 75 clears the fault and resets the fault timer (step 616) and the controller 75 then enters "RETURN" 109.

Figure 46:
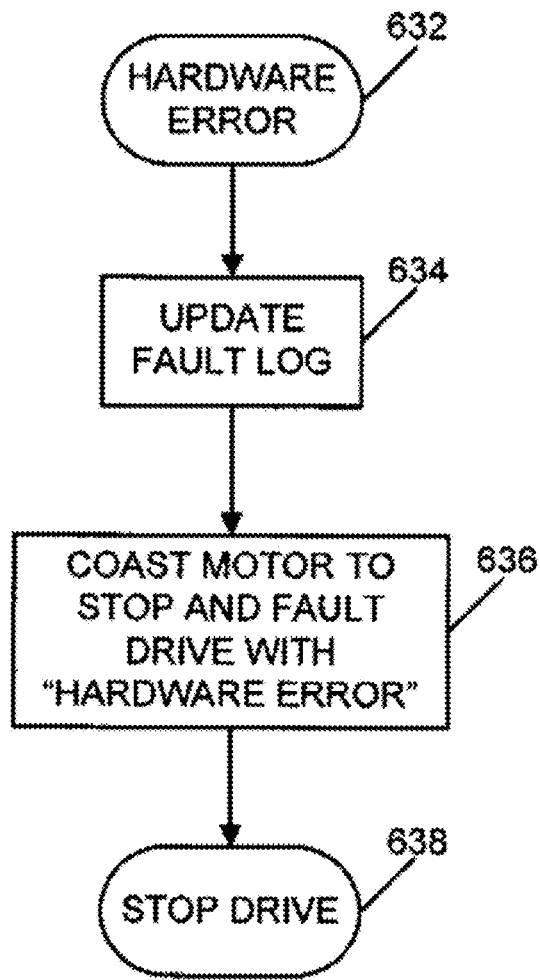
FIG. 46 is a flow chart illustrating a hardware fault operation.

FIG. 46 illustrates a hardware fault operation of the controller 75. When the controller 75 recognizes a hardware error (step 632), the fault log is updated (step 634). After step 634, the motor is coasted to a stop and a "Hardware Error" fault message is displayed (step 636), then the drive 10 is stopped (step 638).

Figure 47:
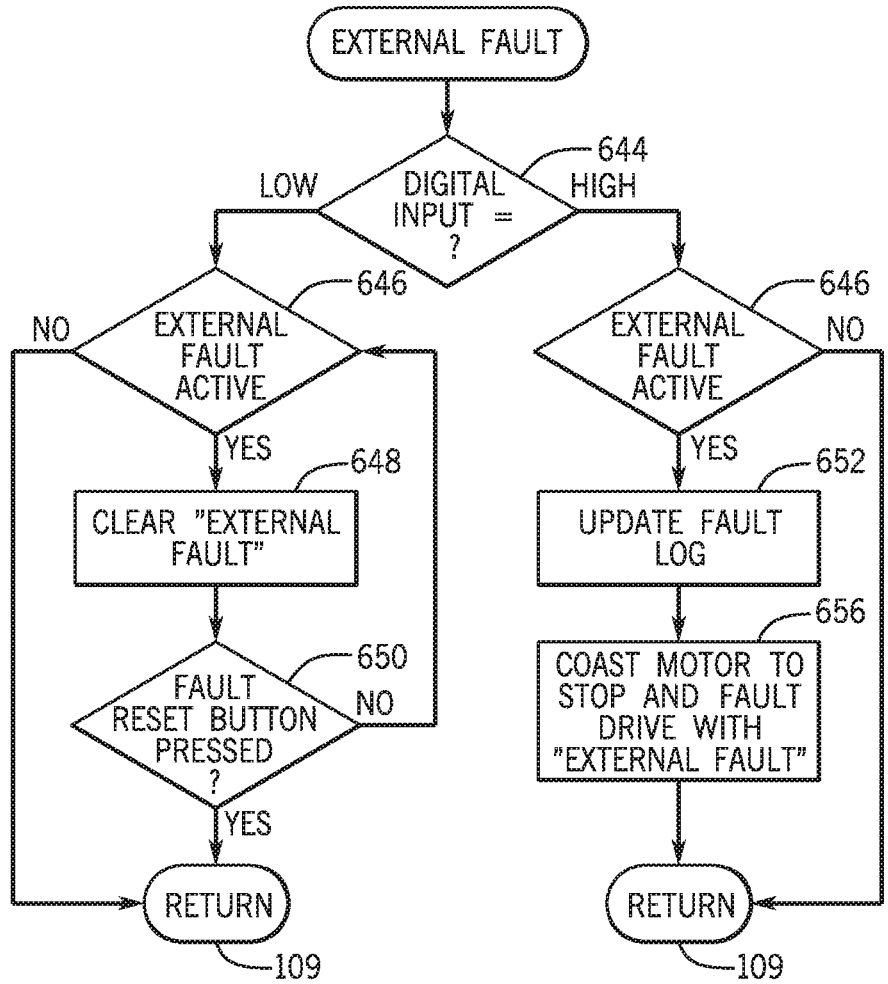
FIG. 47 is a flow chart illustrating an external fault operation.

FIG. 47 illustrates an external fault operation of the controller 75. In some embodiments, the external fault operation is only called if the digital status is changed from high to low or low to high. The controller 75 determines if a digital input is high or low (step 644). If the digital input is not high, the controller 75 determines if the external fault is active (step 646). If the external fault is not active, the controller 75 then enters "RETURN" 109. If the external fault is active, the controller 75 clears an "external fault" fault message (if it is being displayed) at step 648. In some embodiments, the external fault can only be cleared if the fault reset button 64 has been pressed after the fault condition is not present. The controller 75 then determines if the user has pressed the fault reset button 64 (step 650). If the user has pressed the fault reset button 64, the controller 75 proceeds to enter "RETURN" 109. If the user has not pressed the fault reset button 64, the controller 75 reverts back to step 646. If, at step 644, the digital input is high, the controller 75 determines if the external fault is active (step 646). If the external fault is not active, the controller 75 then enters "RETURN" 109. If the external fault is active, the fault log is updated (step 652). Following step 652, the motor is coasted to a stop and a "External Fault" fault message is displayed (step 656), and then the controller 75 proceeds to enter "RETURN" 109.

Figure 48:
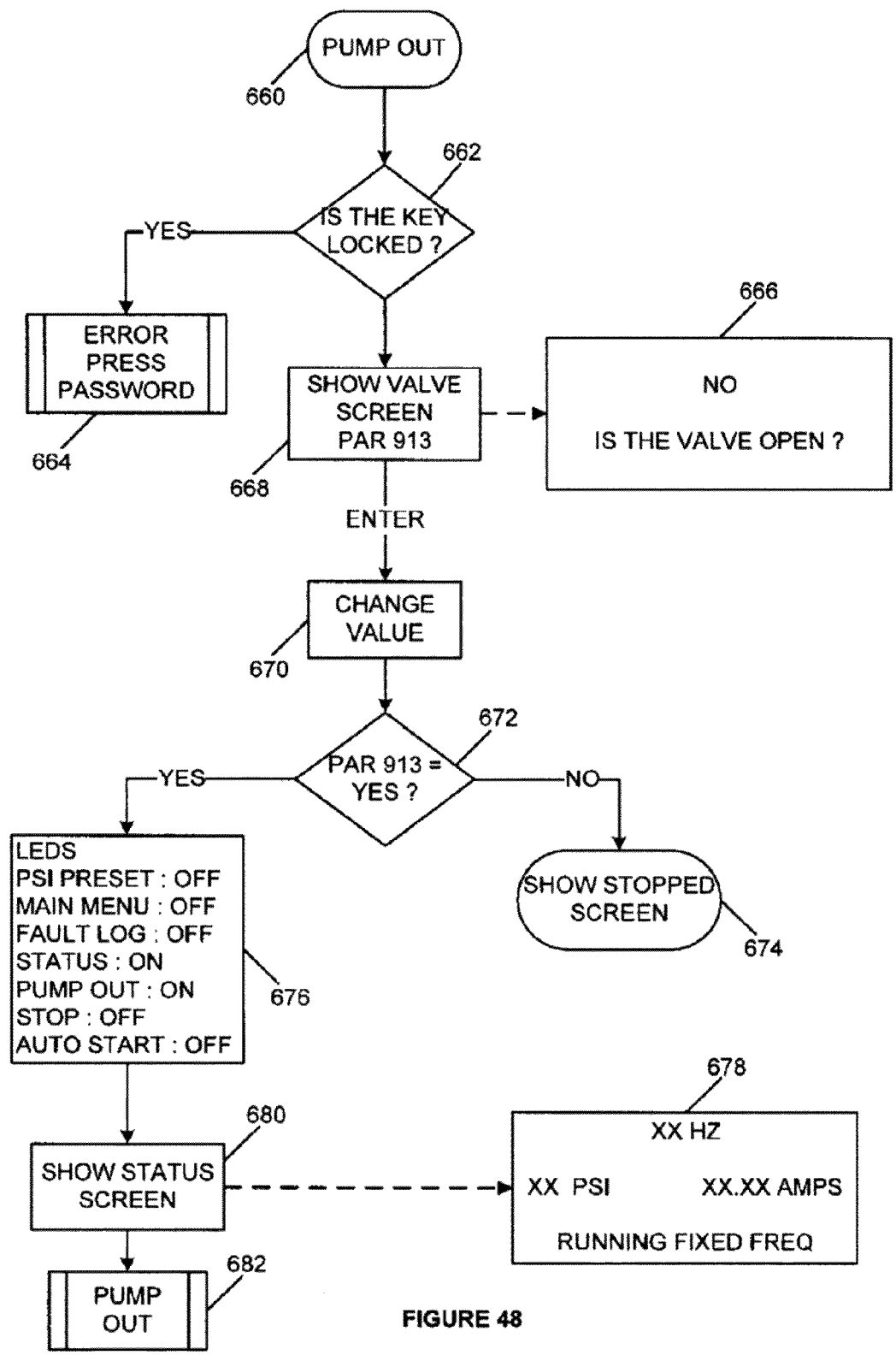
FIG. 48 is a flow chart illustrating a pump out button control operation.

FIGS. 48-63 are flow charts describing control operations for the control pad 14 according to some embodiments of the invention. FIG. 48 illustrates a pump-out button control operation, according to some embodiments. When the pump-out button 40 is pressed (step 660), the controller 75 first determines if the control pad 14 is locked, or in the password protection mode (step 662). If so, the controller 75 executes a keys locked error operation (step 664). If not, a valve screen 666 is displayed (step 668) asking the user if a valve is open. Once the user chooses if the valve is open or not and presses enter, a valve parameter value is changed (step 670). The controller 75 then determines, at step 672, if the valve parameter value is yes (i.e., if the valve is open). If the valve parameter is not yes (i.e., if the user selected that the valve was not open), a stopped screen is displayed (step 674), indicating that the pump 12 is stopped. If the valve parameter is yes, the controller 75 sets LED indicators 66 on or off accordingly (step 676), displays a status screen 678 (step 680), and runs the pump out operation to drive the motor 11 in the pump out mode (step 682). The status screen 678 can include information about the pump 12, such as motor frequency, pressure, and motor current during the pump out mode.

Figure 49:
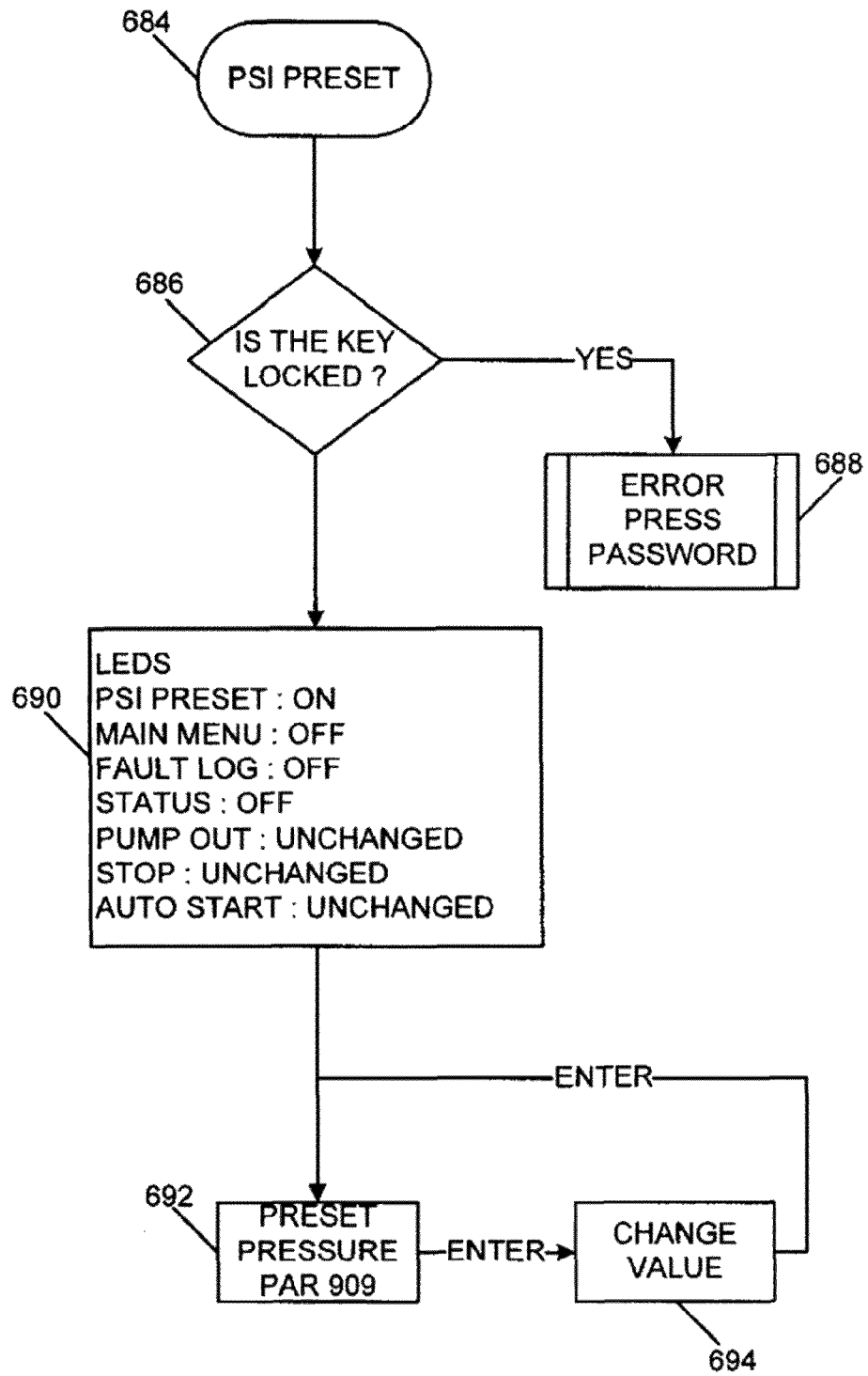
FIG. 49 is a flow chart illustrating a pressure preset button control operation.

FIG. 49 illustrates a pressure preset button control operation, according to some embodiments. When the pressure preset button 42 is pressed (step 684), the controller 75 first determines if the control pad 14 is locked (step 686). If so, the controller 75 executes a keys locked error operation (step 688). If the control pad 14 is not locked, the controller 75 sets the LED indicators 66 on or off accordingly (step 690) and a preset pressure parameter is displayed (step 692). The user can adjust the displayed pressure parameter using the keypad and hit enter to change the value of the preset pressure parameter, changing the pressure set point for the controller 75 (step 694).

Figure 50:
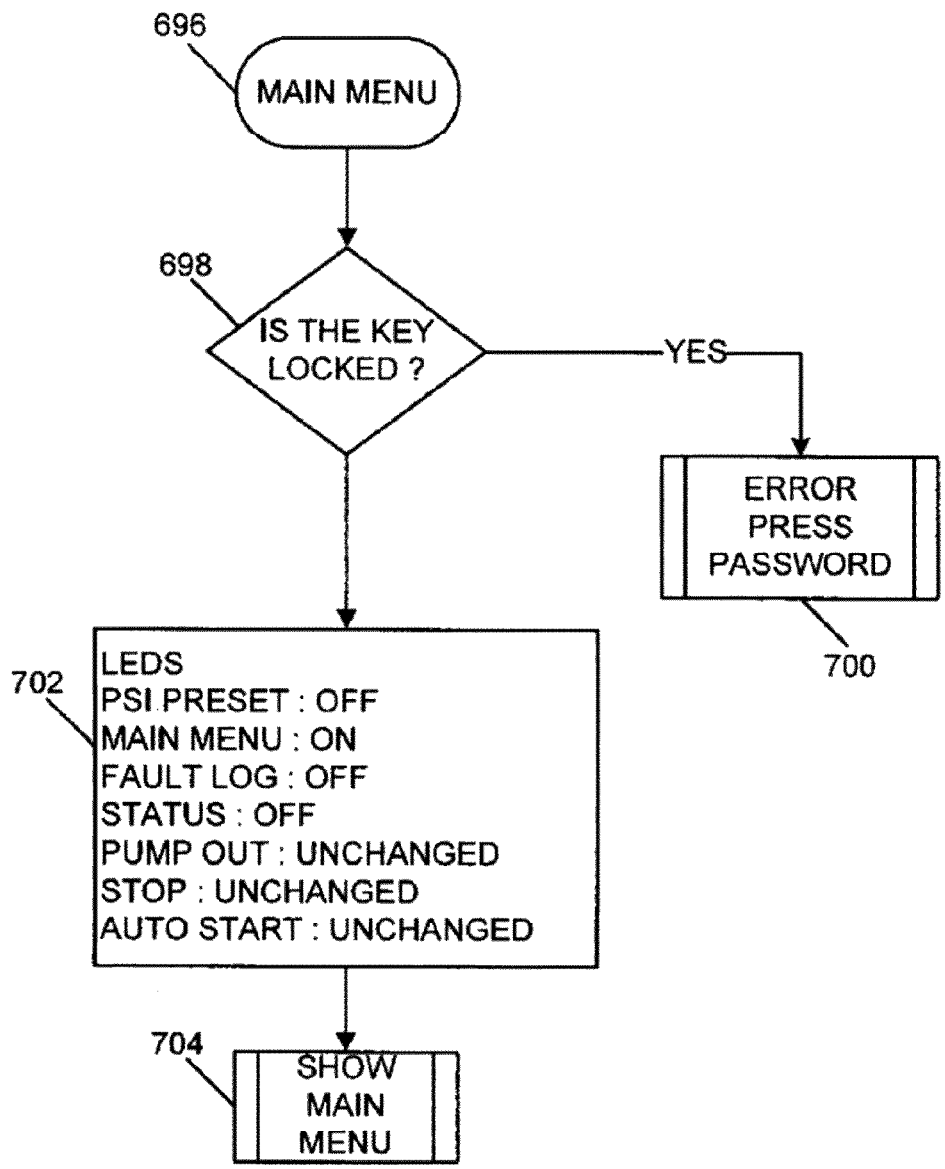
FIG. 50 is a flow chart illustrating a main menu button control operation.

FIG. 50 illustrates a main menu button control operation, according to some embodiments. When the main menu button 44 is pressed (step 696), the controller 75 first determines if the control pad 14 is locked (step 698). If so, the controller 75 executes a keys locked error operation (step 700). If the control pad 14 is not locked, the controller 75 sets the LED indicators 66 on or off accordingly (step 702) and the main menu, as described with respect to FIG. 16, is displayed (step 704).

FIG. 51 illustrates a fault log button control operation, according to some embodiments. When the fault log button 46 is pressed (step 706), the controller 75 sets the LED indicators 66 on or off accordingly (step 708) and the fault log is displayed, detailing fault history information to the user (step 710).

Figure 52:
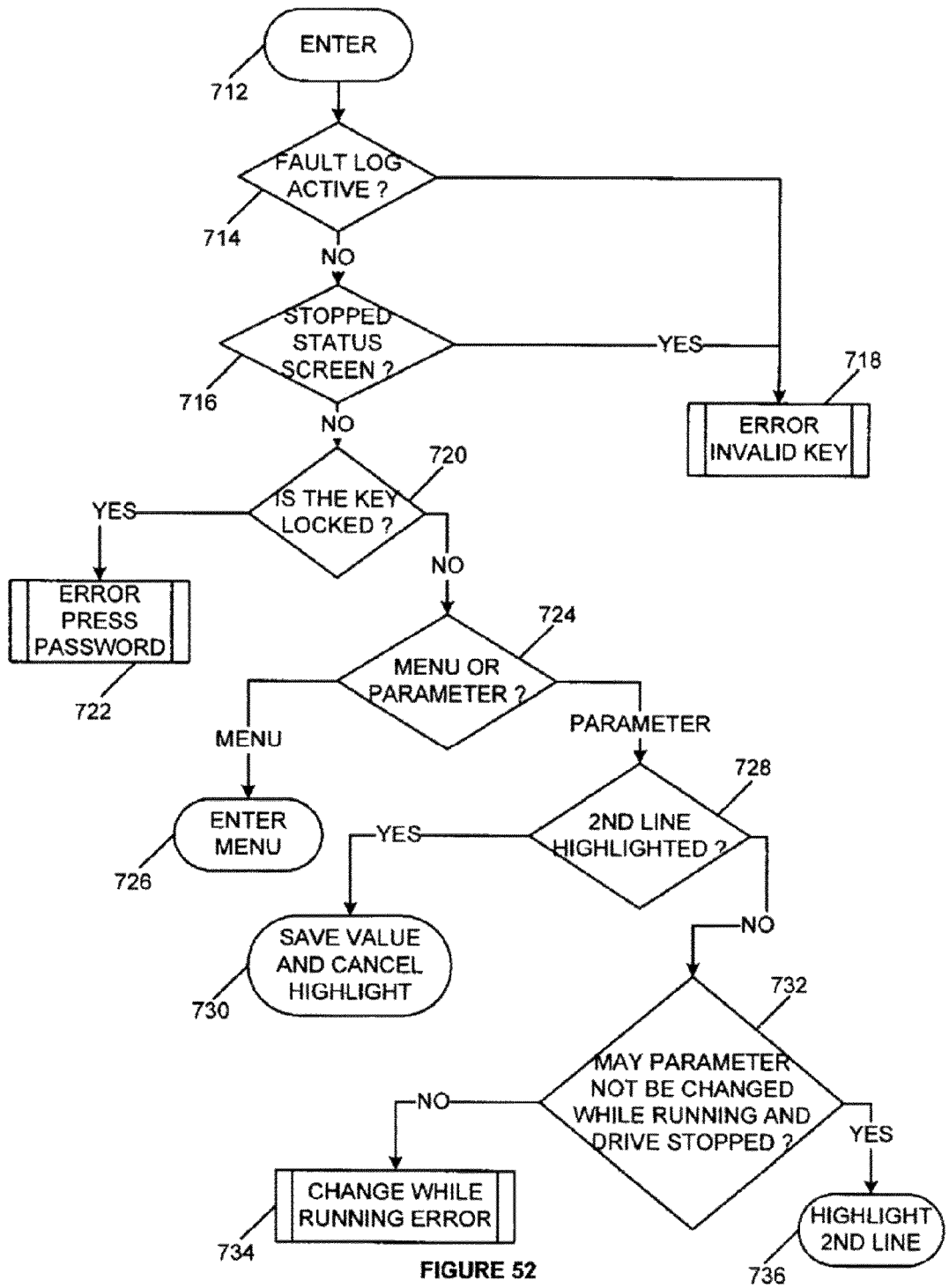
FIG. 52 is a flow chart illustrating an enter button control operation.

FIG. 52 illustrates an enter button control operation, according to some embodiments. When the enter button 56 is pressed (step 712), the controller 75 first determines if the fault log is active (e.g., being displayed) at step 714 or if the stopped status screen is being displayed (step 716). If either step 714 or step 716 is true, the controller 75 executes an invalid key error operation (step 718). If neither the fault log or stopped status screen are being displayed, the controller 75 determines if the control pad 14 is locked (step 720). If so, the controller 75 executes a keys locked error operation (step 722). If the control pad 14 is not locked, the controller 75 determines if the display currently selecting a menu option or a parameter (step 724). If the display is currently selecting a menu option, the controller 75 will enter the selected menu (step 726). If the display is currently selecting a parameter option, the controller 75 determines if the parameter is highlighted (step 728). If the parameter is highlighted, the controller 75 saves the value of the selected parameter and cancels the highlighting of the parameter (step 730). If, at step 728, the parameter is not highlighted, the controller 75 determines if the parameter can be changed with the motor is running and the drive 10 is stopped (step 732). If not, a running error operation is executed (step 734). If the parameter may be changed, then the selected parameter is highlighted (step 736).

Figure 53:
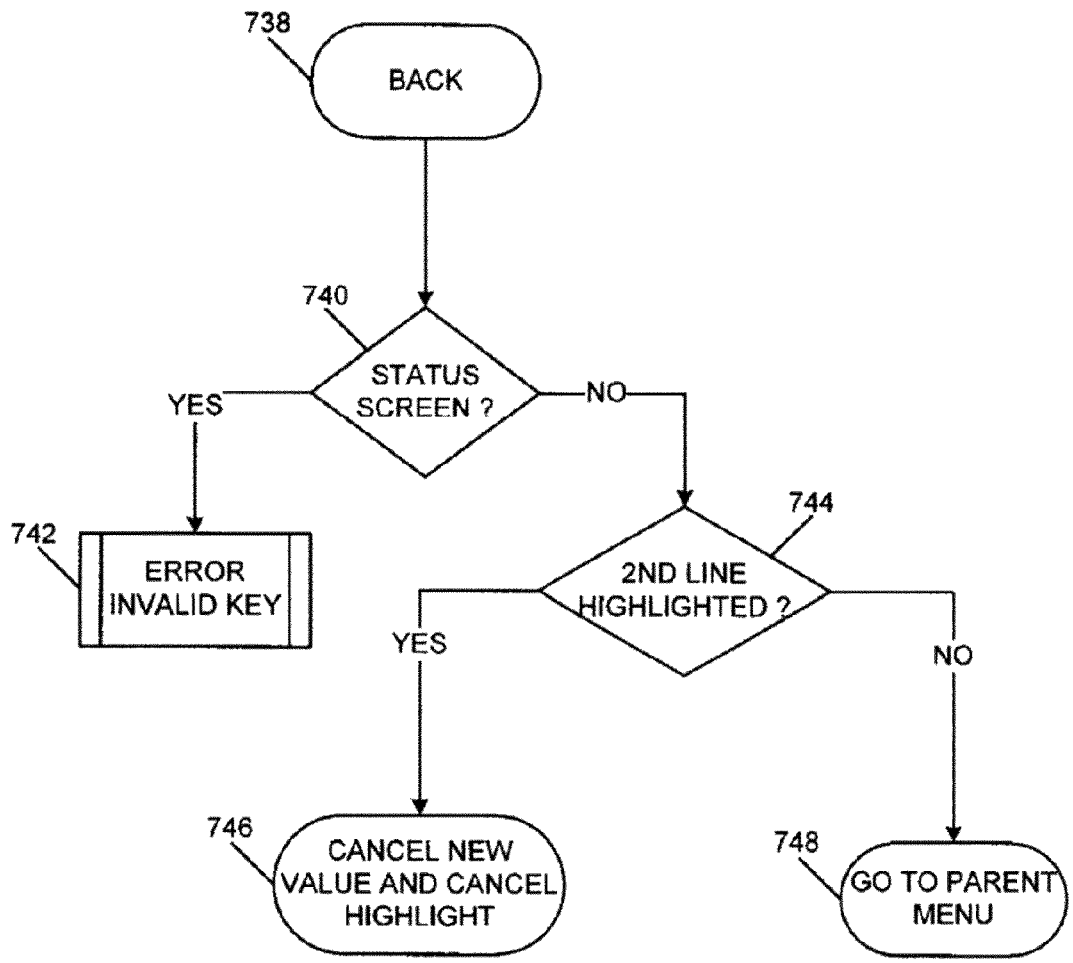
FIG. 53 is a flow chart illustrating a back button control operation.

FIG. 53 illustrates a back button control operation, according to some embodiments. When the back button 54 is pressed (step 738), the controller 75 determines if a status screen is being displayed (step 740). If so, an invalid key error operation is executed (step 742). If a status screen is not being displayed, the controller 75 determines if a line in the display is highlighted (step 744). If so, the new value on the highlighted line is cancelled and the highlighting is cancelled as well (step 746). If, at step 744, there is no highlighted line, the parent, or previous, menu is displayed (step 748).

Figure 54:
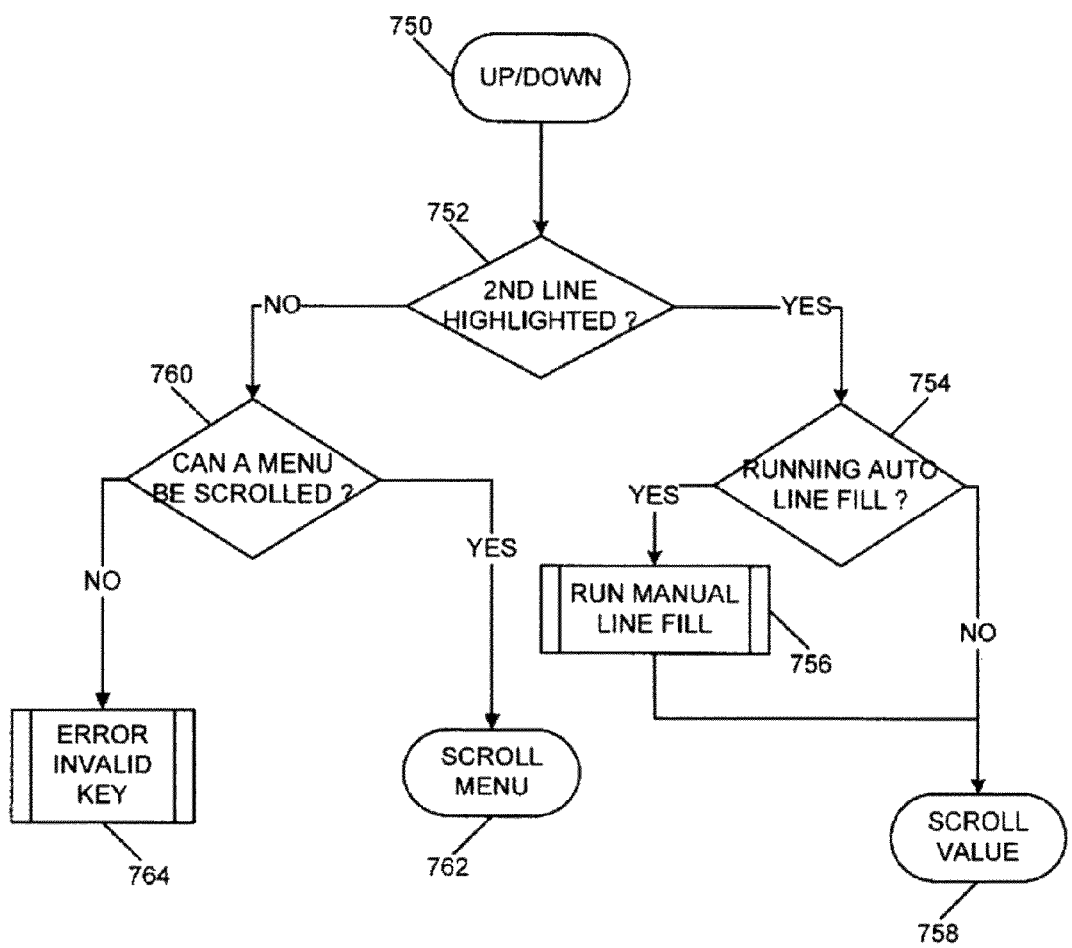
FIG. 54 is a flow chart illustrating an up/down button control operation.

FIG. 54 illustrates an up/down button control operation, according to some embodiments. When either the up or down directional button 52 is pressed (step 750), the controller 75 determines if a line in the display is highlighted (step 752). If so, the controller 75 then determines if the auto line fill operation is being executed (step 754). If so, the controller 75 proceeds to the manual line fill operation (step 756), as described with reference to FIG. 9, then scrolls to another value in the display (step 758). If the controller 75 determines that the auto line fill operation is not being executed at step 754, the controller 75 proceeds to step 758 and scrolls to another value in the display. If, at step 752, the controller 75 determines that no line is highlighted, the controller 75 then determines if a menu in the display can be scrolled (step 760). If so, the menu is scrolled (step 762). If not, an invalid key error operation is executed (step 764).

Figure 55:
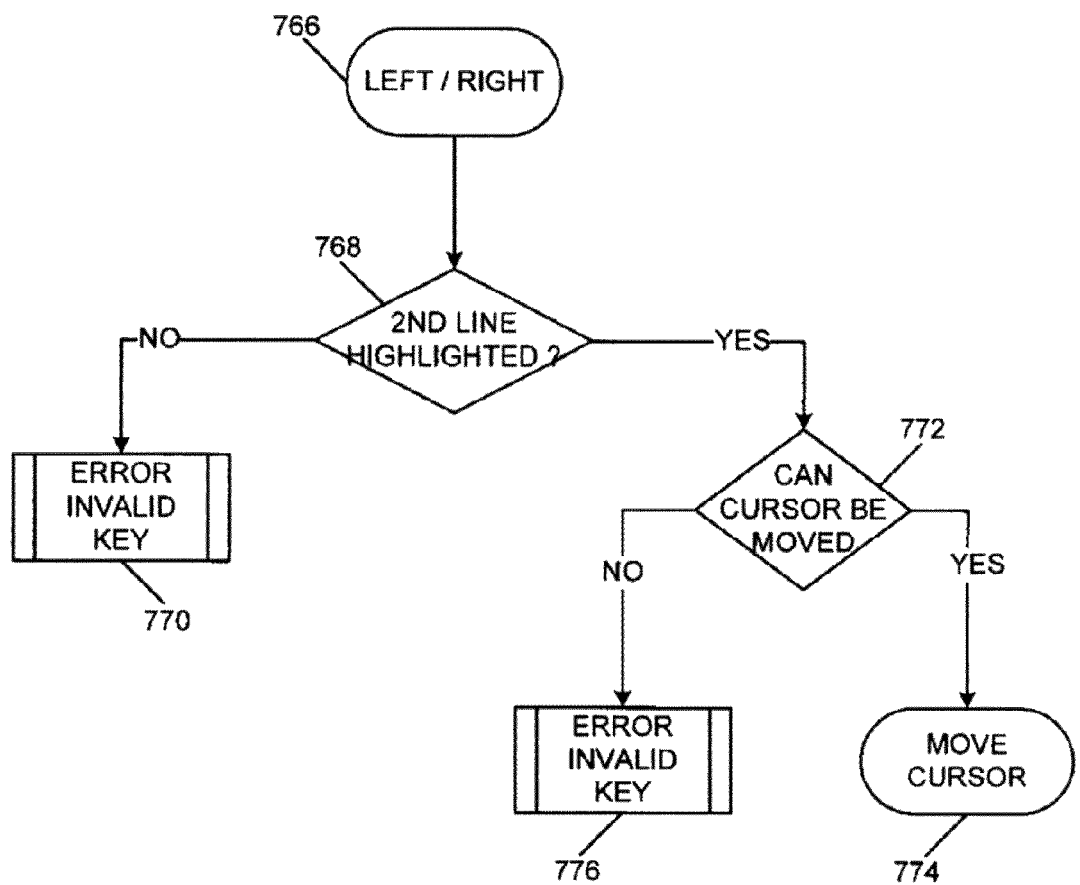
FIG. 55 is a flow chart illustrating a left/right button control operation.

FIG. 55 illustrates a left/right button control operation, according to some embodiments. When either the left or right directional button 52 is pressed (step 766), the controller 75 determines if a line in the display is highlighted (step 768). If not, an invalid key error operation is executed (step 770). If, at step 768, the controller 75 determines that the line is highlighted, the controller 75 then determines if a cursor in the display can be moved (step 772). If so, the cursor is moved (step 774). If not, an invalid key error operation is executed (step 776).

Figure 56:
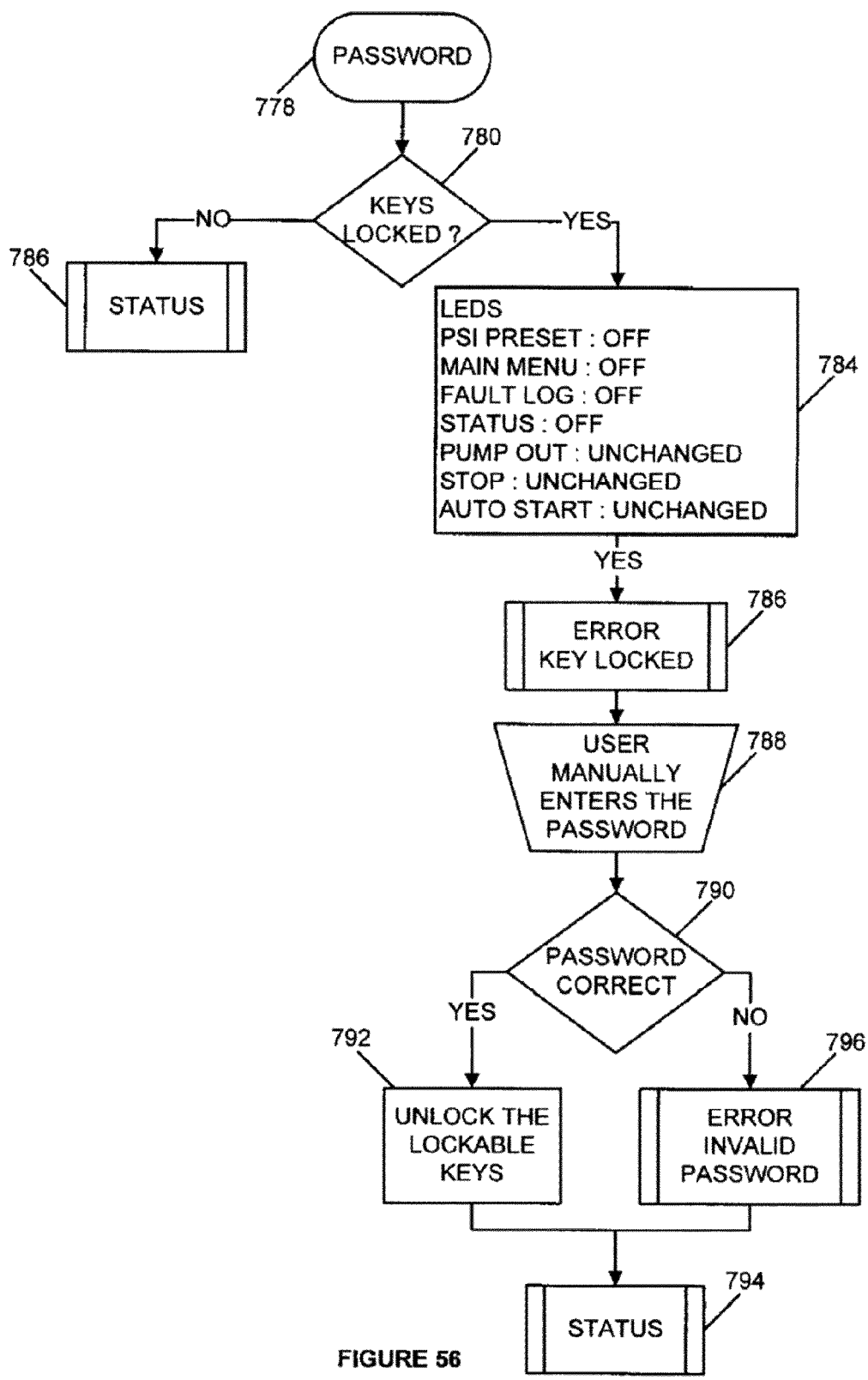
FIG. 56 is a flow chart illustrating a password button control operation.

FIG. 56 illustrates a password button control operation, according to some embodiments. When the password button 48 is pressed (step 778), the controller 75 first determines if the control pad 14 is locked (step 780). If not, a status screen is displayed (step 782). If the control pad 14 is locked, the controller 75 sets the LED indicators 66 on or off accordingly (step 784) and executes a keys locked error operation (step 786). If a user then enters a password (step 788), the controller 75 determines if the password is correct (step 790). If the password is correct, any lockable keys are unlocked (step 792) and the status screen is displayed (step 794). If the password is incorrect, an invalid password error operation is executed (step 796), then the status screen is displayed (step 794). In some embodiments, the lockable keys can include the directional buttons 52, the language button 50, the pump-out button 40, the pressure preset button 42, and/or the main menu button 44.

Figure 57:
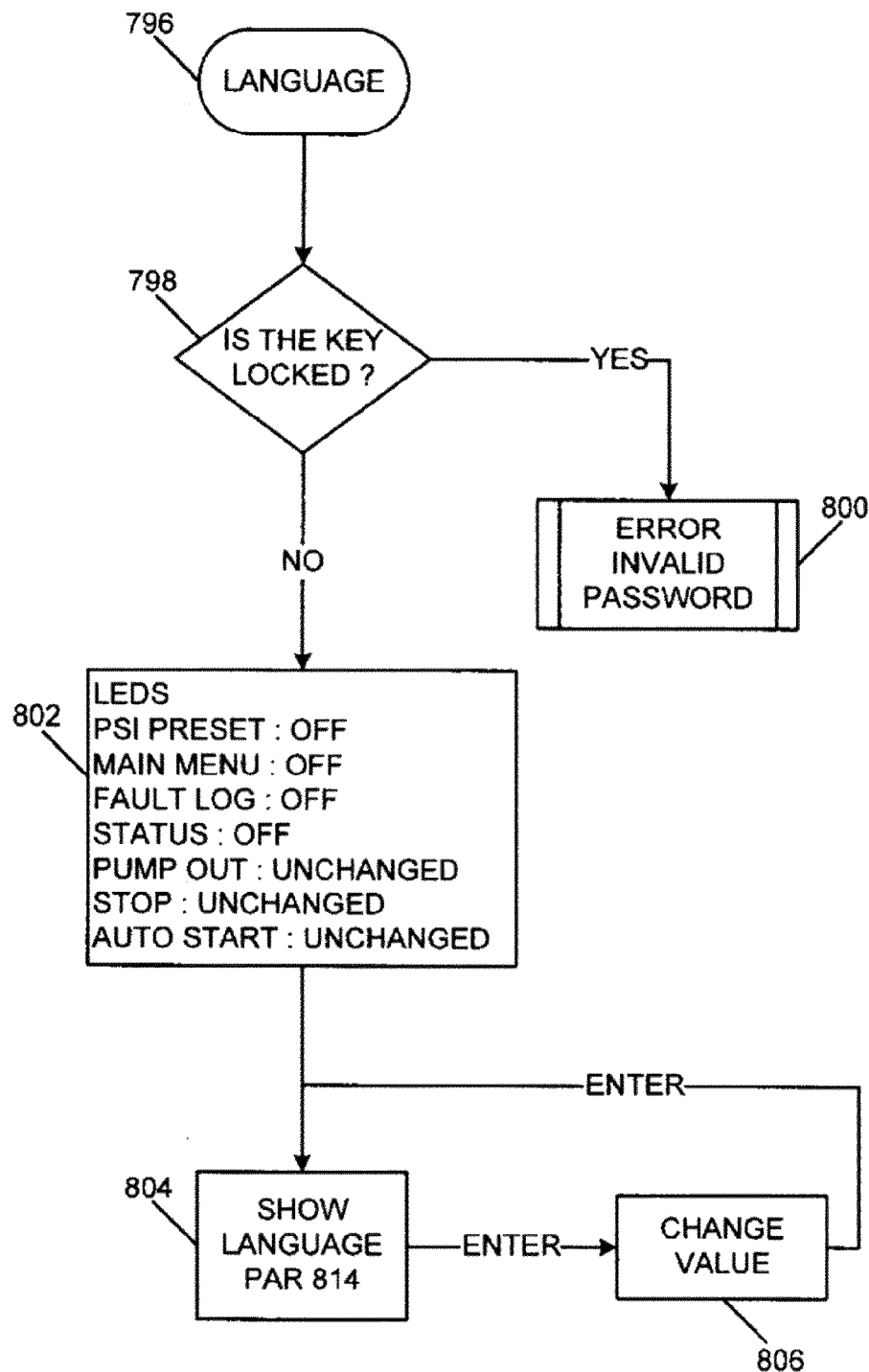
FIG. 57 is a flow chart illustrating a language button control operation.

FIG. 57 illustrates a language button control operation, according to some embodiments. When the language button 50 is pressed (step 796), the controller 75 first determines if the control pad 14 is locked (step 798). If so, the controller 75 executes a keys locked error operation (step 800). If the control pad 14 is not locked, the controller 75 sets the LED indicators 66 on or off accordingly (step 802) and a language parameter is displayed (step 804). The user can change the displayed language using the keypad and hit enter to update the language parameter (step 806).

Figure 58:
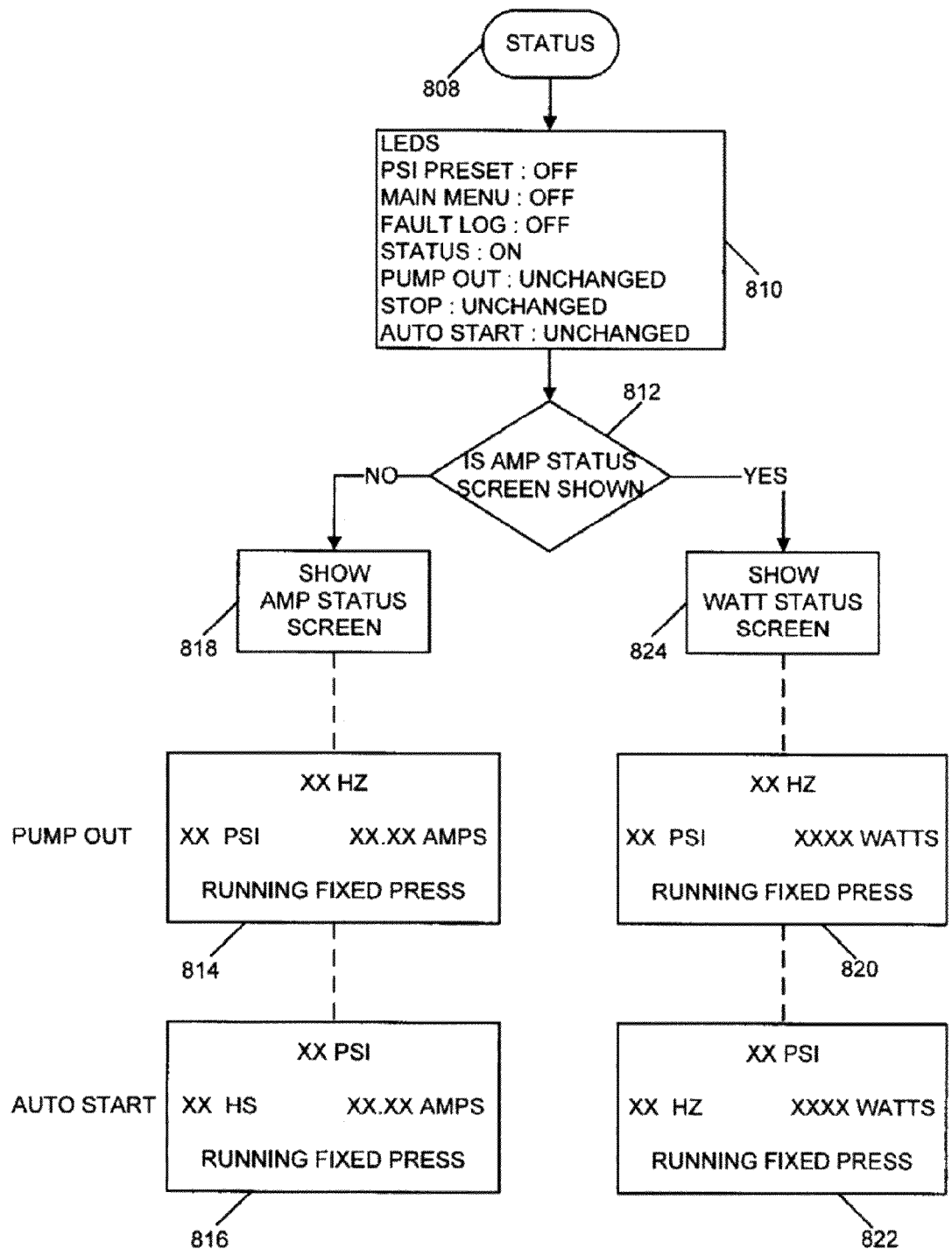
FIG. 58 is a flow chart illustrating a status button control operation.

FIG. 58 illustrates a status button control operation, according to some embodiments. When the status button 58 is pressed (step 808), the controller 75 sets the LED indicators 66 on or off accordingly (step 810) and determines if a current status screen is being displayed (step 812). If not, the current status screen 814 or 816 is displayed (step 818). If the controller 75, at step 812, determines that the current status screen is being displayed, the currents status screen is cleared and a power status screen 820 or 822 is displayed (step 824).

Figure 59:
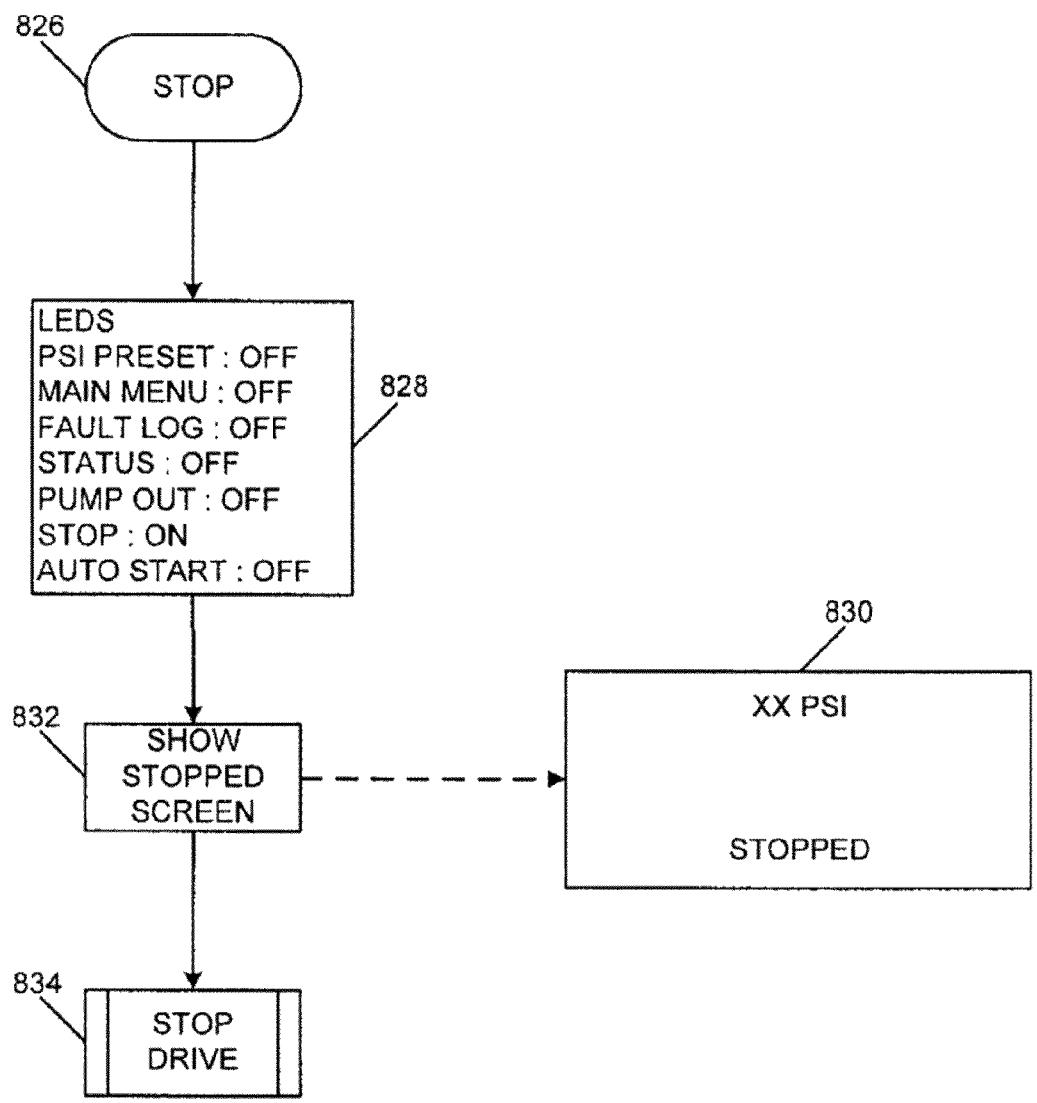
FIG. 59 is a flow chart illustrating a stop button control operation.

FIG. 59 illustrates a stop button control operation, according to some embodiments. When the stop button 60 is pressed (step 826), the controller 75 sets the LED indicators 66 on or off accordingly (step 828) and a stopped status screen 830 is displayed (step 832). The controller 75 then stops the drive 10 (step 834), as described with reference to FIG. 10.

Figure 60:
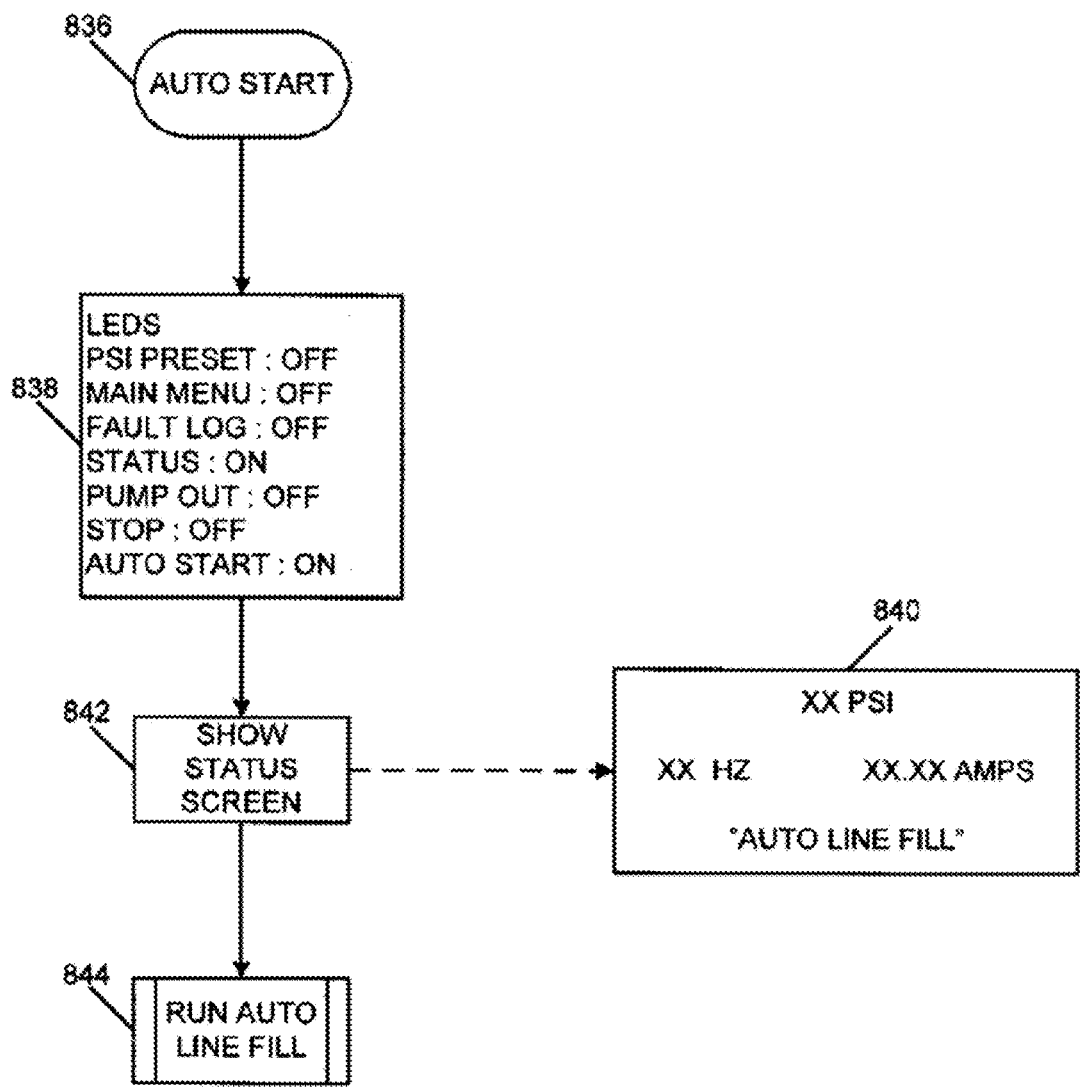
FIG. 60 is a flow chart illustrating an automatic start button control operation.

FIG. 60 illustrates an automatic start button control operation, according to some embodiments. When the automatic start button 62 is pressed (step 836), the controller 75 sets the LED indicators 66 on or off accordingly (step 838) and a status screen 840 is displayed (step 842). The controller 75 then runs the automatic line fill operation (step 844), as described with reference to FIG. 8.

Figure 61:
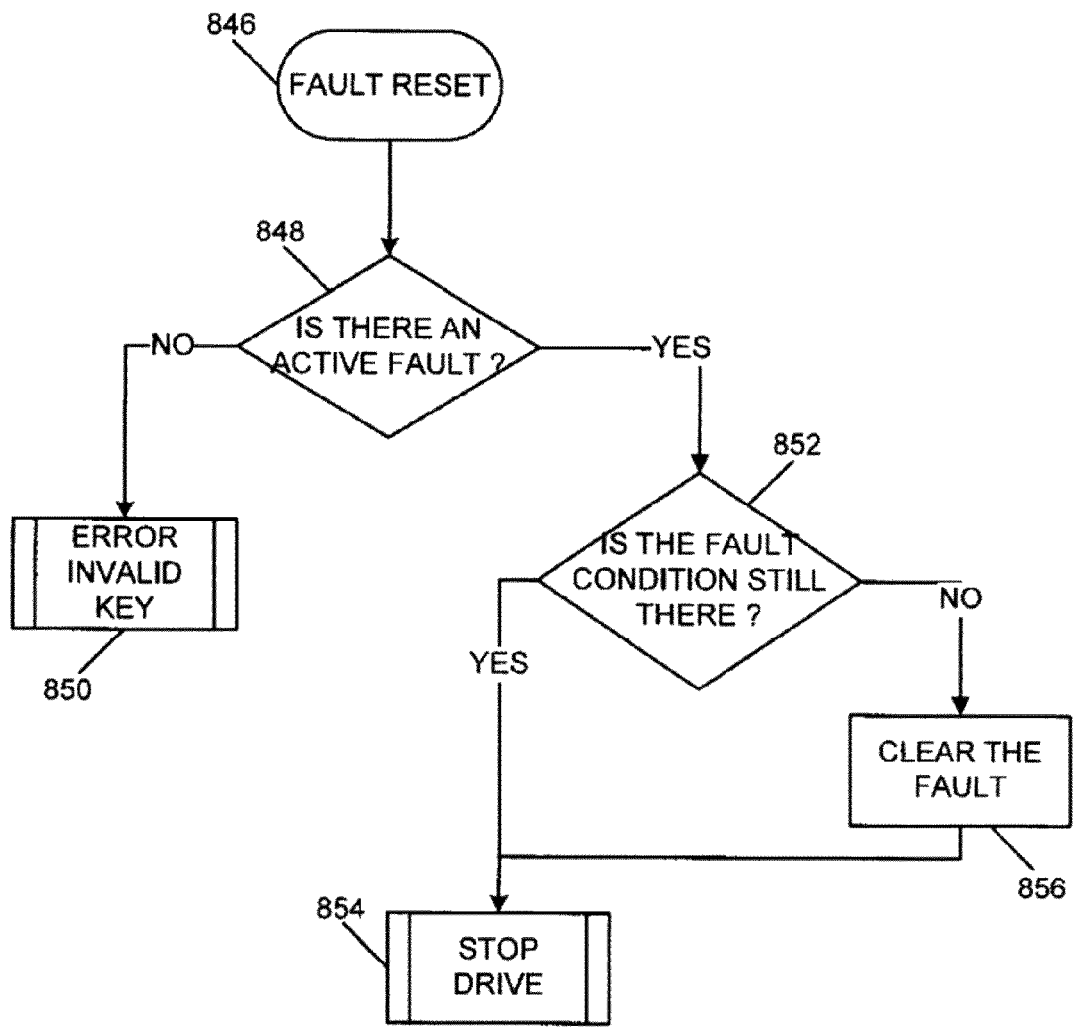
FIG. 61 is a flow chart illustrating a fault reset button control operation.

FIG. 61 illustrates a fault reset button control operation, according to some embodiments. When the fault reset button 64 is pressed (step 846), the controller 75 determines if there is an active fault (step 848). If not, the controller 75 executes an invalid key error operation (step 850). If there is an active fault, the controller 75 determines if the fault condition is still present (step 852). If so, the controller 75 stops the drive 10 (step 854), as described with reference to FIG. 10. If not, the controller 75 first clears the fault (step 856), then stops the drive 10 (step 854).

Figure 62A:
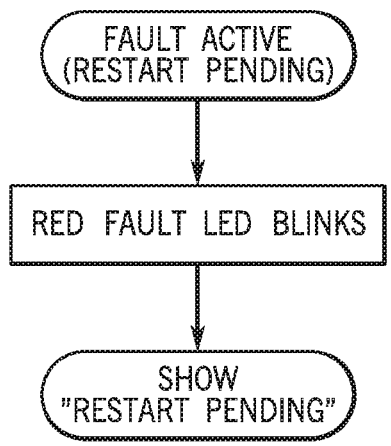
FIGS. 62A-62E are flow charts illustrating LED indicator control operations.
Figure 62B:
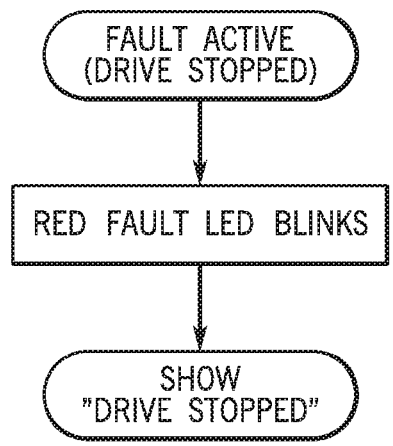
Figure 62C:
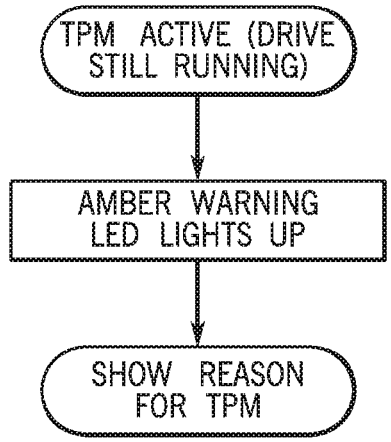
Figure 62D:
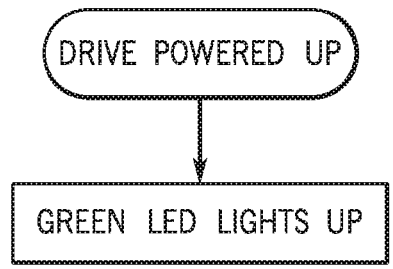
Figure 62E:
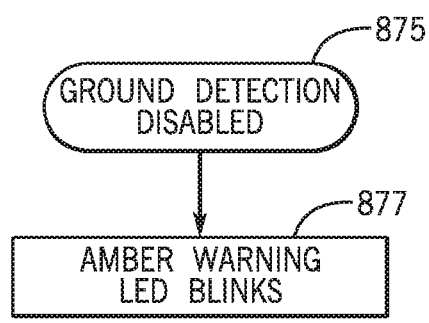

FIGS. 62A-62D illustrate LED indicator control operations, according to some embodiments. As shown in FIG. 62A, if a fault is active and a restart is pending (step 856), the Fault LED 72 blinks (step 858), and a "Restart Pending" message is displayed (step 860). As shown in FIG. 62B, if a fault is active and the drive 10 is stopped (step 862), the Fault LED 72 blinks (step 864), and a "Drive Stopped" message is displayed (step 866). As shown in FIG. 62C, if a TPM is active and the drive 10 is still running (step 868), the Warning LED 70 is lit (step 870), and a message is displayed describing the warning (step 872). As shown in FIG. 62D, when the drive 10 is powered up (step 874), the ON LED 68 is lit (step 876). As shown in FIG. 62E, when ground detection is disabled (step 875), the Warning LED 70 blinks (step 877).

Figure 63A:
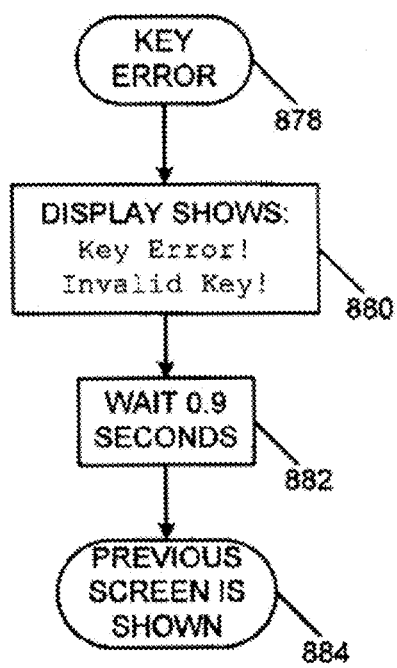
FIGS. 63A-63D are flow charts illustrating error display control operations.
Figure 63B:
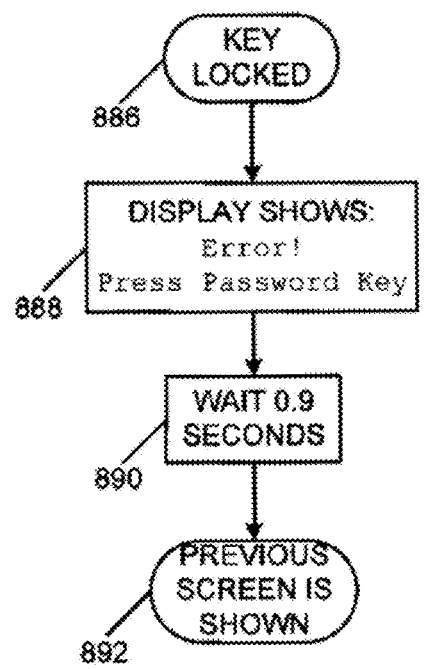
Figure 63C:
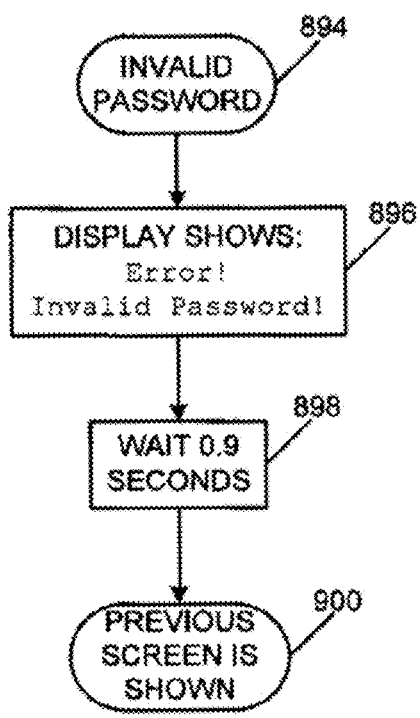
Figure 63D:
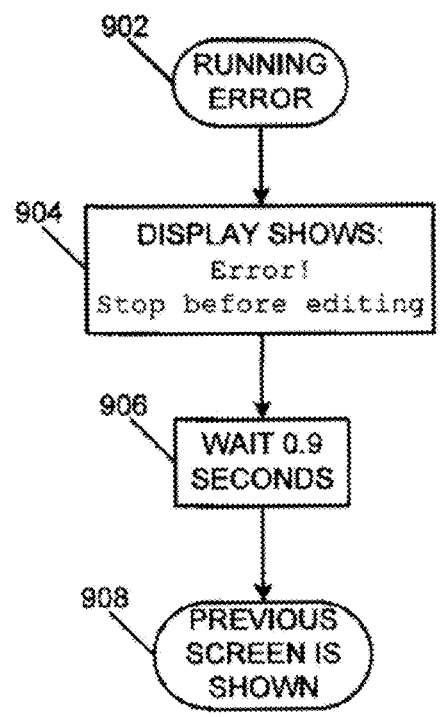

FIGS. 63A-63D illustrate error display control operations, according to some embodiments. As shown in FIG. 63A, for the invalid key error operation (step 878), a "Key Error! Invalid Key!" error screen can be displayed (step 880). The controller 75 can display the error screen for a time period, such as 0.9 seconds (step 882), then return the display to the previous screen (step 884). As shown in FIG. 63B, for the keys locked error operation (step 886), an "Error! Press Password Key" error screen can be displayed (step 888). The controller 75 can display the error screen for a time period, such as 0.9 seconds (step 890), then return the display to the previous screen (step 892). As shown in FIG. 63C, for the invalid password error operation (step 894), an "Error! Invalid Password!" error screen can be displayed (step 896). The controller 75 can display the error screen for a time period, such as 0.9 seconds (step 898), then return the display to the previous screen (step 900). As shown in FIG. 63D, for the running error operation (step 902), an "Error! Stop before editing" error screen can be displayed (step 904). The controller 75 can display the error screen for a time period, such as 0.9 seconds (step 906), then return the display to the previous screen (step 908).

Figure 64:
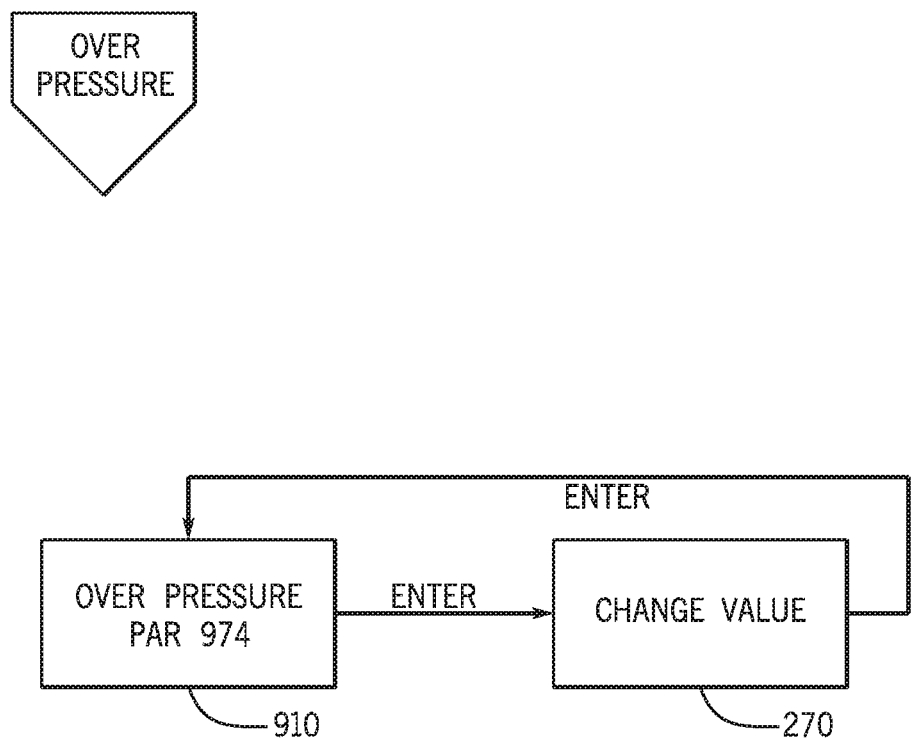
FIG. 64 is a flow chart illustrating an over pressure operation.

FIG. 64 illustrates the user's options after selecting the over pressure parameter 245 from the settings menu 240. The user can select the over pressure parameter 910 to modify one or more preferences associated with the parameter 910, and appropriate values for the controller 75 will be changed 270.

Figure 65:
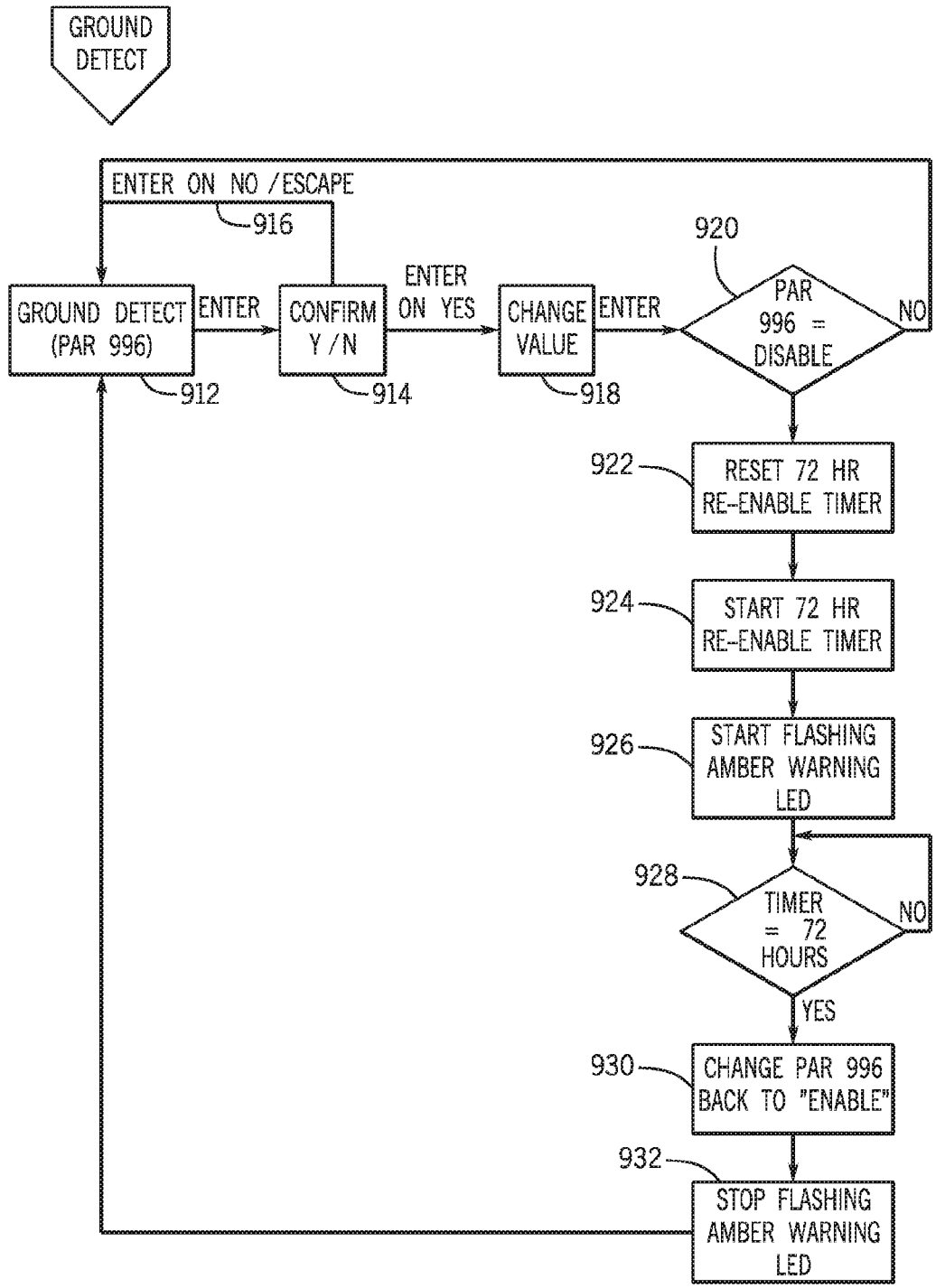
FIG. 65 is a flow chart illustrating a ground detect operation.

FIG. 65 illustrates the user's options after selecting the ground detect parameter 249 from the settings menu 240. The user can select ground detect 912 to modify one or more preferences associated with the parameter 912. The user can be prompted to confirm 914 selection of the parameter 912. When NO is entered 916, the user will return to the settings menu 240. When Yes is entered 918, the user can disable the ground detect parameter for a predetermined amount of time, e.g., 72 hours. If the user selects disable 920, at 922, the user is able to reset a re-enable timer. At 924, the user is able to start the re-enable timer. A warning LED can begin to flash 926 indicating the ground detect parameter is disabled, and a timer can count to the predetermined time at 928, to change all values to factory default values. After the timer 928 has counted to the predetermined time, the ground detect parameter 249 can be set back to enable 930 and the warning LED can stop flashing at 932.

Figure 66:
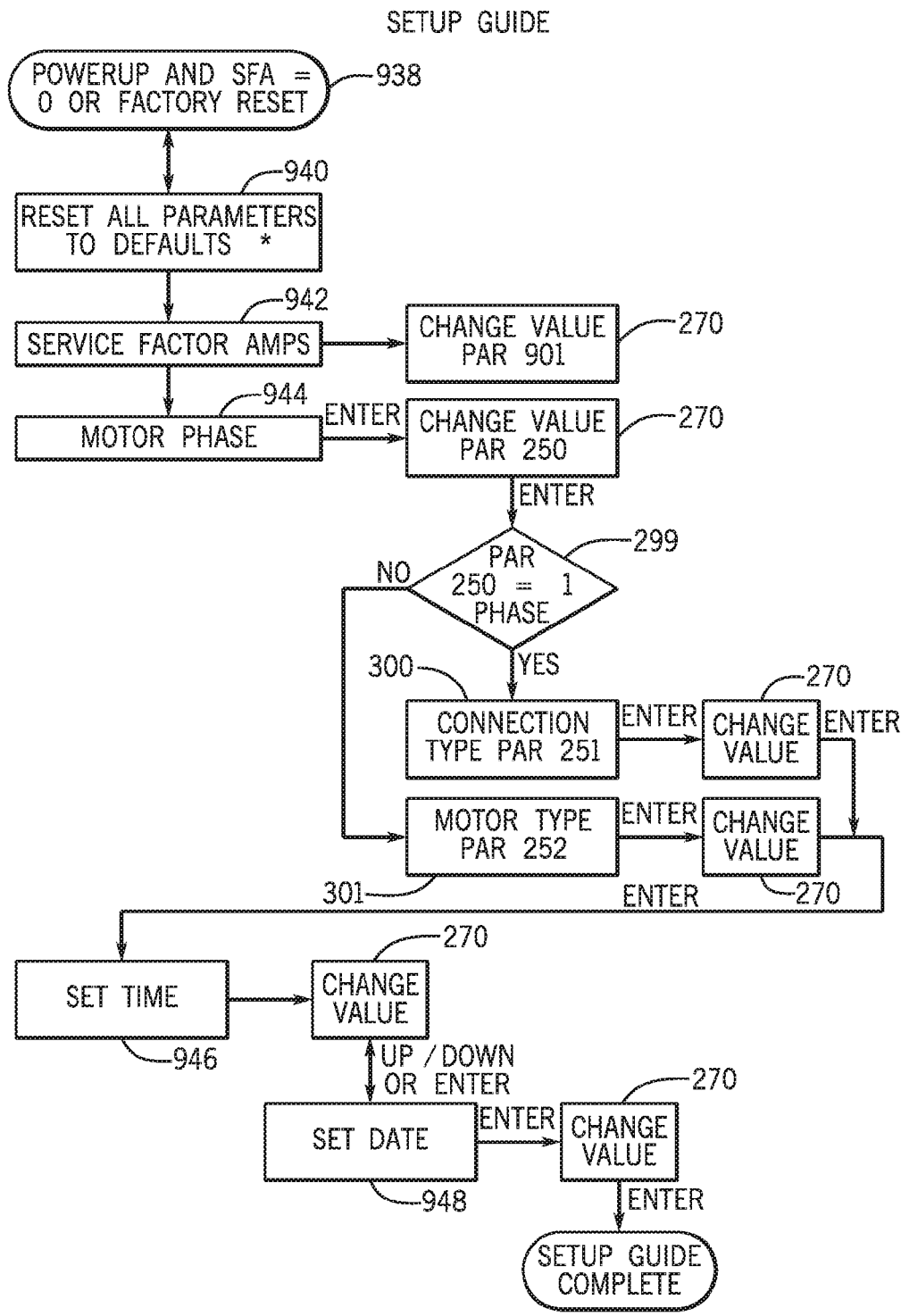
FIG. 66 is a flow chart illustrating a setup guide operation.

FIG. 66 illustrates the user's options for a setup guide 936. The setup guide 936 can be entered at powerup and when a service factor amps value equals zero and with a factory reset 938. The user can reset all parameters to defaults 940, except those parameters that have been flagged as permanent. The following parameters can be chosen after selecting reset all parameters to defaults 940: service factor amps 942, motor phase 944, set time 946, and set date 948. The user can select any of the parameters 942-948 to modify one or more preferences associated with the parameters, and appropriate values for the controller 75 will be changed 270. If motor phase 944 is selected, motor phase can be changed as shown and described with reference to FIG. 23.

Figure 67:
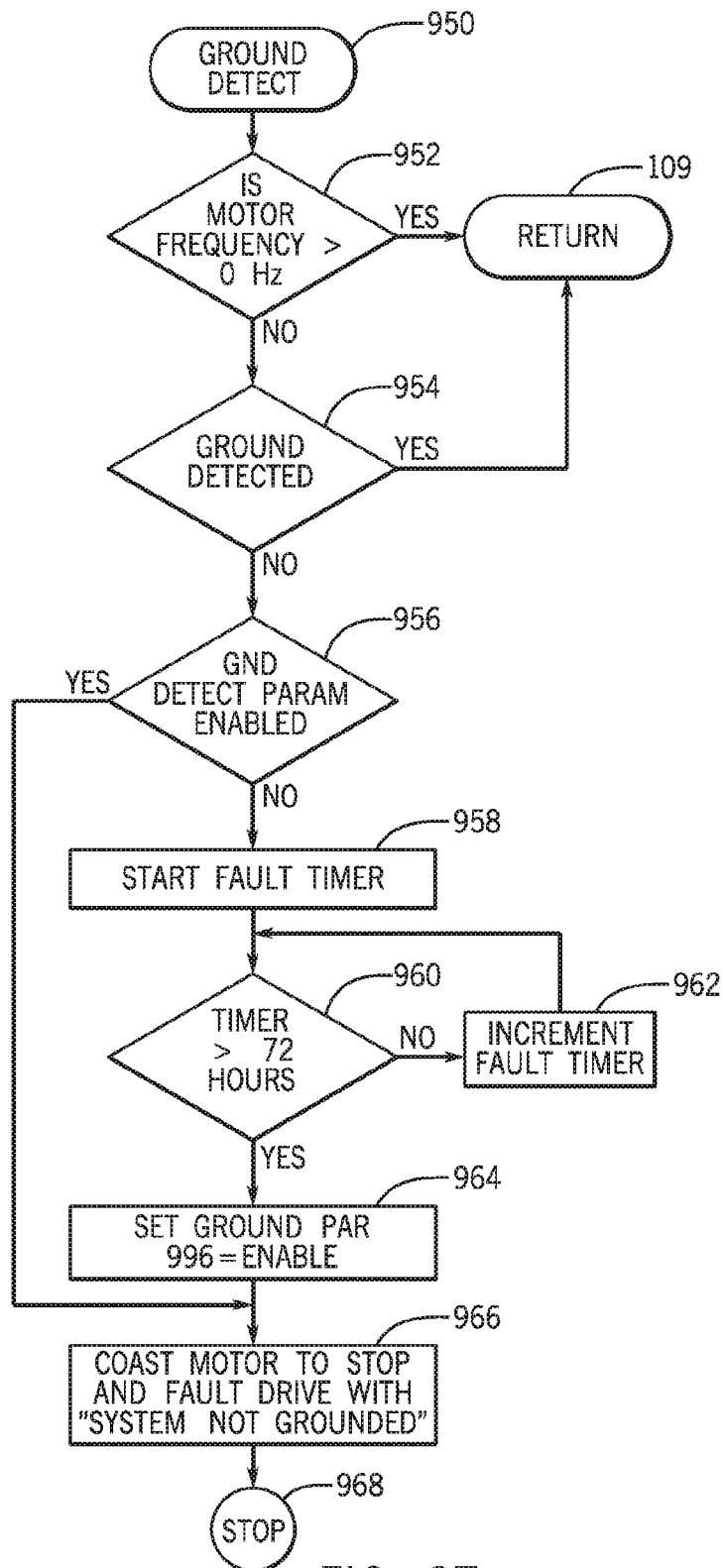
FIG. 67 is a flow chart illustrating a ground detect operation.

FIG. 67 illustrates a ground detect operation 950 of the controller 75. The controller 75 first determines, at step 952, if the motor frequency is greater than zero. If so, the controller 75 then enters "RETURN" 109. If not, the controller 75 then determines, at step 954, if a ground has been detected. The controller 75 can determine if a ground has been detected by checking if there is a voltage on the enclosure 13 of the drive. A voltage across a discrete component physically and electrically connected to the enclosure 13 can be detected to determine if there is a voltage on the enclosure. If there is no voltage, the system is ungrounded, and if there is a voltage, the system is grounded. In some embodiments, the ground must be undetected for more than a predetermined amount of time, e.g., a minute, or between a start and a stop. If no ground is detected, the controller 75 then enters "RETURN" 109. If no ground is detected, the controller 75 checks to see if the ground detect parameter 249 is enabled 956 (see FIG. 65). If the ground detect parameter 249 is not enabled, at 958, the fault timer is started. At 960, the timer value is checked, and if the timer value is less than the predetermined time, the timer value is incremented 962. The timer counts until the predetermined time is reached and then the ground detect parameter 249 is enabled 964. After step 964, the motor is coasted to a stop and a "System not Grounded" fault message is displayed (step 966), then the drive 10 is stopped (step 968).

Figure 68:
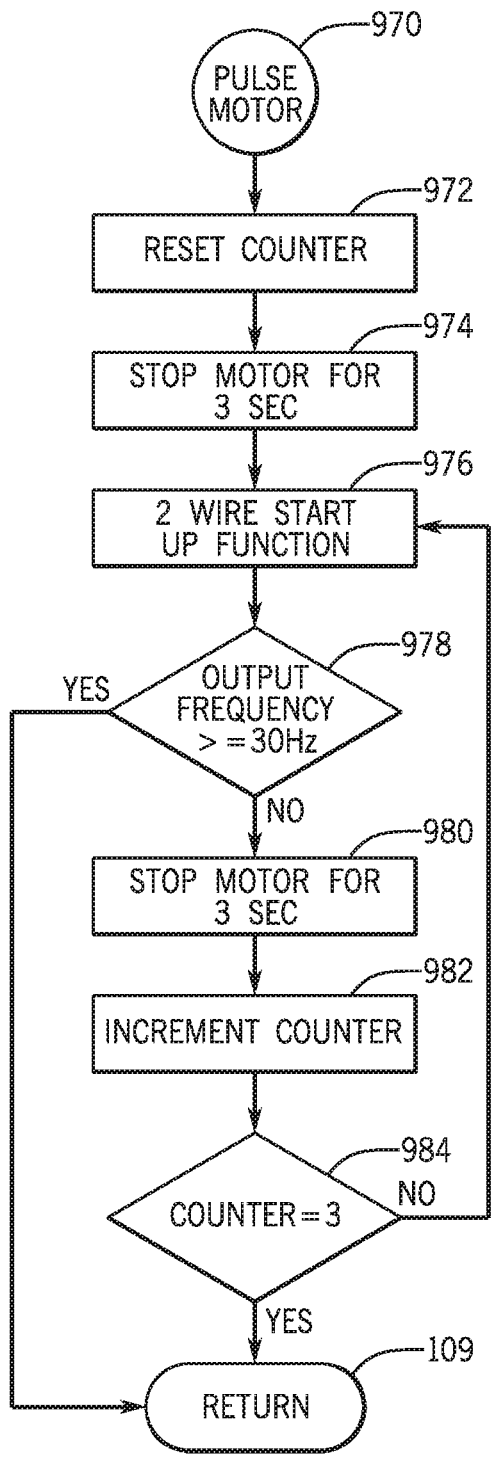
FIG. 68 is a flow chart illustrating a pulse motor operation.

FIG. 68 illustrates a pulse motor operation 970 of the controller 75. A counter is reset at step 972. Next, at step 974, the motor 10 is stopped for a predetermined amount of time, e.g., three seconds. Next, at 976, the start up function is performed. The controller 75 determines if the output frequency is greater than or equal to about 30 HZ, at step 978. If it is, the controller 75 then enters "RETURN" 109. If not, the controller stops the motor for the predetermined amount of time again, at step 980. The counter is incremented at 982. If the counter does not equal three, at 984, control returns to start up function 978. If it does, the controller 75 then enters "RETURN" 109.

Figure 69:
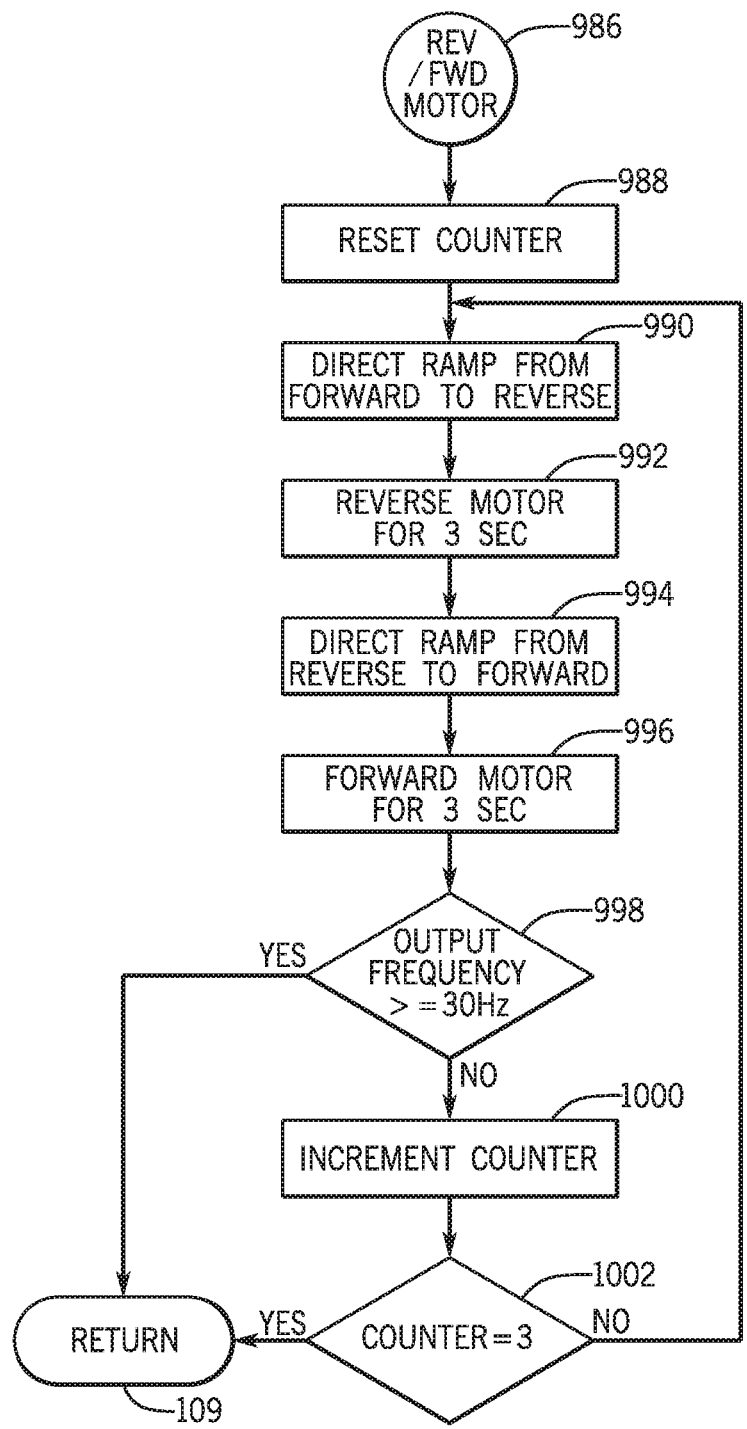
FIG. 69 is a flow chart illustrating a forward/reverse motor operation.

FIG. 69 illustrates a reverse/forward motor operation 986 of the controller 75. A counter is reset at step 988. Next, at step 990, the motor 10 is configured to ramp from forward to reverse. At 992, the motor 10 is reversed for a predetermined amount of time, e.g., three seconds. At step 994, the motor 10 is configured to ramp from reverse to forward. At 996, the motor 10 is run in forward for the predetermined amount of time. The controller 75 determines if the output frequency is greater than or equal to about 30 HZ, at step 998. If it is, the controller 75 then enters "RETURN" 109. If not, the counter is incremented at 1000. If the counter does not equal three, at 1002, control returns to function 990. If it does, the controller 75 then enters "RETURN" 109.

Figure 70:
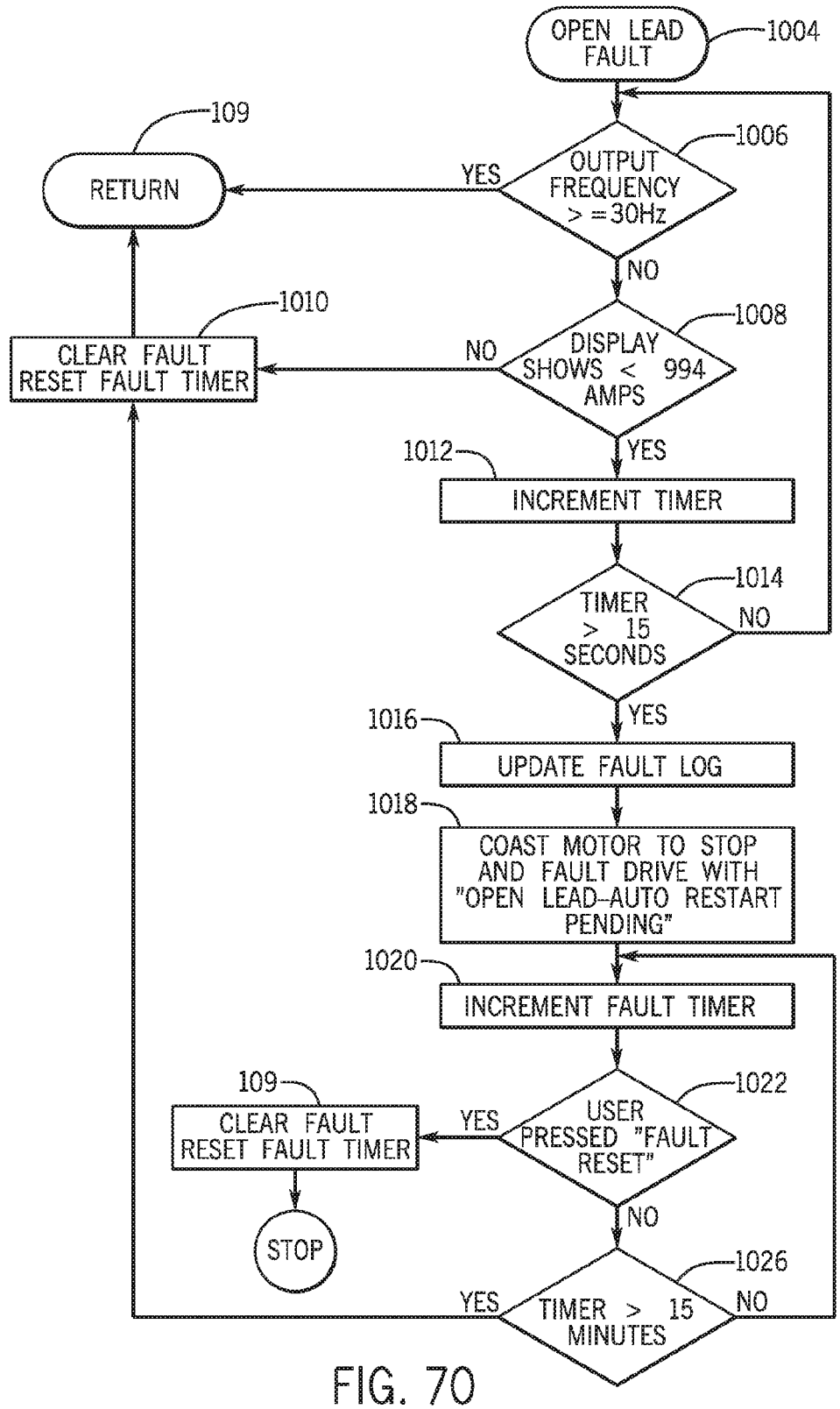
FIG. 70 is a flow chart illustrating an open lead fault operation.

FIG. 70 illustrates an open lead fault operation 1004 of the controller 75. The controller 75 determines if the output frequency is greater than about 30 HZ, at step 1006. If it is, the controller 75 then enters "RETURN" 109. If not, the controller 75 determines if amps are less than a predefined parameter, at step 1008. If it is not, the fault is cleared and the fault timer is cleared, at 1010, and the controller 75 then enters "RETURN" 109. If amps are less than the predefined parameter, then the fault timer is incremented at 1012. If the timer is not greater than a predetermined amount of time, e.g., 15 seconds, at step 1014, control returns to function 1006. If the timer is greater than the predetermined amount of time, the fault log is updated at 1016. After step 1016, the motor is coasted to a stop and a "Open Lead-Auto Restart Pending" fault message is displayed (step 1018), then the fault timer is incremented (step 1020). The controller 75 determines if the user pressed "Fault Reset" at 1022. If yes, the fault is cleared and the fault timer is cleared, at 1024. If no, if the timer is not greater than the predetermined amount of time, at step 1026, control returns to function 1020, and if yes, the fault is cleared and the fault timer is cleared, at 1010.

Figure 71:
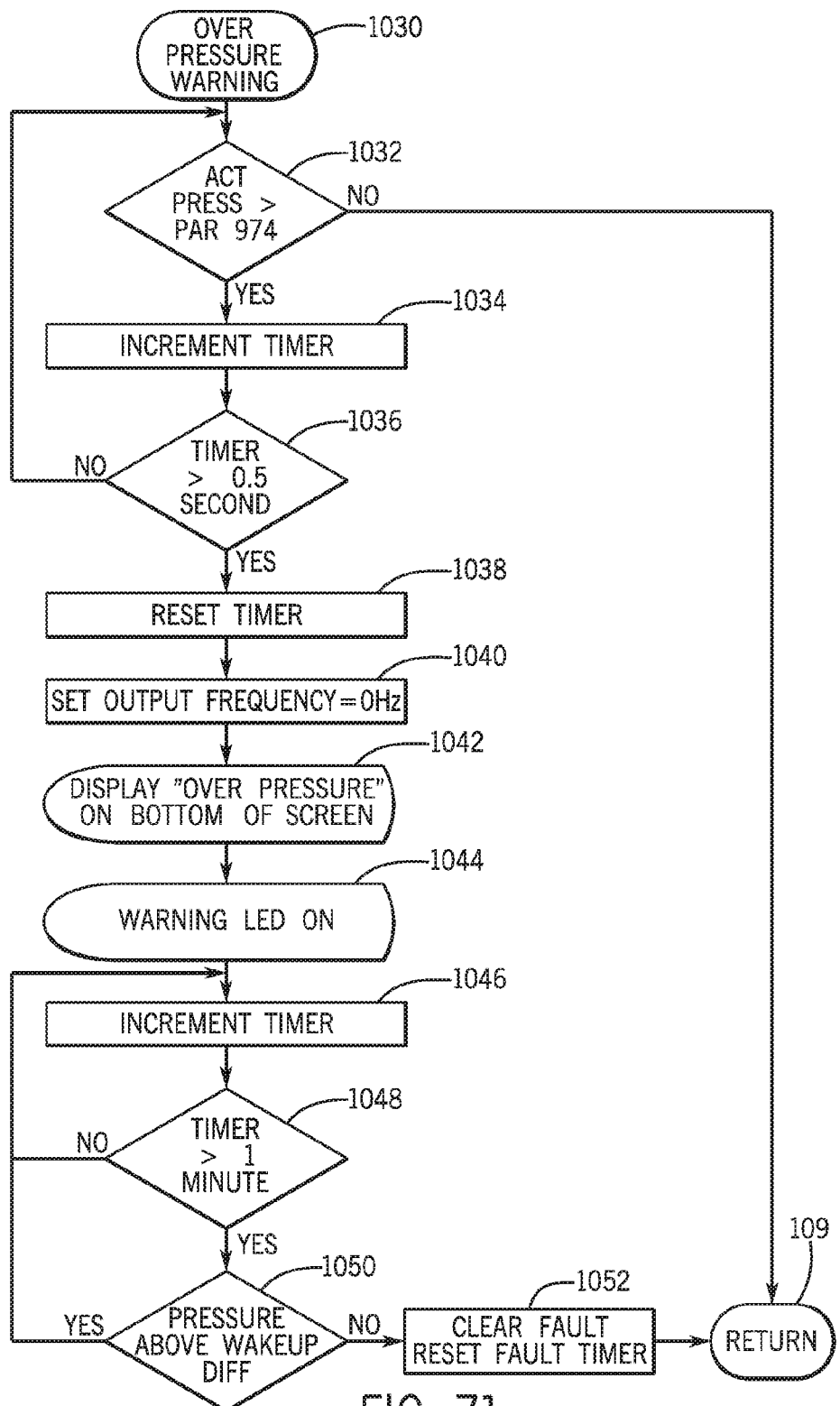
FIG. 71 is a flow chart illustrating an over pressure warning operation.

FIG. 71 illustrates an over pressure warning operation 1030 of the controller 75. In some embodiments, this function may only be available in the PID mode 126. The controller 75 determines if the actual pressure is greater than a predetermined parameter, at step 1032. If it is not, the controller 75 then enters "RETURN" 109. If it is, the controller 75 increments a timer at 1034. At step 1036, if the timer is not past a half a second, for example, control returns to function 1032. If the timer has passed half a second, the timer is reset at 1038. The controller 75 sets the output frequency to zero HZ, at step 1040. "Over Pressure" can be displayed on the screen (step 1042), and a warning LED can be illuminated (step 1044). At step 1046, the timer is incremented. At step 1048, if the timer has not passed about a minute, the timer is again incremented at 1046. If the timer has passed about a minute, the controller 75 determines if the pressure is above a wakeup differential, at step 1050. If it is, the timer is incremented at 1046. If not, the fault is cleared at 1052, and the controller 75 then enters "RETURN" 109.

Figure 72:
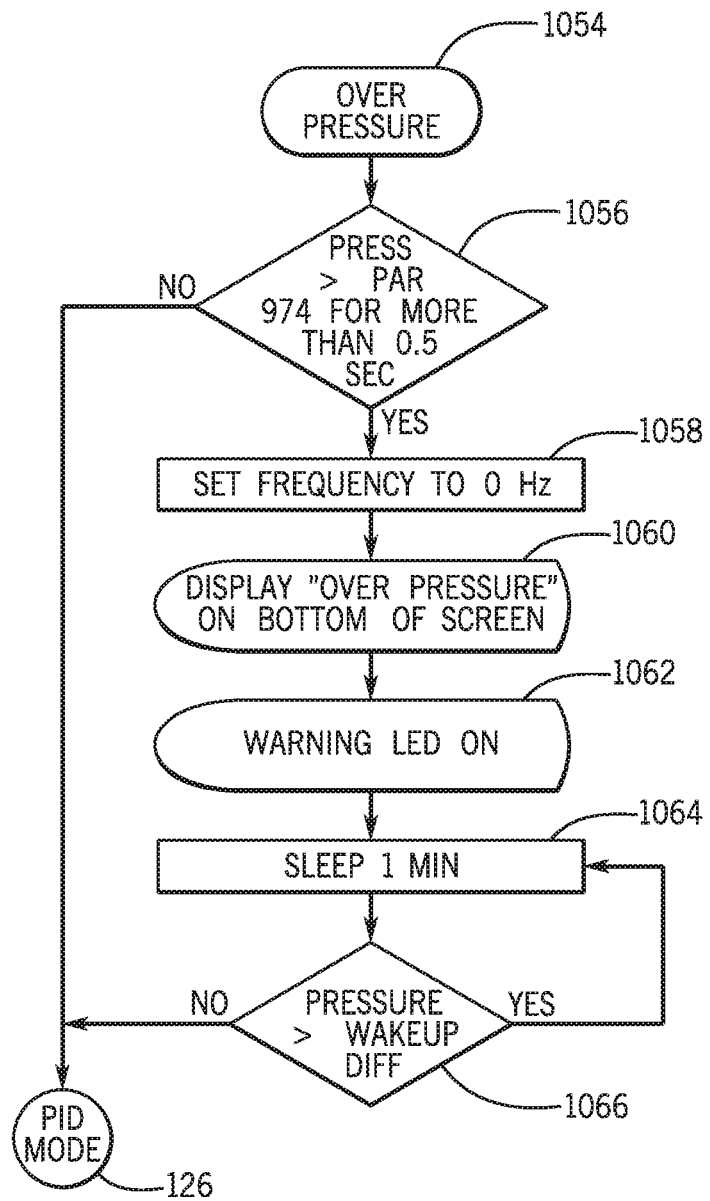
FIG. 72 is a flow chart illustrating an alternative over pressure warning operation.

FIG. 72 illustrates an alternative over pressure warning operation 1054 of the controller 75. In some embodiments, this function may only be available in the PID mode 126. At 1056, the controller 75 determines if the actual pressure is greater than a predetermined parameter for more than a predetermined time, e.g., a half a second, for example. If not, the controller 75 enters the PID mode at 126. If it is, the controller 75 sets the output frequency to zero HZ, at step 1058. "Over Pressure" can be displayed on the screen (step 1060), and a warning LED can be illuminated (step 1062). At step 1064, the over pressure warning operation 1054 can sleep for about a minute. After about the minute, the controller 75 determines if the pressure is above a wakeup differential, at step 1066. If it is, control returns to parameter 1064 and the over pressure warning operation 1054 can sleep for about another minute. If not, the controller 75 enters the PID mode at 126.

It will be appreciated by those skilled in the art that while the invention has been described above in connection with particular embodiments and examples, the invention is not necessarily so limited, and that numerous other embodiments, examples, uses, modifications and departures from the embodiments, examples and uses are intended to be encompassed by the claims attached hereto. The entire disclosure of each patent and publication cited herein is incorporated by reference, as if each such patent or publication were individually incorporated by reference herein.

Various features and advantages of the invention are set forth in the following claims.

The invention claimed is:

1. A method of detecting a ground in a water distribution system having a pump coupled to a motor, the motor being driven by a drive located in an enclosure, the method comprising:
   determining whether a voltage exists at least one of on the enclosure, inside the enclosure, and in proximity to the enclosure, the enclosure at least partially enclosing the drive of the water distribution system;
   if the determination is that the voltage exists, (i) starting a fault timer and (ii) incrementing the fault timer;
   determining whether the fault timer has exceeded a predetermined time period;
   if the fault timer has exceeded a predetermined time period, determining that the water distribution system is not grounded; and
   upon determining the water distribution system is not grounded, stopping the motor.

2. The method of claim 1 wherein determining whether the voltage exists includes measuring the voltage across a discrete component inside the enclosure.

3. The method of claim 2 wherein the discrete component is a chassis of the drive.

4. The method of claim 1 wherein testing for a voltage includes measuring the voltage using an integrated voltmeter.

5. The method of claim 1 wherein the predetermined time period is about 72 hours.

6. The method of claim 1 wherein stopping the motor includes coasting the motor to a stop.

7. The method of claim 1 and further comprising indicating to a user that the system is not properly grounded when the fault timer has exceeded the predetermined time period.

8. The method of claim 1 and further comprising returning to a normal operation if no voltage is present and the enclosure is properly grounded.

9. The method of claim 1 and further comprising determining whether a motor frequency of the motor is greater than zero before testing for a voltage.

10. The method of claim 1 wherein the motor is a variable speed motor and the drive is a variable frequency drive and further comprising causing the variable frequency drive to coast the variable speed motor to a stop.

11. The method of claim 1 and further comprising testing for a voltage at least once per 24 hour period.

12. The method of claim 1 and further comprising automatically testing for a voltage.

13. A water distribution system comprising:
   a pump;
   a motor coupled to the pump;
   an enclosure;
   a controller including a drive connected to the motor, the controller housed in the enclosure and configured to:
      (i) determine whether a voltage exists at least one of on the enclosure, inside the enclosure, and in proximity to the enclosure, the enclosure at least partially enclosing the drive of the water distribution system;
      (ii) if the determination is that the voltage exists, (a) start a fault timer; and (ii) increment the fault timer;
      (iii) determine whether the fault timer has exceeded a predetermined time period;
      (iv) if the fault timer has exceeded a predetermined time period, determine that the water distribution system is not grounded; and
      (v) upon determining the water distribution system is not grounded, stop the motor.

14. The system of claim 13 wherein the controller measures the voltage across a discrete component inside the enclosure.

15. The system of claim 14 wherein the discrete component is a chassis of the drive.

16. The system of claim 13 wherein the controller measures the voltage using an integrated voltmeter.

17. The system of claim 13 wherein the predetermined time period is about 72 hours.

18. The system of claim 13 wherein the controller coasts the motor to a stop.

19. The system of claim 13 wherein the controller indicates to a user that the system is not grounded when the fault timer has exceeded the predetermined time period.

20. The system of claim 13 wherein the controller returns to a normal operation if no voltage is present and the enclosure is properly grounded.

21. The system of claim 13, wherein the controller determines whether a motor frequency of the motor is greater than zero before testing for a voltage.

22. The system of claim 13 wherein the motor is a variable speed motor and the drive is a variable frequency drive and wherein the controller causes the variable frequency drive to coast the variable speed motor to a stop.

23. The system of claim 13 wherein the controller tests for a voltage at least once per 24 hour period.

24. The method of claim 13 wherein the controller automatically tests for a voltage.

* * * * *